(12) United States Patent
Kunimoto et al.

(10) Patent No.: US 8,723,017 B2
(45) Date of Patent: May 13, 2014

(54) DYE SENSITISED SOLAR CELL

(75) Inventors: Kazuhiko Kunimoto, Kawanishi (JP); Hiroshi Yamamoto, Takarazuka (JP); Shinji Nakamichi, Osaka (JP); Ryuichi Takahashi, Kobe (JP); Junichi Tanabe, Amagasaki (JP)

(73) Assignee: BASF SE, Ludwigshafen (DE)

( * ) Notice: Subject to any disclaimer, the term of this patent is extended or adjusted under 35 U.S.C. 154(b) by 717 days.

(21) Appl. No.: 12/920,148

(22) PCT Filed: Feb. 26, 2009

(86) PCT No.: PCT/EP2009/052243
§ 371 (c)(1),
(2), (4) Date: Nov. 29, 2010

(87) PCT Pub. No.: WO2009/109499
PCT Pub. Date: Sep. 11, 2009

(65) Prior Publication Data
US 2011/0061723 A1 Mar. 17, 2011

(30) Foreign Application Priority Data
Mar. 7, 2008 (EP) .................................... 08152419

(51) Int. Cl.
*H01L 31/0224* (2006.01)

(52) U.S. Cl.
USPC ............. 136/252; 546/94; 546/167; 546/264; 546/276.7; 546/277.4; 546/278.7; 546/335; 544/52; 544/102; 544/105; 544/131

(58) Field of Classification Search
USPC .......... 546/276.7, 277.4, 335, 264, 278.7, 94, 546/167, 284.1, 102, 270.1, 270.7; 544/105, 131, 52, 102, 38; 540/591
See application file for complete search history.

(56) References Cited

U.S. PATENT DOCUMENTS

| 2004/0187918 A1 | 9/2004 | Ikeda |
| 2004/0260093 A1 | 12/2004 | Czerney |
| 2009/0165858 A1* | 7/2009 | Shigaki et al. ................ 136/263 |
| 2009/0214457 A1 | 8/2009 | Dierker et al. |

FOREIGN PATENT DOCUMENTS

| CN | 1534021 | 10/2004 |
| CN | 1253436 C | 4/2006 |
| EP | 1892792 A | 2/2008 |
| JP | 2004022222 | 1/2004 |
| JP | 2005/082678 A | 3/2005 |
| JP | 2007/149570 A | 6/2007 |
| WO | 2006079334 A2 | 8/2006 |
| WO | 2006/097334 A1 | 9/2006 |
| WO | WO 2006134939 A1 * | 12/2006 |

OTHER PUBLICATIONS

English language abstract of WO2006/079334 printed on Mar. 2, 2011.
Partial English language translation for JP2004-022222 (5 pages); 2004.
English language machine-generated translation of CN1534021 (18 pages); 2004.
Dentani, T. et al., "Flexible zinc oxide solar cells sensitized by styryl dyes", Dyes and Pigments, 2008, vol. 77, pp. 59-69.
Li, F. et al., "Photoelectric conversion property of a photoresponsive D-П-A dye containing both N=N and CH=CH bonds", Colloids and Surfaces A: Physicochem. Eng. Aspects, 2006, vol. 275, pp. 92-98.
Translation of Claims of CN 1253436 (C), 2006.
English Language Abstract of JP 2005-082678 Printed on Nov. 30, 2010.
English Language Abstract of JP 2007-149570 Printed on Nov. 30, 2010.

* cited by examiner

*Primary Examiner* — Ling Choi
*Assistant Examiner* — Wenwen Cai
(74) *Attorney, Agent, or Firm* — Shruti Costales

(57) ABSTRACT

The present invention pertains to an electrode layer comprising a porous film made of oxide semiconductor fine particles sensitized with certain methin dyes. Moreover the present invention pertains to a photoelectric conversion device comprising said electrode layer, a dye sensitized solar cell comprising said photoelectric conversion device and to novel methin dyes.

17 Claims, No Drawings

DYE SENSITISED SOLAR CELL

The present invention pertains to an electrode layer comprising a porous film made of oxide semiconductor fine particles sensitized with certain methin dyes. Moreover the present invention pertains to a photoelectric conversion device comprising said electrode layer, a dye sensitized solar cell comprising said photoelectric conversion device and to novel methin dyes.

CN-C-1253436, JP-A-2005/082678 and JP-A-2007/149570 disclose photoelectric conversion devices comprising some methine dyes.

US-A-2004/0260093 and WO-A-2006/097334 describe certain methin dyes, especially coumarin dyes, as optical markers for among others proteins.

It is the finding of the present invention that photoelectric conversion devices sensitized with certain methin dyes have excellent overall properties, in particular that they have a particularly high photo-electric power conversion efficiency.

The present invention pertains to an electrode layer comprising a porous film made of oxide semiconductor fine particles sensitized with a dye of formula (I),

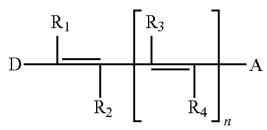
(I)

wherein

A is pyridinium*Y⁻, quinolinium*Y⁻ or isoquinolinium*Y⁻, preferably pyridinium*Y⁻ or quinolinium*Y⁻, most preferably pyridinium*Y⁻, each of which is unsubstituted or substituted;

Y⁻ is an inorganic or organic anion, preferably Cl⁻, Br⁻, I⁻, SCN⁻, $BF_4^-$, $PF_6^-$, $ClO_4^-$, $SbF_6^-$, $AsF_6^-$ or an organic anion selected from the group consisting of carboxylate, sulphonate, sulphate, phosphate, phosphonate;

n is 0 or 1, preferably 0;

$R_1$, $R_2$, $R_3$ and $R_4$ are independently H, —S(=O)₂OR₇, —S(=O)₂R₇, —S(=O)R₇, —S(=O)OR₇, fluorinated $C_1$-$C_8$alkyl, a group of formula (II)

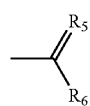
(II)

or unsubstituted or substituted $C_1$-$C_{20}$alkyl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_1$ and $R_2$, $R_1$ and $R_{15}$, $R_1$ and $R_{16}$, $R_2$ and $R_{15}$, $R_2$ and $R_{16}$ or $R_3$ and $R_4$ form together an unsubstituted or substituted aliphatic 5-, 6- or 7-membered ring; or $R_2$ and $R_{15}$ form together an unsubstituted or substituted heteroaromatic 5-, 6- or 7-membered ring; or a substituent of A ortho to the

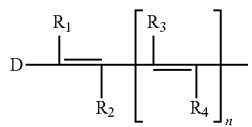

group and either if n is 0, $R_2$ or if n is 1, $R_4$ form together an unsubstituted or substituted aliphatic 5-, 6- or 7-membered ring; or $R_1$ is D; or if D is a group of formula (IV), $R_1$ and $R_{18}$ can form together an unsubstituted or substituted 5-, 6- or 7-membered ring;

with the proviso that at least one of $R_1$-$R_4$ is fluorinated $C_1$-$C_8$alkyl or that $R_2$ or $R_4$ or both are —S(=O)₂OR₇, —S(=O)₂R₇, —S(=O)R₇, —S(=O)OR₇ or a group of formula (II)

(II)

$R_5$ is $NR_8$, N—OR₈, N—NR₈R₉, O or S;

$R_6$ is CO—SR₇, CO—NR₇—NR₁₀R₁₁, CO—NR₇—OR₁₀, CO—O—CO—R₇, CO—NR₇—CO—R₁₀, CO—NR₇—CO—OR₁₀, CO—NR₇—CO—NR₁₀R₁₁, NR₇R₁₀, OR₇, SR₇, NR₇—NR₁₀R₁₁, NR₇—OR₁₀, O—CO—R₇, O—CO—OR₇, O—CO—NR₇R₁₀, NR₇—CO—R₁₀, NR₇—CO—OR₁₀, NR₇—CO—NR₁₀R₁₁, CO—R₇, CO—OR₇, CO—NR₇R₁₀, NR₁₂—C(=NR₁₃)R₇ or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $a_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_8$ and $R_9$ are independently H or unsubstituted or substituted $C_1$-$C_{20}$alkyl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_7$, $R_{10}$ and $R_{11}$ are independently H or unsubstituted or substituted $C_1$-$C_{20}$alkyl, $C_8$-$C_{20}$alkenyl, $C_2$-$C_{20}$alkynyl, $C_6$-$C_{20}$aryl, $C_3$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_7$ or $R_{10}$ together with that group of $R_1$-$R_4$ which is attached to the same double bond as the group of $R_1$-$R_4$ comprising said $R_7$ or $R_{10}$ forms an unsubstituted or substituted aliphatic 5-, 6- or 7-membered ring; or if $R_7$ or $R_{10}$ is part of $R_2$, it can form together with $R_{15}$ or $R_{16}$ an unsubstituted or substituted aliphatic 6- or 7-membered ring; or if $R_7$ or $R_{10}$ is part of $R_2$ with n being 0 or is part of $R_4$ with n being 1, it can form together with a substituent of A ortho to the

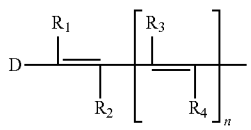

group an unsubstituted or substituted aliphatic 5-, 6- or 7-membered ring;

$R_{12}$ and $R_{13}$ form together an unsubstituted or substituted 5-, 6- or 7-membered ring;

$R_{14}$ is independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is independently a group of formula (III) or (IV), preferably of formula (III),

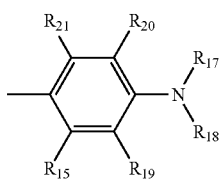

(III)

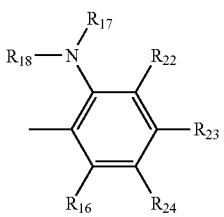

(IV)

$R_{17}$ and $R_{18}$ are independently unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_{17}$ and $R_{18}$, $R_{17}$ and $R_{22}$, $R_{17}$ and $R_{20}$ and/or $R_{18}$ and $R_{19}$ form together an unsubstituted or substituted 5-, 6- or 7-membered ring;

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, S—CO—$R_{25}$, CO—$R_{25}$, CO—$NR_{25}$—$NR_{26}R_{27}$, CO—$NR_{25}$—$OR_{26}$, CO—O—CO—$R_{25}$, CO—O—CO—$OR_{25}$, CO—O—CO—$NR_{25}R_{26}$, CO—$NR_{25}$—CO—$R_{26}$, CO—$NR_{25}$—CO—$OR_{26}$, or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, a$_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_{25}$, $R_{26}$ and $R_{27}$ are independently H or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, a$_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

with the proviso that A or at least one of $R_1$-$R_4$ or A and at least one of $R_1$-$R_4$ comprises a group G, wherein G is —$R_{28}$—COOH, —$R_{28}$—COO$^-$Z$^+$, —$R_{28}$—S(=O)$_2$OH, —$R_{28}$—S(=O)$_2$O$^-$Z$^+$, —$R_{28}$—O—S(=O)$_2$OH, —$R_{28}$—O—S(=O)$_2$O$^-$Z$^+$, —$R_{28}$—P(=O)(OH)$_2$, —$R_{28}$—P(=O)(O$^-$Z$^+$)$_2$, —$R_{28}$—P(=O)(OH)(O$^-$Z$^+$), —$R_{28}$—O—P(=O)(OH)$_2$, —$R_{28}$—O—P(=O)(O$^-$Z$^+$)$_2$, —$R_{28}$—O—P(=O)(OH)(O$^-$Z$^+$);

$R_{28}$ is a direct bond or unsubstituted or substituted $C_1$-$C_{20}$alkylene, $C_2$-$C_{20}$alkenylene, $C_2$-$C_{20}$alkynylene, $C_6$-$C_{20}$arylene, $C_4$-$C_9$heteroarylene, $C_7$-$C_{11}$aralkylene, $C_8$-$C_{11}$aralkenylene, $C_8$-$C_{11}$aralkynylene, $C_6$-$C_{11}$heteroaralkylene, $C_7$-$C_{11}$heteroaralkenylene, $C_7$-$C_{11}$heteroaralkynylene or $C_5$-$C_6$cycloalkylene, preferably $R_{28}$ is a direct bond or unsubstituted or substituted $C_1$-$C_{20}$alkylene, more preferably a direct bond or unsubstituted or substituted $C_1$-$C_6$alkylene, even more preferably a direct bond or unsubstituted or substituted $C_1$-$C_3$alkylene, most preferably methylene; and Z$^+$ is N($R_{14}$)$_4^+$, Li$^+$, Na$^+$ or K$^+$ or is an ammonium cation which is part of a compound of formula (I) as part of group A.

For instance, A is pyridinium*Y$^-$, quinolinium*Y$^-$ or isoquinolinium*Y$^-$, preferably pyridinium*Y$^-$ or quinolinium*Y$^-$, most preferably pyridinium*Y$^-$, each of which is unsubstituted or substituted;

Y$^-$ is an inorganic or organic anion, preferably Cl$^-$, Br$^-$, I$^-$, SCN$^-$, BF$_4^-$, PF$_6^-$, ClO$_4^-$, SbF$_6^-$, AsF$_6^-$ or an organic anion selected from the group consisting of carboxylate, sulphonate, sulphate, phosphate, phosphonate;

n is 0 or 1, preferably 0;

$R_1$, $R_2$, $R_3$ and $R_4$ are independently H, —S(=O)$_2$OR$_7$, —S(=O)$_2$R$_7$, —S(=O)R$_7$, —S(=O)OR$_7$, fluorinated $C_1$-$C_8$alkyl, a group of formula (II)

(II)

or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_1$ and $R_2$, $R_1$ and $R_{15}$, $R_1$ and $R_{16}$, $R_2$ and $R_{15}$, $R_2$ and $R_{16}$ or $R_3$ and $R_4$ form together an unsubstituted or substituted aliphatic 5-, 6- or 7-membered ring; or a substituent of A ortho to the

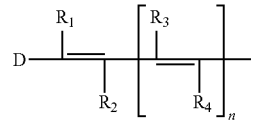

group and either if n is O, $R_2$ or if n is 1, $R_4$ form together an unsubstituted or substituted aliphatic 5-, 6- or 7-membered ring;

with the proviso that at least one of $R_1$-$R_4$ is fluorinated $C_1$-$C_8$alkyl or that $R_2$ or $R_4$ or both are —S(=O)$_2$OR$_7$, —S(=O)$_2$R$_7$, —S(=O)R$_7$, —S(=O)OR$_7$ or a group of formula (II)

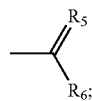

$R_5$ is $NR_8$, $N—OR_8$, $N—NR_8R_9$, O or S;

$R_6$ is $CO—SR_7$, $CO—NR_7—NR_{10}R_{11}$, $CO—NR_7—OR_{10}$, $CO—O—CO—R_7$, $CO—NR_7—CO—R_{10}$, $CO—NR_7—CO—OR_{10}$, $CO—NR_7—CO—NR_{10}R_{11}$, $NR_7R_{10}$, $OR_7$, $SR_7$, $NR_7—NR_{10}R_{11}$, $NR_7—OR_{10}$, $O—CO—R_7$, $O—CO—OR_7$, $O—CO—NR_7R_{10}$, $NR_7—CO—R_{10}$, $NR_7—CO—OR_{10}$, $NR_7—CO—NR_{10}R_{11}$, $CO—R_7$, $CO—OR_7$, $CO—NR_7R_{10}$, $NR_{12}—C(=NR_{13})R_7$ or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_8$ and $R_9$ are independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_7$, $R_{10}$ and $R_{11}$ are independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_7$ or $R_{10}$ together with that group of $R_1$-$R_4$ which is attached to the same double bond as the group of $R_1$-$R_4$ comprising said $R_7$ or $R_{10}$ forms an unsubstituted or substituted aliphatic 5-, 6- or 7-membered ring; or if $R_7$ or $R_{10}$ is part of $R_2$, it can form together with $R_{15}$ or $R_{16}$ an unsubstituted or substituted aliphatic 6- or 7-membered ring; or if $R_7$ or $R_{10}$ is part of $R_2$ with n being 0 or is part of $R_4$ with n being 1, it can form together with a substituent of A ortho to the

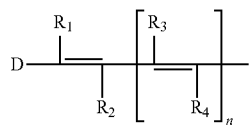

group an unsubstituted or substituted aliphatic 5-, 6- or 7-membered ring;

$R_{12}$ and $R_{13}$ form together an unsubstituted or substituted 5-, 6- or 7-membered ring;

$R_{14}$ is independently H or unsubstituted or substituted $C_1$-$C_{20}$alkyl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is a group of formula (III) or (IV), preferably of formula (III),

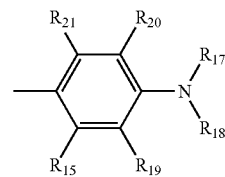

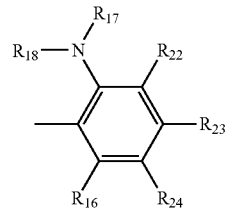

$R_{17}$ and $R_{18}$ are independently unsubstituted or substituted $C_1$-$C_{20}$alkyl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_{17}$ and $R_{18}$, $R_{17}$ and $R_{22}$, $R_{17}$ and $R_{20}$ and/or $R_{18}$ and $R_{19}$ form together an unsubstituted or substituted 5-, 6- or 7-membered ring;

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}—NR_{26}R_{27}$, $NR_{25}—OR_{26}$, $O—CO—R_{25}$, $O—CO—OR_{25}$, $O—CO—NR_{25}R_{26}$, $NR_{25}—CO—R_{26}$, $NR_{25}—CO—OR_{26}$, $NR_{25}—CO—NR_{26}R_{27}$, $CO—R_{25}$, $O—CO—R_{25}$, $CO—NR_{25}R_{26}$, $S—CO—R_{25}$, $CO—R_{25}$, $CO—NR_{25}—NR_{26}R_{27}$, $CO—NR_{25}—OR_{26}$, $CO—O—CO—R_{25}$, $CO—O—CO—OR_{25}$, $CO—O—CO—NR_{25}R_{26}$, $CO—NR_{25}—CO—R_{26}$, $CO—NR_{25}—CO—OR_{26}$, or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_{25}$, $R_{26}$ and $R_{27}$ are independently H or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

with the proviso that A or at least one of $R_1$-$R_4$ or A and at least one of $R_1$-$R_4$ comprises a group G, wherein G is —$R_{28}$—COOH, —$R_{28}$—COO$^-Z^+$, —$R_{28}$—S(=O)$_2$OH, —$R_{28}$—S(=O)$_2$O$^-Z^+$, —$R_{28}$—O—S(=O)$_2$OH, —$R_{28}$—O—S(=O)$_2$O$^-Z^+$, —$R_{28}$—P(=O)(OH)$_2$, —$R_{28}$—P(=O)(O$^-Z^+$)$_2$, —$R_{28}$—P(=O)(OH)(O$^-Z^+$), —$R_{28}$—O—P(=O)(OH)$_2$, —$R_{28}$—O—P(=O)(O$^-Z^-$)$_2$, —$R_{28}$—O—P(=O)(OH)(O$^-Z^+$);

$R_{28}$ is a direct bond or unsubstituted or substituted $C_1$-$C_{20}$alkylene, $C_2$-$C_{20}$alkenylene, $C_2$-$C_{20}$alkynylene, $C_6$-$C_{20}$arylene, $C_4$-$C_9$heteroarylene, $C_7$-$C_{11}$aralkylene, $C_8$-$C_{11}$aralkenylene, $C_8$-$C_{11}$aralkynylene, $C_6$-$C_{11}$heteroaralkylene, $C_7$-$C_{11}$heteroaralkenylene, $C_7$-$C_{11}$heteroaralkynylene or $C_5$-$C_6$cycloalkylene, preferably a direct bond or unsubstituted or substituted $C_1$-$C_{20}$alkylene, more preferably a direct bond or unsubstituted or substituted $C_1$-$C_6$alkylene, even more preferably a direct bond or unsubstituted or substituted $C_1$-$C_3$alkylene, most preferably methylene; and $Z^+$ is $N(R_{14})_4^+$, $Li^+$, $Na^+$ or $K^+$ or is an ammonium cation which is part of a compound of formula (I) as part of group A.

Of course, the proviso that at least one of $R_1$-$R_4$ is fluorinated $C_1$-$C_8$alkyl or that $R_2$ or $R_4$ or both are —S($=$O)$_2$OR$_7$, —S($=$O)$_2$R$_7$, —S($=$O)R$_7$, —S($=$O)OR$_7$ or a group of formula (II) is to be understood, that then n is 0, $R_1$ or $R_2$ is fluorinated $C_1$-$C_8$alkyl or that $R_2$ is —S($=$O)$_2$OR$_7$, —S($=$O)$_2$R$_7$, —S($=$O)R$_7$, —S($=$O)OR$_7$ or a group of formula (II).

For example, A is a group of formula (V)-(IX), preferably a group of formula (V)-(VII), most preferably a group of formula (V)

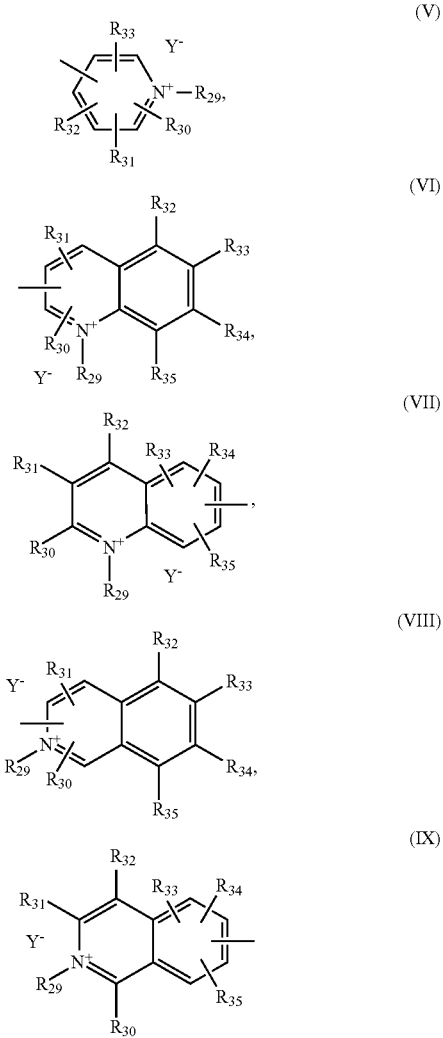

$Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of $C_1$-$C_{20}$alkyl-COO$^-$, $C_6$-$C_{20}$aryl-COO$^-$, $C_1$-$C_{20}$alkyl-S($=$O)$_2$O$^-$, $C_6$-$C_{20}$aryl-S($=$O)$_2$O$^-$, $C_1$-$C_{20}$alkyl-O—S($=$O)$_2$O$^-$, $C_6$-$C_{20}$aryl-O—S($=$O)$_2$O$^-$, $C_1$-$C_{20}$alkyl-P($=$O)$_2$O$^-$, $C_6$-$C_{20}$aryl-P($=$O)$_2$O$^-$, $C_1$-$C_{20}$alkyl-O—P($=$O)$_2$O$^-$ and $C_6$-$C_{20}$aryl-O—P($=$O)$_2$O$^-$, whereby the aryl is unsubstituted or substituted by 1 to 4 $C_1$-$C_{20}$alkyl, or $Y^-$ is an anionic group which is part of a compound of formula (I) and is selected from the group consisting of COO$^-$, S($=$O)$_2$O$^-$, O$^-$, O—S($=$O)$_2$O$^-$, P($=$O)(O$^-$)(O$^-$Z$^+$), P($=$O)(OH)(O$^-$), O—P($=$O)(O$^-$)(O$^-$Z$^+$), O—P($=$O)(OH)(O$^-$), preferably $Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of $C_1$-$C_{20}$alkyl-COO$^-$, $C_6$-$C_{20}$aryl-COO$^-$, $C_1$-$C_{20}$alkyl-S($=$O)$_2$\O$^-$, O$_6^-$ $C_{20}$aryl-S($=$O)$_2$O$^-$, $C_1$-$C_{20}$alkyl-P($=$O)$_2$O$^-$ and $C_6$-$C_{20}$aryl-P($=$O)$_2$O$^-$, whereby the aryl is unsubstituted or substituted by 1 to 4 $C_1$-$C_{20}$alkyl, or $Y^-$ is an anionic group which is part of a compound of formula (I) and is selected from the group consisting of COO$^-$, S($=$O)$_2$O$^-$, P($=$O)(O$^-$)(O$^-$Z$^+$) and P($=$O)(OH)(O$^-$);

more preferably $Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of $C_1$-$C_{20}$alkyl-COO$^-$, $C_6$-$C_{20}$aryl-COO$^-$, $C_1$-$C_{20}$alkyl-S($=$O)$_2$O$^-$, $C_6$-$C_{20}$aryl-S($=$O)$_2$O$^-$, $C_1$-$C_{20}$alkyl-P($=$O)$_2$O$^-$ and $C_6$-$C_{20}$aryl-P($=$O)$_2$O$^-$, whereby the aryl is unsubstituted or substituted by 1 to 4 $C_1$-$C_{20}$alkyl, or $Y^-$ is an anionic group which is part of a compound of formula (I) and is selected from the group consisting of COO$^-$; even more preferably, $Y^-$ is $Cl^-$, $Br^-$, $I^-$ or an organic anion which is $C_6$-$C_{20}$aryl-S($=$O)$_2$O$^-$, whereby the aryl is substituted by 1 to 4 (e.g. 1) $C_1$-$C_{20}$alkyl, most preferably $Y^-$ is $Br^-$;

$R_{29}$ is G, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl, whereby the alkyl, alkenyl, alkynyl, aryl, heteroaryl, aralkyl, aralkenyl, aralkynyl, cycloalkyl, cycloalkenyl and cycloalkynyl are unsubstituted or substituted by fluorine, pyridinium*$Y^-$, quinolinium*$Y^-$ or isoquinolinium*$Y^-$, whereby the pyridinium, quinolinium and isoquinolinium are unsubstituted or substituted by G, $C_1$-$C_{20}$alkyl or combinations thereof;

$R_{30}$, $R_{31}$, $R_{32}$, $R_{33}$, $R_{34}$ and $R_{35}$ are independently G, H, halogen, pyridinium*$Y^-$, quinolinium*$Y^-$, isoquinolinium*$Y^-$, $C_1$-$C_{20}$alkyl, $C_2$-$C_{20}$alkenyl, $C_2$-$C_{20}$alkynyl, $C_6$-$C_{20}$aryl, $a_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl, whereby the whereby the pyridinium, quinolinium, isoquinolinium, alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—$R_{14}$, O—$R_{14}$, CO—OR$_{14}$, O—CO—$R_{14}$, NR$_{14}$R$_{14}'$, CONR$_{14}$R$_{14}'$, NR$_{14}$—CO—R$_{14}'$, S($=$O)$_2$OR$_{14}$, S($=$O)$_2$O$^-$Z$^+$ or combinations thereof, and the aryl and heteroaryl can be further substituted by 1-4 $C_1$-$C_{20}$alkyl, and whereby the pyridinium, quinolinium and isoquinolinium can be further substituted by G, $C_1$-$C_{20}$alkyl or combinations thereof;

or two vicinal groups of $R_{29}$-$R_{35}$ form together trimethylene, tetramethylene or pentamethylene, each of which is unsubstituted or substituted by G, benzo, $R_{14}$ or combinations thereof.

n is 0 or 1;

$R_1$, $R_2$, $R_3$ and $R_4$ are independently H, —S($=$O)$_2$OR$_7$, —S($=$O)$_2$R$_7$, —S($=$O)R$_7$, —S($=$O)OR$_7$, fluorinated $C_1$-$C_8$alkyl, a group of formula (II), $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, NR$_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$OR_{14}$, O—CO—$R_{14}$, $NR_{14}R_{14}$', $CONR_{14}R_{14}$', $NR_{14}$—CO—$R_{14}$', $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

or $R_1$ is D;

or $R_1$ and $R_{15}$ or $R_1$ and $R_{16}$ form together ethylene, trimethylene, tetramethylene, methylene-O,O-methylene, ethylene-O, O-ethylene, trimethylene-O,O-trimethylene, methylene-$NR_{14}$, $NR_{14}$-methylene, ethylene-$NR_{14}$, $NR_{14}$-ethylene, trimethylene-$NR_{14}$ or $NR_{14}$-trimethylene thus forming an aliphatic 5-, 6- or 7-membered ring;

or $R_2$ and $R_{15}$ form together —O—, —S— or —$NR_{14}$—;

or if D is a group of formula (IV), $R_1$ and $R_{18}$ can form together with the N-atom $R_{17}$ and $R_{18}$ are attached to

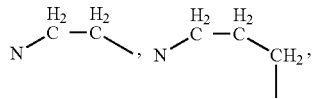

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_1$-$C_{20}$alkylidene, and/or in each of said groups two vicinal H-atoms can be replaced by benzo, trimethylene or tetramethylene;

with the proviso that at least one of $R_1$-$R_4$ is fluorinated $C_1$-$C_8$alkyl or that $R_2$ or $R_4$ or both are —$S(=O)_2OR_7$, —$S(=O)_2R_7$, —$S(=O)R_7$, —$S(=O)OR_7$ or a group of formula (II);

$R_5$ is $NR_8$, N—$OR_8$, N—$NR_8R_9$, O or S;

$R_6$ is $NR_7R_{10}$, $OR_7$, $SR_7$, $NR_7$—$NR_{10}R_{11}$, $NR_7$—$OR_{10}$, O—CO—$R_7$, O—CO—$OR_7$, O—CO—$NR_7R_{10}$, $NR_7$—CO—$R_{10}$, $NR_7$—CO—$OR_{10}$, $NR_7$—CO—$NR_{10}R_{11}$, CO—$R_7$, CO—$OR_7$, CO—$NR_7R_{10}$, $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$OR_{14}$, O—CO—$R_{14}$, $NR_{14}R_{14}$', $CONR_{14}R_{14}$', $NR_{14}$—CO—$R_{14}$', $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_8$ and $R_9$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$OR_{14}$, O—CO—$R_{14}$, $NR_{14}R_{14}$', $CONR_{14}R_{14}$', $NR_{14}$—CO—$R_{14}$', $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl, $C_6$-$C_{20}$cycloalkynyl or combinations thereof;

$R_7$, $R_{10}$ and $R_{11}$ are independently H, $C_1$-$C_{20}$alkyl, $C_2$-$C_{20}$alkenyl, $C_2$-$C_{20}$alkynyl, $C_6$-$C_{20}$aryl, $C_3$-$C_{20}$heteroaryl, $C_7$-$C_{20}$aralkyl, $C_8$-$C_{20}$aralkenyl, $C_8$-$C_{20}$aralkynyl, $C_1$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$R_{14}$, CO—$OR_{14}$, O—CO—$R_{14}$, $NR_{14}R_{14}$', $CONR_{14}R_{14}$', $NR_{14}$—CO—$R_{14}$', $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, fluorinated O—$C_1$-$C_{20}$alkyl, —CN, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_1$-$C_{20}$cycloalkyl, $C_5$-$C_{20}$cycloalkenyl, $C_6$-$C_{20}$cycloalkynyl or combinations thereof;

or $R_7$ or $R_{10}$ being part of $R_2$ forms together with $R_1$ a direct bond, methylene or ethylene thus forming an aliphatic 5-, 6- or 7-membered ring;

or $R_7$ or $R_{10}$ being part of $R_4$ forms together with $R_3$ a direct bond, methylene or ethylene thus forming an aliphatic 5-, 6- or 7-membered ring;

or if $R_7$ or $R_{10}$ is part of $R_2$, it can form together with $R_{15}$ or $R_{16}$ a direct bond or methylene thus forming an aliphatic 6- or 7-membered ring;

or if $R_7$ or $R_{10}$ is part of $R_2$ with n being 0 or is part of $R_4$ with n being 1, it can form together with a substituent of A ortho to the

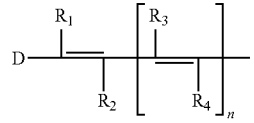

group a direct bond, methylene or ethylene thus forming an aliphatic 5-, 6- or 7-membered ring;

$R_{14}$, $R_{14}$' are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is independently a group of formula (III) or (IV)

$R_{17}$ and $R_{18}$ are independently fluorenyl, $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_1$-$C_{20}$cycloalkyl, $C_5$-$C_{20}$cycloalkenyl or $C_6$-$C_{20}$cycloalkynyl, whereby the fluorenyl, alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by tetrahydrofuranyl, halogen, S—$R_{14}$, O—$R_{14}$, CO—$OR_{14}$, O—CO—$R_{14}$, $NR_{14}R_{14}$', $CONR_{14}R_{14}$', $NR_{14}$—CO—$R_{14}$', $S(=O)_2OR_{14}$, $S(=O)_2O^-Z^+$ or combinations thereof, and the fluorenyl, aryl and heteroaryl can be further substituted by maleic anhydridyl, maleimidyl, indenyl, $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_1$-$C_{20}$cycloalkyl, $C_6$-$C_{20}$cycloalkenyl, $C_6$-$C_{20}$cycloalkynyl or combinations thereof, whereby the maleic anhydridyl and maleimidyl are unsubstituted or substituted by $C_1$-$C_{20}$alkyl, $C_6$-$C_{20}$aryl, phenyl-$NR_{14}R_{14}'$ or combinations thereof;

or $R_{17}$ and $R_{18}$ form together with the N they are attached to piperidinyl, piperazinyl, morpholinyl, imidazolidinyl or pyrrolidinyl, each of which is unsubstituted or substituted by $C_1$-$C_{20}$alkyl, $C_1$-$C_{20}$alkylidene, benzo, trimethylene, tetramethylene or combinations thereof, which are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof;

or $R_{17}$ and $R_{22}$, $R_{17}$ and $R_{20}$ and/or $R_{18}$ and $R_{19}$ form together with the N-atom $R_{17}$ and $R_{18}$ are attached to

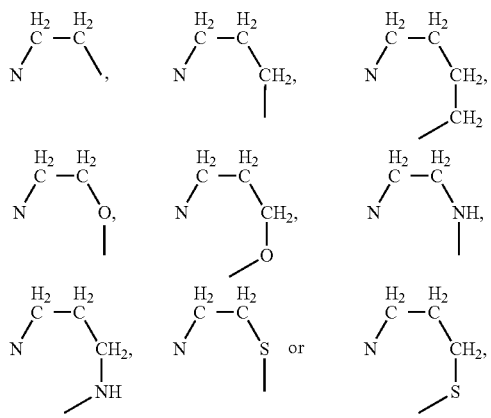

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}, R_{16}, R_{19}, R_{20}, R_{21}, R_{22}, R_{23}$ and $R_{24}$ are independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, CO—$SR_{25}$, CO—$NR_{25}$—$NR_{26}R_{27}$, CO—$NR_{25}$—CO—$R_{26}$, CO—O—CO—$R_{25}$, CO—O—CO—$OR_{25}$, CO—O—CO—$NR_{25}R_{26}$, CO—$NR_{25}$—CO—$R_{26}$, CO—$NR_{25}$—CO—$OR_{26}$, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_{25}$, $R_{26}$ and $R_{27}$ are independently H, $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by pyridinium*$Y^-$, maleic anhydridyl, maleimidyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof, whereby the pyridinium, maleic anhydridyl, maleimidyl are unsusbstituted or substituted by $C_1$-$C_{20}$alkyl, $C_2$-$C_{20}$alkenyl, $C_2$-$C_{20}$alkynyl, $C_6$-$C_{20}$aryl, $C_6$-$C_{20}$aryl-O—$R_{14}$, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof;

with the proviso that at least one of $R_{29}$-$R_{35}$ or at least one of $R_1$-$R_4$ or at least one of $R_{29}$-$R_{35}$ and at least one of $R_1$-$R_4$ comprises a group G;

wherein G is —$R_{28}$—COOH, —$R_{28}$—COO$^-Z^+$, —$R_{28}$—S$(=O)_2OH$, —$R_{28}$—$S(=O)_2O^-Z^+$, —$R_{28}$—O—$S(=O)_2$OH, —$R_{28}$—O—$S(=O)_2O^-Z^+$, —$R_{28}$—P(=O)(OH)$_2$, —$R_{28}$—P(=O)(O$^-Z^+$)$_2$, —$R_{28}$—P(=O)(OH)(O$^-Z^+$), —$R_{28}$—O—P(=O)(OH)$_2$, —$R_{28}$—O—P(=O)(O$^-Z^+$)$_2$, —$R_{28}$—O—P(=O)(OH)(O$^-Z^+$), $R_{28}$ is a direct bond or $C_1$-$C_{20}$alkylene, $C_2$-$C_{20}$alkenylene, $C_2$-$C_{20}$alkynylene, $C_6$-$C_{20}$arylene, $C_4$-$C_9$heteroarylene, $C_7$-$C_{11}$aralkylene, $C_8$-$C_{11}$aralkenylene, $C_8$-$C_{11}$aralkynylene, $C_6$-$C_{11}$heteroarylkylene, $C_7$-$C_{11}$heteroaralkenylene, $C_7$-$C_{11}$heteroaralkynylene or $C_5$-$C_6$cycloalkylene, whereby each of said groups is unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the arylene and heteroarylene can be further substituted by 1-4 $C_1$-$C_{20}$alkyl;

$Z^+$ is $N(R_{14})_4^+$, $Li^+$, $Na^+$ or $K^+$ or is the cationic group

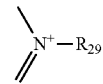

which is part of a compound of formula (I) as part of group A; or the compound of formula (I) is dimeric and one of $R_6$, $R_7$, $R_{10}$, $R_{29}$-$R_{35}$ is $R_{36}$, or $R_1$ is

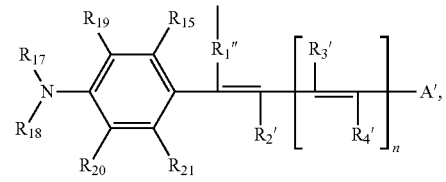

or R$_2$ is

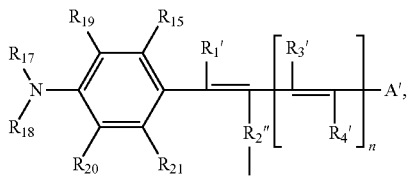

or R$_3$ is

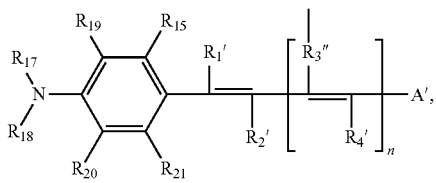

or R$_4$ is

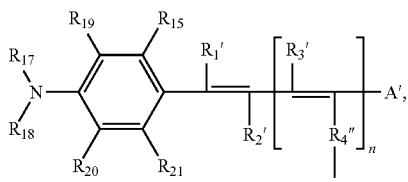

or R$_{18}$ is

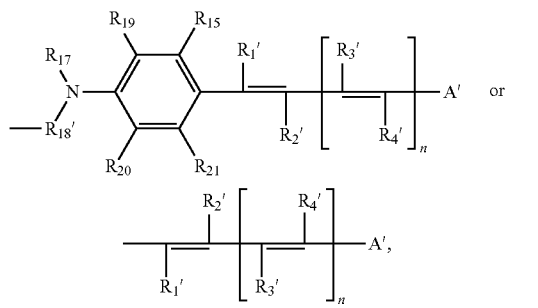

or R$_{20}$ is

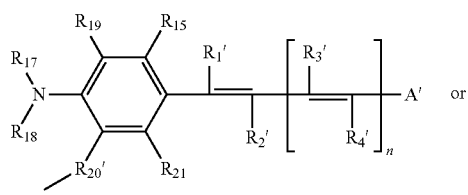

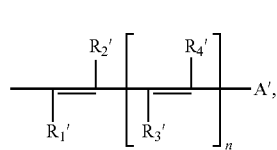

or R$_{21}$ is

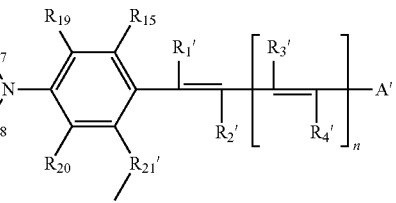

or one of R$_{30}$-R$_{35}$ is

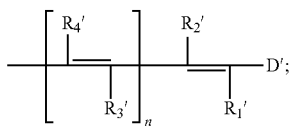

A' is as defined for A; D' is as defined for D; R$_1$' is as defined for R$_1$; R$_2$' is as defined for R$_2$; R$_3$' is as defined for R$_3$; R$_4$' is as defined for R$_4$;
R$_1$", R$_2$", R$_3$", R$_4$" are R$_{36}$;
R$_{18}$' is R$_{37}$;
R$_{20}$' and R$_{21}$' are R$_{37}$, O—R$_{37}$—O, S—R$_{37}$—S, NR$_{14}$—R$_{37}$—NR$_{14}$', CO—O—R$_{37}$—CO, CO—O—R$_{37}$—O—CO, CO—NR$_{14}$—R$_{37}$—NR$_{14}$'—CO, CO—S—R$_{37}$—S—CO, O—CO—R$_{37}$—CO—O, NR$_{14}$—CO—R$_{37}$—CO—NR$_{14}$' or S—CO—R$_{37}$—CO—S;
R$_{36}$ is as defined for R$_{37}$, whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene can be further substituted by G; R$_{37}$ is C$_1$-C$_{20}$alkylene, C$_2$-C$_{20}$alkenylene, C$_2$-C$_{20}$alkynylene, C$_6$-C$_{20}$arylene, C$_4$-C$_{20}$heteroarylene, C$_7$-C$_{20}$aralkylene, C$_8$-C$_{20}$aralkenylene, C$_8$-C$_{20}$aralkynylene, C$_4$-C$_{20}$cycloalkylene, C$_1$-C$_8$alkylene-C$_6$-C$_{20}$arylene-C$_1$-C$_8$alkylene (e.g.

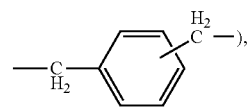

C$_5$-C$_{20}$cycloalkenylene or C$_6$-C$_{20}$cycloalkynylene, whereby the alkylene and cycloalkylene is uninterrupted or interrupted by O, S, NR$_{14}$ or combinations thereof, and whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene are unsubstituted or substituted by fluorine, and whereby the arylene, heteroarylene and aryl can be further substituted by C$_1$-C$_{20}$alkyl, fluorinated C$_1$-C$_{20}$alkyl or combinations thereof, preferably R$_{37}$ is C$_1$-C$_{20}$alkylene;
and the remainder of the substituents are as defined above.

For example, A is a group of formula (V)-(IX), preferably a group of formula (V)-(VII), most preferably a group of formula (V)

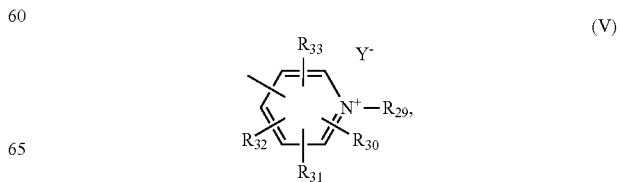 (V)

-continued

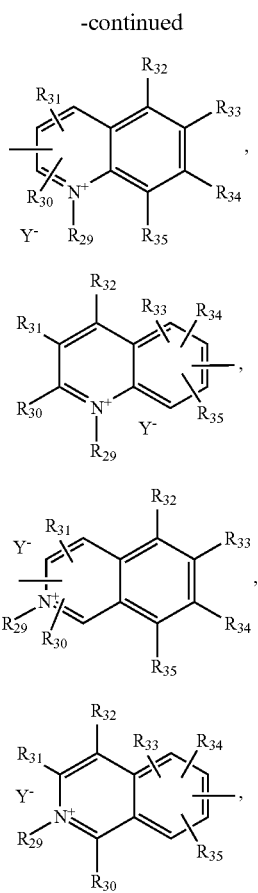

Y⁻ is Cl⁻, Br⁻, I⁻, SCN⁻, BF$_4^-$, PF$_6^-$, ClO$_4^-$, SbF$_6^-$, AsF$_6^-$ or an organic anion selected from the group consisting of C$_1$-C$_{20}$alkyl-COO⁻, C$_6$-C$_{20}$aryl-COO⁻, C$_1$-C$_{20}$alkyl-S(=O)$_2$O⁻, C$_6$-C$_{20}$aryl-S(=O)$_2$O⁻, C$_1$-C$_{20}$alkyl-O—S(=O)$_2$O⁻, C$_6$-C$_{20}$aryl-O—S(=O)$_2$O⁻, C$_1$-C$_{20}$alkyl-P(=O)$_2$O⁻, C$_6$-C$_{20}$aryl-P(=O)$_2$O⁻, C$_1$-C$_{20}$alkyl-O—P(=O)$_2$O⁻ and C$_6$-C$_{20}$aryl-O—P(=O)$_2$O⁻, whereby the aryl is unsubstituted or substituted by 1 to 4 C$_1$-C$_{20}$alkyl, or Y⁻ is an anionic group which is part of a compound of formula (I) and is selected from the group consisting of COO⁻, S(=O)$_2$O⁻, O—S(=O)$_2$O⁻, P(=O)(O⁻)(O⁻Z⁺), P(=O)(OH)(O⁻), O—P(=O)(O⁻)(O⁻Z⁺), O—P(=O)(OH)(O⁻); preferably Y⁻ is Cl⁻, Br⁻, I⁻, SCN⁻, BF$_4^-$, PF$_6^-$, ClO$_4^-$, SbF$_6^-$, AsF$_6^-$ or an organic anion selected from the group consisting of C$_1$-C$_{20}$alkyl-COO⁻, C$_6$-C$_{20}$aryl-COO⁻, C$_1$-C$_{20}$alkyl-S(=O)$_2$O⁻, C$_6$-C$_{20}$aryl-S(=O)$_2$O⁻, C$_1$-C$_{20}$alkyl-P(=O)$_2$O⁻ and C$_6$-C$_{20}$aryl-P(=O)$_2$O⁻, whereby the aryl is unsubstituted or substituted by 1 to 4 C$_1$-C$_{20}$alkyl, or Y⁻ is an anionic group which is part of a compound of formula (I) and is selected from the group consisting of COO⁻, S(=O)$_2$O⁻, P(=O)(O⁻)(O⁻Z⁺) and P(=O)(OH)(O⁻); more preferably Y⁻ is Cl⁻, Br⁻, I⁻, SCN⁻, BF$_4^-$, PF$_6^-$, ClO$_4^-$, SbF$_6^-$, AsF$_6^-$ or an organic anion selected from the group consisting of C$_1$-C$_{20}$alkyl-COO⁻, C$_6$-C$_{20}$aryl-COO⁻, C$_1$-C$_{20}$alkyl-S(=O)$_2$O⁻, C$_6$-C$_{20}$aryl-S(=O)$_2$O⁻, C$_1$-C$_{20}$alkyl-P(=O)$_2$O⁻ and C$_6$-C$_{20}$aryl-P(=O)$_2$O⁻, whereby the aryl is unsubstituted or substituted by 1 to 4 C$_1$-C$_{20}$alkyl, or Y⁻ is an anionic group which is part of a compound of formula (I) and is selected from the group consisting of COO⁻; even more preferably, Y⁻ is Cl⁻, Br⁻, I⁻, most preferably Y⁻ is Br⁻;

$R_{29}$ is G, C$_1$-C$_{20}$alkyl, C$_2$-C$_{20}$alkenyl, C$_2$-C$_{20}$alkynyl, C$_6$-C$_{20}$aryl, C$_4$-C$_{29}$heteroaryl, C$_7$-C$_{20}$aralkyl, C$_8$-C$_{20}$aralkenyl, C$_8$-C$_{20}$aralkynyl, C$_5$-C$_{20}$cycloalkyl, C$_5$-C$_{20}$cycloalkenyl or C$_6$-C$_{20}$cycloalkynyl, whereby the alkyl, alkenyl, alkynyl, aryl, heteroaryl, aralkyl, aralkenyl, aralkynyl, cycloalkyl, cycloalkenyl and cycloalkynyl are unsubstituted or substituted by fluorine, pyridinium*Y⁻, quinolinium*Y⁻ or isoquinolinium*Y⁻, whereby the pyridinium, quinolinium and isoquinolinium are unsubstituted or substituted by G, C$_1$-C$_{20}$alkyl or combinations thereof;

$R_{30}$, $R_{31}$, $R_{32}$, $R_{33}$, $R_{34}$ and $R_{35}$ are independently G, H, halogen, pyridinium*Y⁻, quinolinium*Y⁻, isoquinolinium*Y⁻, C$_1$-C$_{20}$alkyl, C$_2$-C$_{20}$alkenyl, C$_2$-C$_{20}$alkynyl, C$_6$-C$_{20}$aryl, a$_4$-C$_{20}$heteroaryl, C$_7$-C$_{20}$aralkyl, C$_8$-C$_{20}$aralkenyl, C$_8$-C$_{20}$aralkynyl, C$_5$-C$_{20}$cycloalkyl, C$_5$-C$_{20}$cycloalkenyl or C$_6$-C$_{20}$cycloalkynyl, whereby the whereby the pyridinium, quinolinium, isoquinolinium, alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—R$_{14}$, O—R$_{14}$, CO—OR$_{14}$, O—CO—R$_{14}$, NR$_{14}$R$_{14}'$, CONR$_{14}$R$_{14}'$, NR$_{14}$—CO—R$_{14}'$, S(=O)$_2$OR$_{14}$, S(=O)$_2$O⁻Z⁺ or combinations thereof, and the aryl and heteroaryl can be further substituted by 1-4 C$_1$-C$_{20}$alkyl, and whereby the pyridinium, quinolinium and isoquinolinium can be further substituted by G, C$_1$-C$_{20}$alkyl or combinations thereof;

or two vicinal groups of R$_{29}$-R$_{35}$ form together trimethylene, tetramethylene or pentamethylene, each of which is unsubstituted or substituted by G, benzo, R$_{14}$ or combinations thereof.

n is 0 or 1;

$R_1$, $R_2$, $R_3$ and $R_4$ are independently H, —S(=O)$_2$OR$_7$, —S(=O)$_2$R$_7$, —S(=O)R$_7$, —S(=O)OR$_7$, fluorinated C$_1$-C$_8$alkyl, a group of formula (II), C$_1$-C$_{20}$alkyl, C$_2$-C$_{20}$alkenyl, C$_2$-C$_{20}$alkynyl, C$_6$-C$_{20}$aryl, C$_4$-C$_{20}$heteroaryl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl or C$_6$-C$_{20}$cycloalkynyl, whereby the alkyl and cycloalkyl are uninterrupted or interrupted by O, S, NR$_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—R$_{14}$, O—R$_{14}$, CO—OR$_{14}$, O—CO—R$_{14}$, NR$_{14}$R$_{14}'$, CONR$_{14}$R$_{14}'$, NR$_{14}$—CO—R$_{14}'$, S(=O)$_2$OR$_{14}$, S(=O)$_2$O⁻Z⁺ or combinations thereof, and the aryl and heteroaryl can be further substituted by C$_1$-C$_{20}$alkyl, fluorinated C$_1$-C$_{20}$alkyl, C$_2$-C$_{20}$alkenyl, C$_2$-C$_{20}$alkynyl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl, C$_6$-C$_{20}$cycloalkynyl or combinations thereof;

or $R_1$ and $R_{15}$ or $R_1$ and $R_{16}$ form together ethylene, trimethylene, tetramethylene, methylene-O,O-methylene, ethylene-O,O-ethylene, trimethylene-O,O-trimethylene, methylene-NR$_{14}$, NR$_{14}$-methylene, ethylene-NR$_{14}$, NR$_{14}$-ethylene, trimethylene-NR$_{14}$ or NR$_{14}$-trimethylene thus forming an aliphatic 5-, 6- or 7-membered ring;

with the proviso that at least one of R$_1$-R$_4$ is fluorinated C$_1$-C$_8$alkyl or that R$_2$ or R$_4$ or both are —S(=O)$_2$OR$_7$, —S(=O)$_2$R$_7$, —S(=O)R$_7$, —S(=O)OR$_7$ or a group of formula (II);

$R_5$ is NR$_8$, N—OR$_8$, N—NR$_8$R$_9$, O or S;

$R_6$ is NR$_7$R$_{10}$, OR$_7$, SR$_7$, NR$_7$—NR$_{10}$R$_{11}$, NR$_7$—OR$_{10}$, O—CO—R$_7$, O—CO—OR$_7$, O—CO—NR$_7$R$_{10}$, NR$_7$—CO—R$_{10}$, NR$_7$—CO—OR$_{10}$, NR$_7$—CO—NR$_{10}$R$_{11}$, CO—R$_7$, CO—OR$_7$, CO—NR$_7$R$_{10}$, C$_1$-C$_{20}$alkyl, C$_6$-C$_{20}$aryl, C$_2$-C$_{20}$alkenyl, C$_2$-C$_{20}$alkynyl, C$_6$-C$_{20}$aryl, C$_4$-C$_{20}$heteroaryl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl or C$_6$-C$_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_8$ and $R_9$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_7$, $R_{10}$ and $R_{11}$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

or $R_7$ or $R_{10}$ being part of $R_2$ forms together with $R_1$ a direct bond, methylene or ethylene thus forming an aliphatic 5-, 6- or 7-membered ring;

or $R_7$ or $R_{10}$ being part of $R_4$ forms together with $R_3$ a direct bond, methylene or ethylene thus forming an aliphatic 5-, 6- or 7-membered ring;

or if $R_7$ or $R_{10}$ is part of $R_2$, it can form together with $R_{15}$ or $R_{16}$ a direct bond or methylene thus forming an aliphatic 6- or 7-membered ring;

or if $R_7$ or $R_{10}$ is part of $R_2$ with n being 0 or is part of $R_4$ with n being 1, it can form together with a substituent of A ortho to the

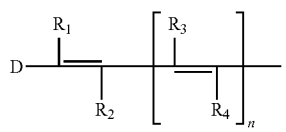

group a direct bond, methylene or ethylene thus forming an aliphatic 5-, 6- or 7-membered ring;

$R_{14}$, $R_{14}'$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is a group of formula (III) or (IV)

$R_{17}$ and $R_{18}$ are independently fluorenyl, $C_1$-$C_{20}$alkyl, $C_2$-$C_{20}$alkenyl, $C_2$-$C_{20}$alkynyl, $C_6$-$C_{20}$aryl, $C_1$-$C_{20}$heteroaryl, $C_7$-$C_{20}$aralkyl, $C_8$-$C_{20}$aralkenyl, $C_8$-$C_{20}$aralkynyl, $C_1$-$C_{20}$cycloalkyl, $C_5$-$C_{20}$cycloalkenyl or $C_6$-$C_{20}$cycloalkynyl, whereby the fluorenyl, alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by tetrahydrofuranyl, halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$ or combinations thereof, and the fluorenyl, aryl and heteroaryl can be further substituted by maleic anhydridyl, maleimidyl, indenyl, $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_1$-$C_{20}$cycloalkyl, $C_5$-$C_{20}$cycloalkenyl, $C_6$-$C_{20}$cycloalkynyl or combinations thereof, whereby the maleic anhydridyl and maleimidyl are unsubstituted or substituted by $C_1$-$C_{20}$alkyl, $C_6$-$C_{20}$aryl, phenyl-$NR_{14}R_{14}'$ or combinations thereof;

or $R_{17}$ and $R_{18}$ form together with the N they are attached to piperidinyl, piperazinyl, morpholinyl, imidazolidinyl or pyrrollidinyl, each of which is unsubstituted or substituted by $C_1$-$C_{20}$alkyl, $C_1$-$C_{20}$alkylidene, benzo, trimethylene, tetramethylene or combinations thereof, which are unsubstituted or substituted by halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$ or combinations thereof; or $R_{17}$ and $R_{22}$, $R_{17}$ and $R_{20}$ and/or $R_{18}$ and $R_{19}$ form together with the N-atom $R_{17}$ and $R_{18}$ are attached to

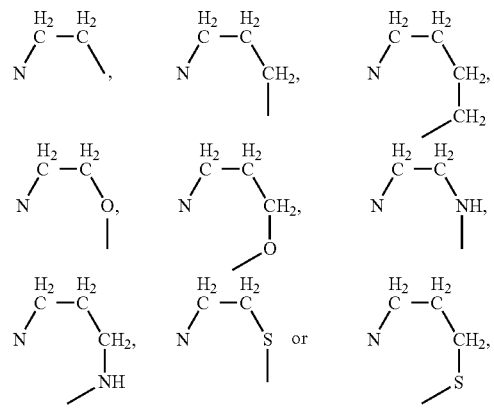

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_r$-$C_{20}$alkylidene, and/or in each of said groups two vicinal H-atoms can be replaced by benzo, trimethylene or tetramethylene;

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}-NR_{26}R_{27}$, $NR_{25}-OR_{26}$, $O-CO-R_{25}$, $O-CO-OR_{25}$, $O-CO-NR_{25}R_{26}$, $NR_{25}-CO-R_{26}$, $NR_{25}-CO-OR_{26}$, $NR_{25}-CO-NR_{26}R_{27}$, $CO-R_{25}$, $CO-OR_{25}$, $CO-NR_{25}R_{26}$, $CO-SR_{25}$, $CO-NR_{25}-NR_{26}R_{27}$, $CO-NR_{25}-OR_{26}$, $CO-O-$ CO—R$_{25}$, CO—O—O—CO—R$_{25}$, CO—O—CO—NR$_{25}$R$_{26}$, CO—NR$_{25}$—CO—R$_{26}$, CO—NR$_{25}$—OR$_{26}$, C$_1$-C$_{20}$alkyl, C$_2$-C$_{20}$alkenyl, C$_2$-C$_{20}$alkynyl, C$_6$-C$_{20}$aryl, C$_4$-C$_{20}$heteroaryl, C$_7$-C$_{20}$aralkyl, C$_8$-C$_{20}$aralkenyl, C$_8$-C$_{20}$aralkynyl, C$_1$-C$_{20}$cycloalkyl, C$_5$-C$_{20}$cycloalkenyl or C$_6$-C$_{20}$cycloalkynyl, whereby the alkyl and cycloalkyl are uninterrupted or interrupted by O, S, NR$_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$', S(=O)$_2$OR$_{14}$, S(=O)$_2$O$^-$Z$^+$ or combinations thereof, and the aryl and heteroaryl can be further substituted by C$_1$-C$_{20}$alkyl, C$_2$-C$_{20}$alkenyl, C$_2$-C$_{20}$alkynyl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl, C$_6$-C$_{20}$cycloalkynyl or combinations thereof;

R$_{25}$, R$_{26}$ and R$_{27}$ are independently H, C$_1$-C$_{20}$alkyl, C$_6$-C$_{20}$aryl, C$_2$-C$_{20}$alkenyl, C$_2$-C$_{20}$alkynyl, C$_6$-C$_{20}$aryl, C$_4$-C$_{20}$heteroaryl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl or C$_6$-C$_{20}$cycloalkynyl, whereby the alkyl and cycloalkyl are uninterrupted or interrupted by O, S, NR$_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by pyridinium*Y$^-$, maleic anhydridyl, maleimidyl, halogen, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$', S(=O)$_2$OR$_{14}$, S(=O)$_2$O$^-$Z$^+$ or combinations thereof, and the aryl and heteroaryl can be further substituted by C$_1$-C$_{20}$alkyl, C$_2$-C$_{20}$alkenyl, C$_2$-C$_{20}$alkynyl, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl, C$_6$-C$_{20}$cycloalkynyl or combinations thereof, whereby the pyridinium, maleic anhydridyl, maleimidyl are unsusbstituted or substituted by C$_1$-C$_{20}$alkyl, C$_2$-C$_{20}$alkenyl, C$_2$-C$_{20}$alkynyl, C$_6$-C$_{20}$aryl, C$_6$-C$_{20}$aryl-O—R$_{14}$, C$_7$-C$_{20}$aralkyl, C$_8$-C$_{20}$aralkenyl, C$_8$-C$_{20}$aralkynyl, C$_4$-C$_{20}$cycloalkyl, C$_5$-C$_{20}$cycloalkenyl, C$_6$-C$_{20}$cycloalkynyl, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$' or combinations thereof;

with the proviso that at least one of R$_{29}$-R$_{35}$ or at least one of R$_1$-R$_4$ or at least one of R$_{29}$-R$_{35}$ and at least one of R$_1$-R$_4$ comprises a group G;

wherein G is —R$_{28}$—COOH, —R$_{28}$—COO$^-$Z$^+$, —R$_{28}$—S(=O)$_2$OH, —R$_{28}$—S(=O)$_2$O$^-$Z$^+$, —R$_{28}$—O—S(=O)$_2$OH, —R$_{28}$—O—S(=O)$_2$O$^-$Z$^+$, —R$_{28}$—P(=O)(OH)$_2$, —R$_{28}$—P(=O)(O$^-$Z$^+$)$_2$, —R$_{28}$—P(=O)(OH)(O$^-$Z$^+$), —R$_{28}$—O—P(=O)(OH)$_2$, —R$_{28}$—O—P(=O)(O$^-$Z$^+$)$_2$, —R$_{28}$—O—P(=O)(OH)(O$^-$Z$^+$), preferably G is —R$_{28}$—COOH, —R$_{28}$—COO$^-$Z$^+$, —R$_{28}$—S(=O)$_2$OH, —R$_{28}$—S(=O)$_2$O$^-$Z$^+$, —R$_{28}$—O—S(=O)$_2$OH, —R$_{28}$—O—S(=O)$_2$O$^-$Z$^+$, —R$_{28}$—P(=O)(OH)$_2$, —R$_{28}$—P(=O)(O$^-$Z$^+$)$_2$, —R$_{28}$—O—P(=O)(OH)(O$^-$Z$^+$), —R$_{28}$—O—P(=O)(OH)$_2$, —R$_{28}$—O—P(=O)(O$^-$Z$^+$)$_2$, —R$_{28}$—O—P(=O)(OH)(O$^-$); more preferably G is —R$_{28}$—COOH, —R$_{28}$—COO$^-$Z$^+$, —R$_{28}$—S(=O)$_2$OH, —R$_{28}$—S(=O)$_2$O$^-$Z$^+$, —R$_{28}$—P(=O)(OH)$_2$, —R$_{28}$—P(=O)(O$^-$Z$^+$)$_2$ or —R$_{28}$—P(=O)(OH)(O$^-$Z$^+$); even more preferably G is —R$_{28}$—COOH, —R$_{28}$—COO$^-$Z$^+$, most preferably G is —R$_{28}$—COOH; R$_{28}$ is a direct bond or C$_1$-C$_{20}$alkylene, C$_2$-C$_{20}$alkenylene, C$_2$-C$_{20}$alkynylene, C$_6$-C$_{20}$arylene, C$_4$-C$_9$heteroarylene, C$_7$-C$_{11}$aralkylene, C$_8$-C$_{11}$aralkenylene, C$_8$-C$_{11}$aralkynylene, C$_6$-C$_{11}$heteroaralkylene, C$_7$-C$_{11}$heteroaralkenylene, C$_7$-C$_{11}$heteroaralkynylene or C$_5$-C$_6$cycloalkylene, whereby each of said groups is unsubstituted or substituted by halogen, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$', S(=O)$_2$OR$_{14}$, S(=O)$_2$O$^-$Z$^+$ or combinations thereof, and the arylene and heteroarylene can be further substituted by 1-4 C$_1$-C$_{20}$alkyl;

Z$^+$ is N(R$_{14}$)$_4$$^+$, Li$^+$, Na$^+$ or K$^+$ or is the cationic group

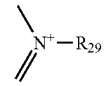

which is part of a compound of formula (I) as part of group A; preferably Z$^+$ is N(R$_{14}$)$_4$$^+$; most preferably Z$^+$ is N(C$_1$-C$_{10}$alkyl)$_4$$^+$;

or the compound of formula (I) is dimeric and one of R$_6$, R$_7$, R$_{10}$, R$_{29}$-R$_{35}$ is R$_{36}$, or R$_1$ is

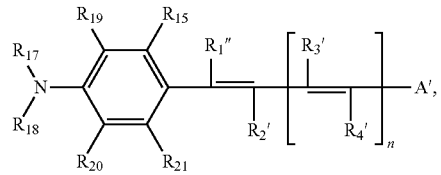

or R$_2$ is

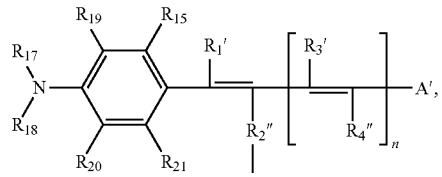

or R$_3$ is

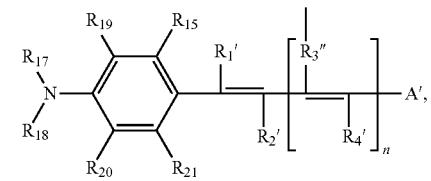

or R$_4$ is

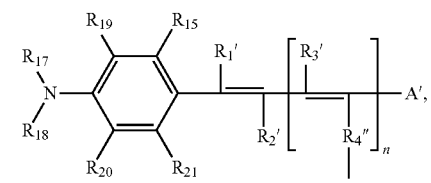

or R$_{18}$ is

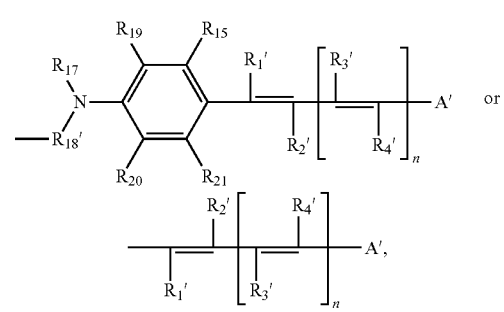

or $R_{20}$ is

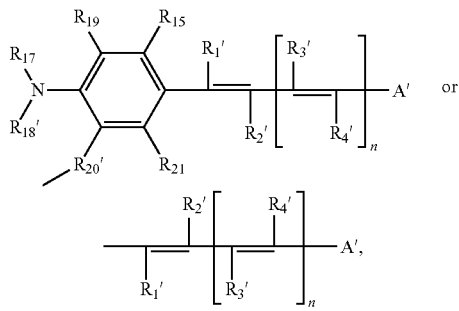

or $R_{21}$ is

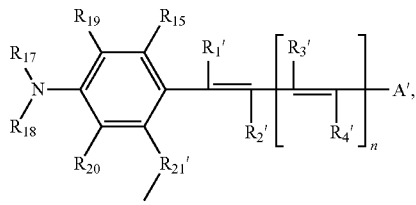

or one of $R_{30}$-$R_{35}$ is

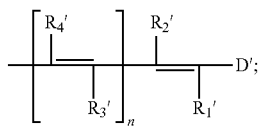

A' is as defined for A; D' is as defined for D; $R_1$' is as defined for $R_1$; $R_2$' is as defined for $R_2$; $R_3$' is as defined for $R_3$; $R_4$' is as defined for $R_4$;

$R_1$", $R_2$", $R_3$", $R_4$" are $R_{36}$;

$R_{18}$' is $R_{37}$;

$R_{20}$' and $R_{21}$' are $R_{37}$, O—$R_{37}$—O, S—$R_{37}$—S, $NR_{14}$—$R_{37}$—$NR_{14}$', CO—$R_{37}$—CO, CO—O—$R_{37}$—O—CO, CO—$NR_{14}$—$R_{37}$—$NR_{14}$'—CO, CO—S—$R_{37}$—S—CO, O—CO—$R_{37}$—CO—O, $NR_{14}$—CO—$R_{37}$—CO—$NR_{14}$' or S—CO—$R_{37}$—CO—S;

$R_{36}$ is as defined for $R_{37}$, whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene can be further substituted by G; $R_{37}$ is $C_1$-$C_{20}$alkylene, $C_2$-$C_{20}$alkenylene, $C_2$-$C_{20}$alkynylene, $C_6$-$C_{20}$arylene, $C_4$-$C_{20}$heteroarylene, $C_7$-$C_{20}$aralkylene, $C_8$-$C_{20}$aralkenylene, $C_8$-$C_{20}$aralkynylene, $C_4$-$C_{20}$cycloalkylene, $C_1$-$C_8$alkylene-$C_6$-$C_{20}$arylene-$C_1$-$C_8$alkylene (e.g.

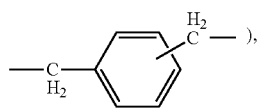

$C_5$-$C_{20}$cycloalkenylene or $C_6$-$C_{20}$cycloalkynylene, whereby the alkylene and cycloalkylene is uninterrupted or interrupted by O, S, $NR_{14}$ or combinations thereof, and whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene are unsubstituted or substituted by fluorine, and whereby the arylene, heteroarylene and aryl can be further substituted by $C_1$-$C_{20}$alkyl, fluorinated $C_1$-$C_{20}$alkyl or combinations thereof, preferably $R_{37}$ is $C_1$-$C_{20}$alkylene;

and the remainder of the substituents are as defined above.

Of course, the proviso that at least one of $R_{29}$-$R_{35}$ or at least one of $R_1$-$R_4$ or at least one of $R_{29}$-$R_{35}$ and at least one of $R_1$-$R_4$ comprises a group G is to be understood that one of the groups $R_{29}$-$R_{35}$ and $R_1$-$R_4$ which is present in the compound of formula (I) comprises the group G. $R_1$'-$R_4$' are as defined for $R_1$-$R_4$ is to be understood as not to comprise the proviso for $R_1$-$R_4$.

For example, the compound of formula (I) is dimeric and one of $R_6$, $R_7$, $R_{10}$, $R_{29}$-$R_{35}$ is $R_{36}$ is to be understood that the dimer contains two (e.g. identical) moieties of formula (I) which are connected by the above mentioned $R_{36}$.

For instance, A is a group of formula (V)-(VII'), preferably a group of formula (V');

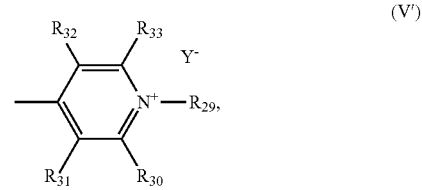

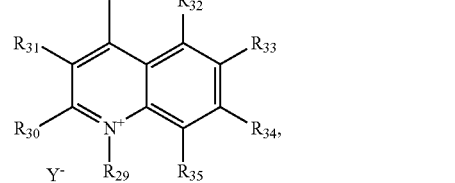

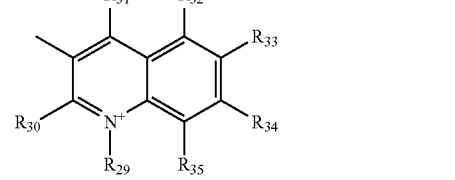

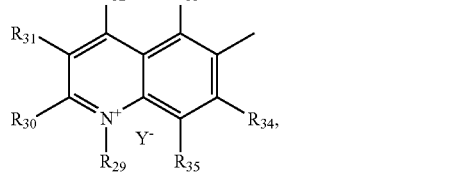

$Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of, $C_1$-$C_{20}$alkyl-$S(=O)_2O^-$, $C_6$-$C_{20}$aryl-$S(=O)_2O^-$, $C_1$-$C_{20}$alkyl-O—$S(=O)_2O^-$, $C_6$-$C_{20}$aryl-O—$S(=O)_2O^-$, $C_1$-$C_{20}$alkyl-$P(=O)_2O^-$, $C_6$-$C_{20}$aryl-$P(=O)_2O^-$, $C_1$-$C_{20}$alkyl-O—$P(=O)_2O^-$ and $C_6$-$C_{20}$aryl-O—$P(=O)_2O^-$, whereby the aryl is unsubstituted or substituted by 1 to 4 $C_1$-$C_{20}$alkyl, or $Y^-$ is an anionic group which is part of a compound of formula (I) and is selected from the group consisting of $COO^-$, $S(=O)_2O^-$, O—$S(=O)_2O^-$, $P(=O)(O^-)(O^-Z^+)$, $P(=O)(OH)(O^-)$, O—$P(=O)(O^-)(O^-Z^+)$ and O—$P(=O)(OH)(O^-)$;

$R_{29}$ is G or $C_1$-$C_8$alkyl, whereby the alkyl is unsubstituted or substituted by pyridinium*$Y^-$ or quinolinium*$Y^-$, whereby the pyridinium and quinolinium are substituted by G;

$R_{30}$, $R_{31}$, $R_{32}$, $R_{33}$, $R_{34}$ and $R_{35}$ are independently H, pyridinium*$Y^-$ or quinolinium*$Y^-$, whereby the pyridinium and quinolinium are substituted by G;

n is 0 or 1;

$R_1$, $R_2$, $R_3$ and $R_4$ are independently H, —S(=O)$_2$OR$_7$, —S(=O)$_2$R$_7$, —S(=O)R$_7$, —S(=O)OR$_7$, fluorinated $C_1$-$C_4$alkyl, a group of formula (II), $C_1$-$C_8$alkyl or $C_6$aryl; or $R_1$ is D;

or $R_1$ and $R_{15}$ form together ethylene, trimethylene, methylene-O,O-methylene, ethylene-O,O-ethylene, methylene-NR$_{14}$, NR$_{14}$-methylene, ethylene-NR$_{14}$ or NR$_{14}$-ethylene, thus forming an aliphatic 5- or 6-membered ring;

or $R_2$ and $R_{15}$ form together —O—, —S— or —NR$_{14}$—, preferably —O—;

or if D is a group of formula (IV), $R_1$ and $R_{18}$ can form together with the N-atom $R_{17}$ and $R_{18}$ are attached to

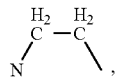

in each of said groups two vicinal H-atoms can be replaced by benzo, preferably form

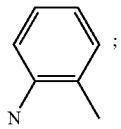

with the proviso that at least one of $R_1$-$R_4$ is fluorinated $C_1$-$C_4$alkyl or that $R_2$ or $R_4$ or both are —S(=O)$_2$OR$_7$, —S(=O)$_2$R$_7$, —S(=O)R$_7$, —S(=O)OR$_7$ or a group of formula (II);

$R_5$ is O;

$R_6$ is NR$_7$R$_{10}$, OR$_7$, SR$_7$, NR$_7$—NR$_{10}$R$_{11}$, NR$_7$—R$_{10}$;

$R_7$, $R_{10}$ and $R_{11}$ are independently H, $C_1$-$C_8$alkyl, $C_6$-$C_{20}$aryl, $C_3$-$C_{16}$heteroaryl or $C_7$-$C_{10}$aralkyl, and whereby the alkyl, aryl, heteroaryl and aralkyl are unsubstituted or substituted by halogen, S—R$_{14}$, O—R$_{14}$, CO—R$_{14}$, CO—OR$_{14}$, O—CO—R$_{14}$, NR$_{14}$R$_{14}$', CONR$_{14}$R$_{14}$' or NR$_{14}$—CO—R$_{14}$', and the aryl and heteroaryl can be further substituted by $C_1$-$C_{10}$alkyl or fluorinated $C_1$-$C_8$alkyl, fluorinated O—$C_1$-$C_8$alkyl, —CN or combinations thereof;

or $R_7$ being part of $R_2$ forms together with $R_1$ a direct bond or methylene thus forming an aliphatic 5- or 6-membered ring;

or if $R_7$ is part of $R_2$, it can form together with $R_{15}$ a direct bond thus forming an aliphatic 6-membered ring;

or if $R_7$ or $R_{10}$ is part of $R_2$ with n being 0, it can form together with a substituent of A ortho to the

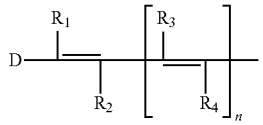

group a direct bond or methylene thus forming an aliphatic 5- or 6-membered ring;

$R_{14}$, $R_{14}$' are independently H, $C_1$-$C_{14}$alkyl, $C_6$aryl or $C_7$-$C_{10}$aralkyl;

D is independently a group of formula (III) or (IV);

$R_{17}$ and $R_{18}$ are independently $C_1$-$C_8$alkyl, $C_2$-$C_8$alkenyl, $C_6$-$C_{20}$aryl, $C_4$-$C_{24}$heteroaryl, $C_7$-$C_{20}$aralkyl, $C_8$-$C_{20}$aralkenyl, $C_8$-$C_{10}$aralkynyl or $C_5$-$C_{12}$cycloalkyl, whereby the alkyl, alkenyl, aryl, heteroaryl, aralkyl, aralkenyl, aralkynyl and cycloalkyl, are unsubstituted or substituted by tetrahydrofuranyl, halogen, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$' or combinations thereof, and the aryl and heteroaryl can be further substituted by $C_1$-$C_8$alkyl, $C_2$-$C_8$alkenyl or $C_8$-$C_{20}$aralkenyl;

or $R_{17}$ and $R_{20}$ form together with the N-atom $R_{17}$ and $R_{18}$ are attached to

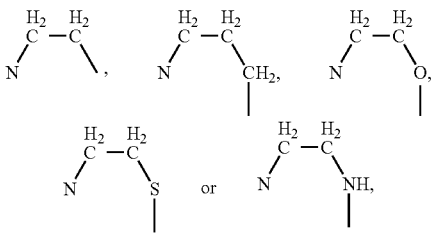

whereby in each of said groups one or more H-atom can be replaced by $C_1$-$C_{20}$alkyl, $C_6$-$C_{20}$aryl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}$ is H, NR$_{25}$R$_{26}$, OR$_{25}$, SR$_{25}$, O—CO—R$_{25}$ or NR$_{25}$—CO—R$_{26}$;

$R_{19}$, $R_{20}$ and $R_{21}$ are H;

$R_{25}$ and $R_{26}$ are independently H, $C_1$-$C_{14}$alkyl, $C_6$aryl or $C_7$-$C_{10}$aralkyl, whereby the alkyl, aryl and aralkyl are unsubstituted or substituted by pyridinium*$Y^-$, halogen, S—R$_{14}$, O—R$_{14}$, CO—OR$_{14}$, O—CO—R$_{14}$, NR$_{14}$R$_{14}$', CONR$_{14}$R$_{14}$', NR$_{14}$—CO—R$_{14}$' or combinations thereof, and the pyridinium and aryl can be further substituted by $C_1$-$C_8$alkyl;

with the proviso that at least one of $R_{29}$-$R_{35}$ comprises a group G;

wherein G is —R$_{28}$—COOH, —R$_{28}$—COO$^-$Z$^+$, —R$_{28}$—S(=O)$_2$OH, —R$_{28}$—S(=O)$_2$O$^-$Z$^+$, —R$_{28}$—O—S(=O)$_2$OH, —R$_{28}$—O—S(=O)$_2$O$^-$Z$^+$, —R$_{28}$—P(=O)(OH)$_2$, —R$_{28}$—P(=O)(O$^-$Z$^+$)$_2$, —R$_{28}$—P(=O)(OH)(O$^-$Z$^+$), —R$_{28}$—O—P(=O)(OH)$_2$, —R$_{28}$—O—P(=O)(O$^-$Z$^+$)$_2$ or —R$_{28}$—O—P(=O)(OH)(O$^-$Z$^+$), $R_{28}$ is $C_1$-$C_8$alkylene, which is unsubstituted or substituted by CO—OH;

$Z^+$ is N(R$_{14}$)$_4^+$, Li$^+$, Na$^+$ or K$^+$ or is the cationic group

which is part of a compound of formula (I) as part of group A; or the compound of formula (I) is dimeric and one of $R_6$, $R_7$, $R_{10}$, $R_{29}$ is $R_{36}$, or $R_{18}$ is

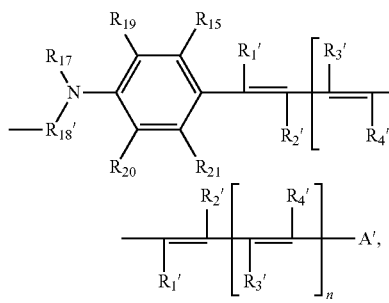

or $R_{20}$ is

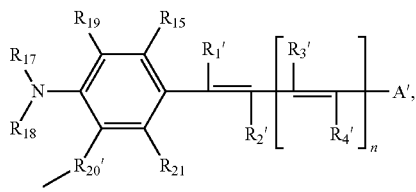

or $R_{21}$ is

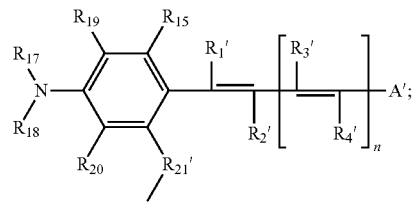

A' is as defined for A; D' is as defined for D; $R_1$' is as defined for $R_1$; $R_2$' is as defined for $R_2$; $R_3$' is as defined for $R_3$; $R_4$' is as defined for $R_4$;

$R_{18}$' is $R_{37}$;

$R_{20}$' and $R_{21}$' are $R_{37}$, O—$R_{37}$—O, S—$R_{37}$—S, $NR_{14}$—$R_{37}$—$NR_{14}$', O—CO—$R_{37}$—CO—O, $NR_{14}$—CO—$R_{37}$—CO—$NR_{14}$' or S—CO—$R_{37}$—CO—S;

$R_{36}$ is as defined for $R_{37}$, whereby the alkylene, arylene and alkylene-arylene-alkylene can be further substituted by G;

$R_{37}$ is $C_1$-$C_{20}$alkylene, $C_6$-$C_{10}$arylene or $C_1$alkylene-$C_6$arylene-$C_1$alkylene, whereby the alkylene is uninterrupted or interrupted by O, S, $NR_{14}$ or combinations thereof (e.g. the alkylene is uninterrupted), and whereby the alkylene, arylene and alkylene-arylene-alkylene are unsubstituted or substituted by fluorine, and whereby the arylene can be further substituted by $C_1$-$C_8$alkyl, fluorinated $C_1$-$C_8$alkyl or combinations thereof; and the remainder of the substituents are as defined above.

For instance, A is a group of formula (V)-(VII'), preferably (V')

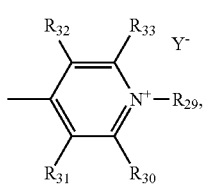

(V')

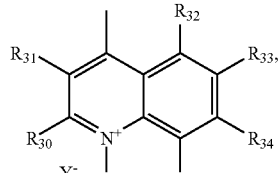

(VI')

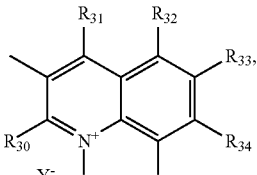

(VI'')

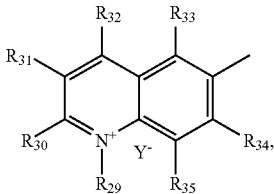

(VII'')

$Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of, $C_1$-$C_{20}$alkyl-S(=O)$_2$O$^-$, $C_6$-$C_{20}$aryl-S(=O)$_2$O$^-$, $C_1$-$C_{20}$alkyl-O—S(=O)$_2$O$^-$, $C_6$-$C_{20}$aryl-O—S(=O)$_2$O$^-$, $C_1$-$C_{20}$alkyl-P(=O)$_2$O$^-$, $C_6$-$C_{20}$aryl-P(=O)$_2$O$^-$, $C_1$-$C_{20}$alkyl-O—P(=O)$_2$O$^-$ and $C_6$-$C_{20}$aryl-O—P(=O)$_2$O$^-$, whereby the aryl is unsubstituted or substituted by 1 to 4 $C_1$-$C_{20}$alkyl, or $Y^-$ is an anionic group which is part of a compound of formula (I) and is selected from the group consisting of COO$^-$, S(=O)$_2$O$^-$, O—S(=O)$_2$O$^-$, P(=O)(O$^-$)(O$^-$Z$^+$), P(=O)(OH)(O$^-$), O—P(=O)(O$^-$)(O$^-$Z$^+$) and O—P(=O)(OH)(O$^-$);

$R_{29}$ is G or $C_1$-$C_8$alkyl, whereby the alkyl is unsubstituted or substituted by pyridinium*$Y^-$ or quinolinium*$Y^-$, whereby the pyridinium and quinolinium are substituted by G;

$R_{30}$, $R_{31}$, $R_{32}$, $R_{33}$, $R_{34}$ and $R_{35}$ are independently H, pyridinium*$Y^-$ or quinolinium*$Y^-$, whereby the pyridinium and quinolinium are substituted by G;

n is 0 or 1;

$R_1$, $R_2$, $R_3$ and $R_4$ are independently H, —S(=O)$_2$OR$_7$, —S(=O)$_2$OR$_7$, —S(=O)$_2$R$_7$, —S(=O)$_2$R$_7$, fluorinated $C_1$-$C_4$alkyl, a group of formula (II), $C_1$-$C_8$alkyl or $C_6$aryl; or $R_1$ and $R_{15}$ form together ethylene, trimethylene, methylene-O,O-methylene, ethylene-O,O-ethylene, methylene-$NR_{14}$, $NR_{14}$-methylene, ethylene-$NR_{14}$ or $NR_{14}$-ethylene, thus forming an aliphatic 5- or 6-membered ring;

with the proviso that at least one of $R_1$-$R_4$ is fluorinated $C_1$-$C_4$alkyl or that $R_2$ or $R_4$ or both are —S(=O)$_2$OR$_7$, —S(=O)$_2$R$_7$, —S(=O)R$_7$, —S(=O)OR$_7$ or a group of formula (II);

$R_6$ is O;

$R_6$ is $NR_7R_{10}$, OR$_7$, SR$_7$, $NR_7$—$NR_{10}R_{11}$, $NR_7$—$R_{10}$;

$R_7$, $R_{10}$ and $R_{11}$ are independently H, $C_1$-$C_8$alkyl, $C_6$aryl or $C_7$-$C_{10}$aralkyl, and whereby the alkyl, aryl and aralkyl are unsubstituted or substituted by halogen, S—$R_{14}$, O—$R_{14}$, CO—OR$_{14}$, O—CO—$R_{14}$, $NR_{14}R_{14}$', CONR$_{14}R_{14}$' or $NR_{14}$—CO—$R_{14}$', and the aryl can be further substituted by $C_1$-$C_{10}$alkyl or fluorinated $C_1$-$C_8$alkyl or combinations thereof;

or $R_7$ being part of $R_2$ forms together with $R_1$ a direct bond or methylene thus forming an aliphatic 5- or 6-membered ring;
or if $R_7$ is part of $R_2$, it can form together with $R_{15}$ a direct bond thus forming an aliphatic 6-membered ring;
or if $R_7$ or $R_{10}$ is part of $R_2$ with n being 0, it can form together with a substituent of A ortho to the

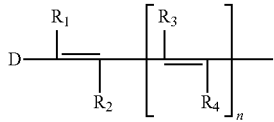

group a direct bond or methylene thus forming an aliphatic 5- or 6-membered ring;
$R_{14}$, $R_{14}'$ are independently H, $C_1$-$C_8$alkyl, $C_6$aryl or $C_7$-$C_{10}$aralkyl;
D is a group of formula (III);
$R_{17}$ and $R_{18}$ are independently $C_1$-$C_8$alkyl, $C_2$-$C_8$alkenyl, $C_6$-$C_{20}$aryl, $C_4$-$C_{16}$heteroaryl, $C_7$-$C_{20}$aralkyl, $C_8$-$C_{20}$aralkenyl, $C_8$-$C_{10}$aralkynyl or $C_6$-$C_{12}$cycloalkyl, whereby the alkyl, alkenyl, aryl, heteroaryl, aralkyl, aralkenyl, aralkynyl and cycloalkyl, are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the aryl and heteroaryl can be further substituted by $C_1$-$C_8$alkyl, $C_2$-$C_8$alkenyl or $C_8$-$C_{20}$aralkenyl;
or $R_{17}$ and $R_{20}$ form together with the N-atom $R_{17}$ and $R_{18}$ are attached to

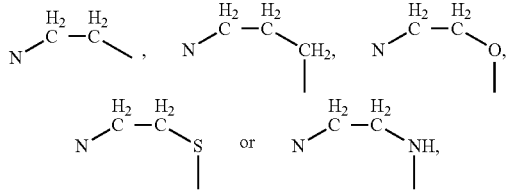

whereby in each of said groups one or more H-atom can be replaced by $C_1$-$C_{20}$alkyl, $C_6$-$C_{20}$aryl or combinations thereof, in each of said groups two geminal H-atom can be replaced by $C_1$-$C_{20}$alkylidene, and/or in each of said groups two vicinal H-atoms can be replaced by trimethylene or tetramethylene;
$R_{15}$ is H, $NR_{25}R_{26}$, $OR_{25}$, $SR_{25}$, O—CO—$R_{25}$ or $NR_{25}$—CO—$R_{26}$;
$R_{19}$, $R_{20}$ and $R_{21}$ are H;
$R_{25}$ and $R_{26}$ are independently H, $C_1$-$C_{14}$alkyl, $C_o$aryl or $C_7$-$C_{10}$aralkyl, whereby the alkyl, aryl and aralkyl are unsubstituted or substituted by pyridinium*$Y^-$, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the pyridinium and aryl can be further substituted by $C_1$-$C_8$alkyl;
with the proviso that at least one of $R_{29}$-$R_{35}$ comprises a group G;
wherein G is —$R_{28}$—COOH, —$R_{28}$—COO$^-Z^+$, —$R_{28}$—S($=$O)$_2$OH, —$R_{28}$—S($=$O)$_2$O$^-Z^+$, —$R_{28}$—O—S($=$O)$_2$OH, —$R_{28}$—O—S($=$O)$_2$O$^-Z^+$, —$R_{28}$—P($=$O)(OH)$_2$, —$R_{28}$—P($=$O)(O$^-Z^+$)$_2$, —$R_{28}$—P($=$O)(OH)(O$^-Z^+$), —$R_{28}$—O—P($=$O)(OH)$_2$, —$R_{28}$—O—P($=$O)(O$^-Z^+$)$_2$ or —$R_{28}$—O—P($=$O)(OH)(O$^-Z^+$),
$R_{28}$ is $C_1$-$C_8$alkylene;
$Z^+$ is $N(R_{14})_4^+$, $Li^+$, $Na^+$ or $K^+$ or is the cationic group

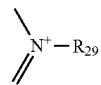

which is part of a compound of formula (I) as part of group A;
or the compound of formula (I) is dimeric and one of $R_6$, $R_7$, $R_{10}$, $R_{29}$ is $R_{36}$, or $R_{18}$ is

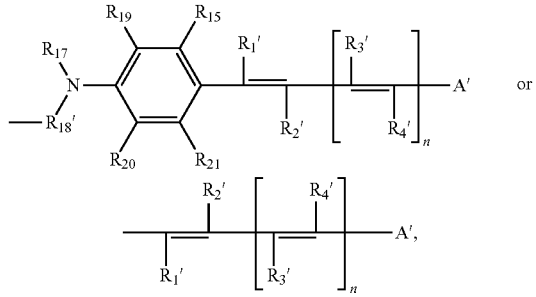

or $R_{20}$ is

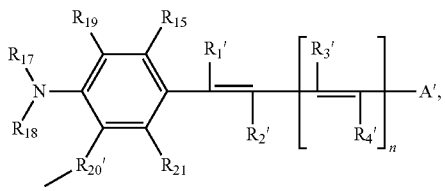

or $R_{21}$ is

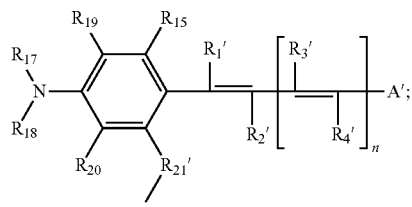

A' is as defined for A; D' is as defined for D; $R_1'$ is as defined for $R_1$; $R_2'$ is as defined for $R_2$; $R_3'$ is as defined for $R_3$; $R_4'$ is as defined for $R_4$;
$R_{18}'$ is $R_{37}$;
$R_{20}'$ and $R_{21}'$ are $R_{37}$, O—$R_{37}$—O, S—$R_{37}$—S, $NR_{14}$—$R_{37}$—$NR_{14}'$, O—CO—$R_{37}$—CO—O, $NR_{14}$—CO—$R_{37}$—CO—$NR_{14}'$ or S—CO—$R_{37}$—CO—S;
$R_{36}$ is as defined for $R_{37}$, whereby the alkylene, arylene and alkylene-arylene-alkylene can be further substituted by G;
$R_{37}$ is $C_1$-$C_{20}$alkylene, $C_6$-$C_{10}$arylene or $C_1$alkylene-$C_6$arylene-$C_1$alkylene, whereby the alkylene is uninterrupted or interrupted by O, S, $NR_{14}$ or combinations thereof (e.g. the alkylene is uninterrupted), and whereby the alkylene, arylene and alkylene-arylene-alkylene are unsubstituted or substituted by fluorine, and whereby the arylene can be further substituted by $C_1$-$C_8$alkyl, fluorinated $C_1$-$C_8$alkyl or combinations thereof; and the remainder of the substituents are as defined above.

For example, A is a group of formula (V');
Y⁻ is Cl⁻, Br⁻, I⁻ or $C_6$aryl-S(=O)$_2$O⁻, whereby the aryl is substituted by 1 $C_1$-$C_{14}$alkyl,
$R_{29}$ is G;
$R_{30}$, $R_{31}$, $R_{32}$ and $R_{33}$ are H;
n is 0 or 1;
$R_1$ is H;
if n is 1, when $R_1$ can additionally be D;
if n is 0, when $R_2$ a group of formula (II);
    if n is 1, $R_2$ is H or $R_2$ and $R_{15}$ form together —O—, preferably $R_2$ is H;
$R_3$ is H;
$R_4$ is a group of formula (II),
with the proviso that either $R_2$ or $R_4$ is a group of formula (II);
$R_6$ is O;
$R_6$ is NR$_7$R$_{10}$, NHR$_7$, OR$_7$ or N($C_1$-$C_8$alkyl)-O($C_1$-$C_8$alkyl);
$R_7$ and $R_{10}$ are independently $C_1$-$C_{14}$alkyl, fluorinated $C_1$-$C_4$alkyl, benzyl, $C_3$-$C_{14}$heteroaryl or $C_6$-$C_{20}$aryl, whereby the alkyl can be substituted by N—($C_1$-$C_9$alkyl)$_2$, the heteroaryl can be substituted by CO—O—$C_1$-$C_8$alkyl or $C_1$-$C_8$alkyl, the benzyl and aryl can be substituted by fluorine, $C_1$-$C_9$alkyl, fluorinated $C_1$-$C_4$alkyl, O—$C_1$-$C_8$alkyl or N—($C_1$-$C_8$alkyl)$_2$ or the aryl can be substituted by chlorine, CO—$C_1$-$C_8$alkyl, —CN, fluorinated $C_1$-$C_4$alkyl or fluorinated O—$C_1$-$C_4$alkyl;
D is a group of formula (III);
$R_{17}$ is $C_1$-$C_8$alkyl;
or $R_{17}$ and $R_{20}$ form together with the N-atom $R_{17}$ and $R_{18}$ are attached to

[chemical structures]

$R_{18}$ is $C_1$-$C_8$alkyl, $C_8$-$C_{20}$aralkenyl, $C_6$-$C_{24}$ heteroaryl or $C_6$-$C_{20}$aryl, whereby the aryl can be substituted by fluorine, $C_1$-$C_8$alkyl, S—$C_1$-$C_8$alkyl, O—$C_1$-$C_{14}$alkyl, CO—O—$C_1$-$C_8$alkyl, O-phenyl, N-(phenyl)$_2$ or $C_8$-$C_{20}$aralkenyl, and whereby the heteroaryl can be substituted by $C_1$-$C_8$alkyl, O—$C_1$-$C_8$alkyl or $C_8$-$C_{20}$aralkenyl;

$R_{15}$ is H, OR$_{25}$ or O—CO—R$_{25}$;
$R_{19}$, $R_{20}$ and $R_{21}$ are H;
$R_{25}$ is $C_1$-$C_{14}$alkyl or $C_7$-$C_{10}$aralkyl, whereby the alkyl can be substituted by pyridinium*Y⁻, and the pyridinium is substituted by $C_1$-$C_8$alkyl;
with the proviso that $R_{29}$ comprises a group G;
G is —R$_{28}$—COOH;
$R_{28}$ is $C_1$-$C_3$alkylene which is unsubstituted or substituted by CO—OH, preferably $R_{28}$ is $C_1$alkylene;
or the compound of formula (I) is dimeric, n is 0, and either $R_7$ is $C_6$arylene or $R_{21}$ is

[chemical structure]

A' is

[chemical structures]

$R_1'$ is H;
$R_2'$ is H or a group of formula (II);
$R_{21}'$ is O—$C_1$-$C_8$alkylene-O;
and the remainder of the substituents are as defined above.
    For instance, A is a group of formula (V');
Y⁻ is Cl⁻, Br⁻; I⁻,
$R_{29}$ is G;
$R_{30}$, $R_{31}$, $R_{32}$ and $R_{33}$ are H;
n is 0 or 1;
$R_1$ is H;
if n is 0, when $R_2$ a group of formula (II);
if n is 1, $R_2$ is H;
$R_3$ is H;
$R_4$ is a group of formula (II),
with the proviso that either $R_2$ or $R_4$ is a group of formula (II);
$R_6$ is O;
$R_6$ is NR$_7$R$_{10}$, NHR$_7$, OR$_7$ or N($C_1$-$C_8$alkyl)-O($C_1$-$C_8$alkyl);
$R_7$ and $R_{10}$ are independently $C_1$-$C_{14}$alkyl, fluorinated $C_1$-$C_4$alkyl, benzyl or $C_6$aryl, whereby the benzyl and aryl can be substituted by fluorine, $C_1$-$C_8$alkyl, fluorinated $C_1$-$C_4$alkyl, O—$C_1$-$C_8$alkyl or N—($C_1$-$C_8$alkyl)$_2$;
D is a group of formula (III);
$R_{17}$ is $C_1$-$C_8$alkyl;
or $R_{17}$ and $R_{20}$ form together with the N-atom $R_{17}$ and $R_{18}$ are attached to

[chemical structures]

-continued

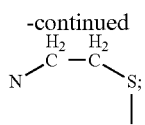

$R_{18}$ is $C_1$-$C_8$alkyl, $C_8$-$C_{20}$aralkenyl, $C_6$-$C_{14}$ heteroaryl or $C_6$-$C_{20}$aryl, whereby the aryl can be substituted by fluorine, S—$C_1$-$C_8$alkyl, O—$C_1$-$C_8$alkyl, O-phenyl or $C_8$-$C_{20}$aralkenyl, and whereby the heteroaryl is substituted by $C_1$-$C_8$alkyl;
$R_{15}$ is H, $OR_{25}$ or O—CO—$R_{25}$;
$R_{19}$, $R_{20}$ and $R_{21}$ are H;
$R_{25}$ is $C_1$-$C_{14}$alkyl or $C_7$-$C_{10}$aralkyl, whereby the alkyl can be substituted by pyridinium*$Y^-$, and the pyridinium is substituted by $C_1$-$C_8$alkyl;
with the proviso that $R_{29}$ comprises a group G;
G is —$R_{28}$—COOH;
$R_{28}$ is $C_1$-$C_3$alkylene, preferably $C_1$alkylene;
or the compound of formula (I) is dimeric, n is 0, and either $R_7$ is $C_6$arylene or $R_{21}$ is

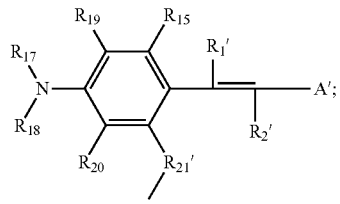

A' is

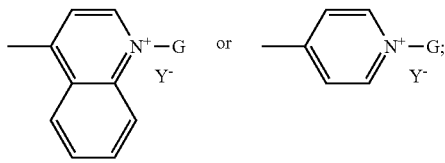

$R_1'$ is H;
$R_2'$ is H or a group of formula (II);
$R_{21}'$ is O—$C_1$-$C_8$alkylene-O;
and the remainder of the substituents are as defined above.
For example, A is a group of formula (V');
$Y^-$ is $Cl^-$, $Br^-$, $I^-$ or $C_6$aryl-S(=O)$_2$O$^-$, whereby the aryl is substituted by 1 $C_1$-$C_{14}$alkyl,
$R_{29}$ is G;
$R_{30}$, $R_{31}$, $R_{32}$ and $R_{33}$ are H;
n is 0 or 1;
$R_1$ is H;
if n is 1, when $R_1$ can additionally be D;
if n is 0, when $R_2$ a group of formula (II);
if n is 1, $R_2$ is H or $R_2$ and $R_{15}$ form together —O—, preferably $R_2$ is H;
$R_3$ is H;
$R_4$ is a group of formula (II),
with the proviso that either $R_2$ or $R_4$ is a group of formula (II);
$R_6$ is O;
$R_6$ is $NR_7R_{10}$, $NHR_7$, $OC_1$-$C_{14}$alkyl (e.g. $OC_1$-$C_8$alkyl) or $N(C_1$-$C_8$alkyl)-$O(C_1$-$C_8$alkyl), preferably $NHR_7$ or $OC_1$-$C_{14}$alkyl, most preferably $NHR_7$;
$R_7$ and $R_{10}$ are independently $C_1$-$C_{14}$alkyl, benzyl, $C_3$-$C_{14}$heteroaryl or $C_6$-$C_{20}$aryl, whereby the alkyl can be substituted by N—($C_1$-$C_8$alkyl)$_2$, the heteroaryl can be substituted by CO—O—$C_1$-$C_8$alkyl or $C_1$-$C_8$alkyl, and the aryl can be substituted by $C_1$-$C_8$alkyl, O—$C_1$-$C_8$alkyl, fluorinated $C_1$-$C_4$alkyl, fluorine, chlorine, CO—$C_1$-$C_8$alkyl, —CN, fluorinated $C_1$-$C_4$alkyl or fluorinated O—$C_1$-$C_4$alkyl;
D is a group of formula (III);
$R_{17}$ is $C_1$-$C_8$alkyl;
or $R_{17}$ and $R_{20}$ form together with the N-atom $R_{17}$ and $R_{18}$ are attached to

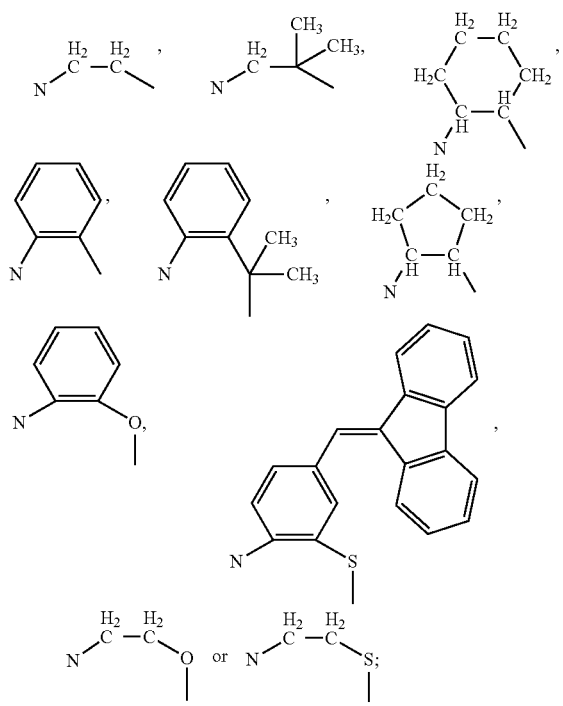

$R_{18}$ is $C_1$-$C_8$alkyl, $C_8$-$C_{20}$aralkenyl, $C_6$-$C_{24}$heteroaryl or $C_6$-$C_{20}$aryl, whereby the alkyl can be substituted by O—$C_1$-$C_{14}$alkyl, the aryl can be substituted by $C_1$-$C_8$alkyl, S—$C_1$-$C_8$alkyl, O—$C_1$-$C_{14}$alkyl, CO—O—$C_1$-$C_8$alkyl, O-phenyl, N-(phenyl)$_2$ or $C_8$-$C_{20}$aralkenyl, and the heteroaryl can be substituted by $C_1$-$C_8$alkyl, O—$C_1$-$C_8$alkyl or $C_8$-$C_{20}$aralkenyl;
$R_{15}$ is H, $OR_{25}$ or O—CO—$R_{25}$;
$R_{19}$, $R_{20}$ and $R_{21}$ are H;
$R_{25}$ is $C_1$-$C_{14}$alkyl or $C_7$-$C_{10}$aralkyl, whereby the alkyl can be substituted by pyridinium*$Y^-$, and the pyridinium is substituted by $C_1$-$C_8$alkyl;
with the proviso that $R_{29}$ comprises a group G;
G is —$R_{28}$—COOH;
$R_{28}$ is $C_1$-$C_3$alkylene which is unsubstituted or substituted by CO—OH, preferably $R_{28}$ is $C_1$alkylene;
or the compound of formula (I) is dimeric, n is 0, and either $R_7$ is $C_0$arylene or $R_{21}$ is

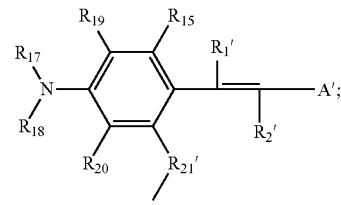

A' is

[chemical structure: 4-methylquinolinium with N+—G, Y−] or [chemical structure: 4-methylpyridinium with N+—G, Y−]

$R_1'$ is H;
$R_2'$ is H or a group of formula (II);
$R_{21}'$ is O—$C_1$-$C_8$alkylene-O;
and the remainder of the substituents are as defined above.
For example, A is a group of formula (V');
$Y^-$ is $Cl^-$, $Br^-$; $I^-$,
$R_{29}$ is G;
$R_{30}$, $R_{31}$, $R_{32}$ and $R_{33}$ are H;
n is 0 or 1;
$R_1$ is H;
if n is 0, when $R_2$ a group of formula (II);
if n is 1, $R_2$ is H;
$R_3$ is H;
$R_4$ is a group of formula (II),
with the proviso that either $R_2$ or $R_4$ is a group of formula (II);
$R_6$ is O;
$R_6$ is $NR_7R_{10}$, $NHR_7$, $OC_1$-$C_{14}$alkyl (e.g. $OC_1$-$C_9$alkyl) or $N(C_1$-$C_9$alkyl)-$O(C_1$-$C_8$alkyl);
$R_7$ and $R_{10}$ are independently $C_1$-$C_{14}$alkyl or $C_6$aryl, whereby the aryl can be substituted by fluorinated $C_1$-$C_4$alkyl;
D is a group of formula (III);
$R_{17}$ is $C_1$-$C_8$alkyl;
or $R_{17}$ and $R_{20}$ form together with the N-atom $R_{17}$ and $R_{18}$ are attached to

[chemical structures: N-CH2-CH2 group, pyrrolidine-like ring, or N-CH2-CH2-O morpholine-like group]

$R_{18}$ is $C_1$-$C_8$alkyl, $C_8$-$C_{20}$aralkenyl, $C_6$-$C_{14}$ heteroaryl or $C_6$-$C_{20}$aryl, whereby the aryl can be substituted by S—$C_1$-$C_8$alkyl, O—$C_1$-$C_8$alkyl, O-phenyl or $C_8$-$C_{20}$aralkenyl, and whereby the heteroaryl is substituted by $C_1$-$C_8$alkyl;
$R_{15}$ is H, $OR_{25}$ or O—CO—$R_{25}$;
$R_{19}$, $R_{20}$ and $R_{21}$ are H;
$R_{25}$ is $C_1$-$C_{14}$alkyl or $C_7$-$C_{10}$aralkyl, whereby the alkyl can be substituted by pyridinium*$Y^-$, and the pyridinium is substituted by $C_1$-$C_8$alkyl;
with the proviso that $R_{29}$ comprises a group G;
G is —$R_{28}$—COOH;
$R_{28}$ is $O_1$-$C_3$alkylene, preferably $C_1$alkylene; or the compound of formula (I) is dimeric, n is 0, and either $R_7$ is $C_o$arylene or $R_{21}$ is

[chemical structure with $R_{17}$, $R_{19}$, $R_{15}$, $R_1'$, $R_{18}$, $R_{20}$, $R_{21}'$, $R_2'$, A']

A' is

[chemical structure: 4-methylquinolinium with N+—G, Y−] or [chemical structure: 4-methylpyridinium with N+—G, Y−]

$R_1'$ is H;
$R_2'$ is H or a group of formula (II);
$R_{21}'$ is O—$C_1$-$C_8$alkylene-O;
and the remainder of the substituents are as defined above.
In compounds of formula (I)

$$D-\overset{R_1}{\underset{R_2}{|}}=\left[\overset{R_3}{\underset{R_4}{|}}\right]_n-A, \quad (I)$$

D is a donor moiety, A is an acceptor moiety and $$*-\overset{R_1}{\underset{R_2}{|}}=\left[\overset{R_3}{\underset{R_4}{|}}\right]_n-*$$

is a spacer moiety. So compounds of formula (I) contain a donor, a spacer and an acceptor.
*indicates a free valence.
Some preferred donors D are:

[chemical structures: 4-(dimethylamino)phenyl, 4-morpholinophenyl, 4-(diphenylamino)phenyl, 4-(N-methyl-N-phenylamino)phenyl]

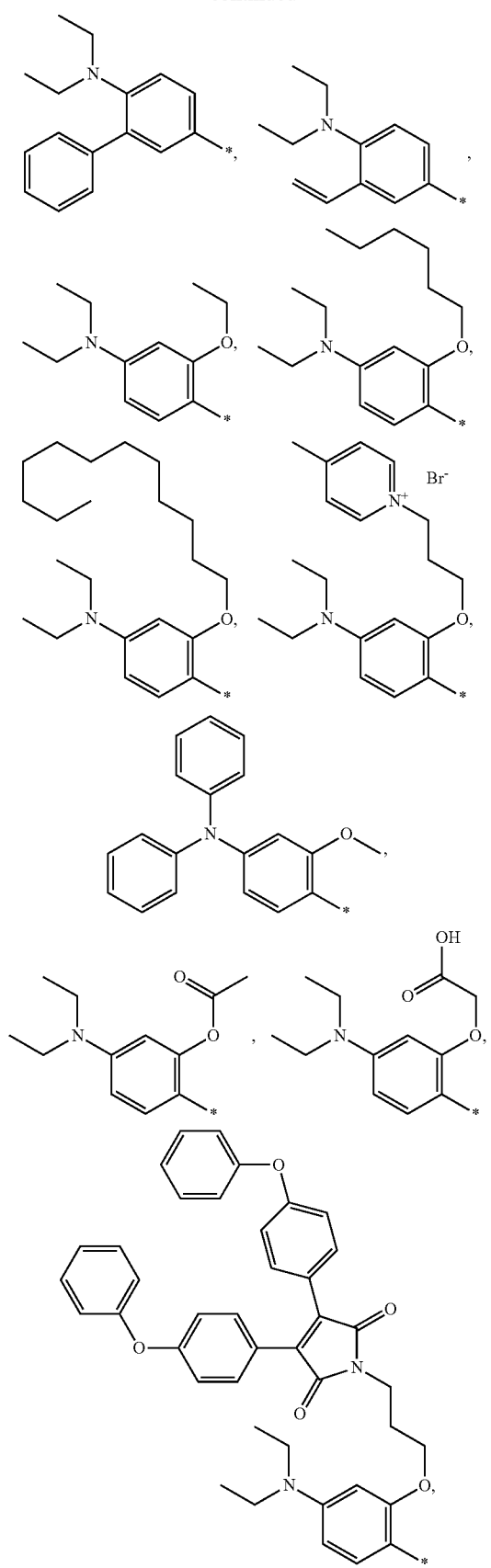
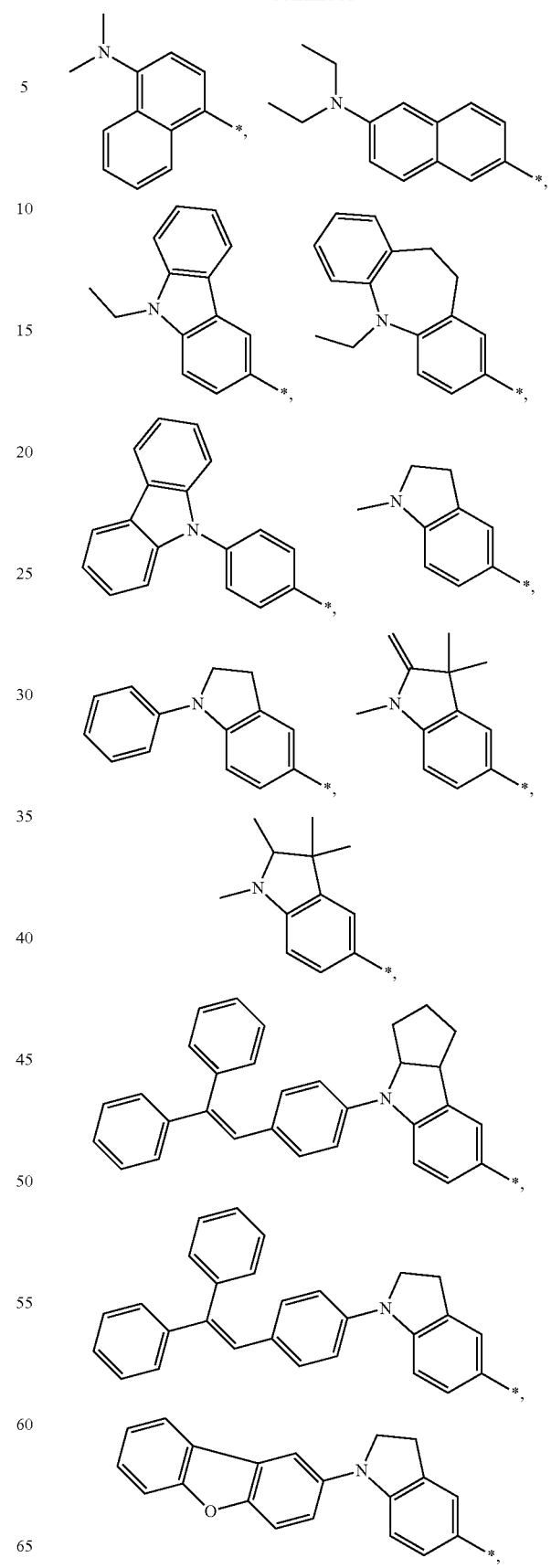

-continued

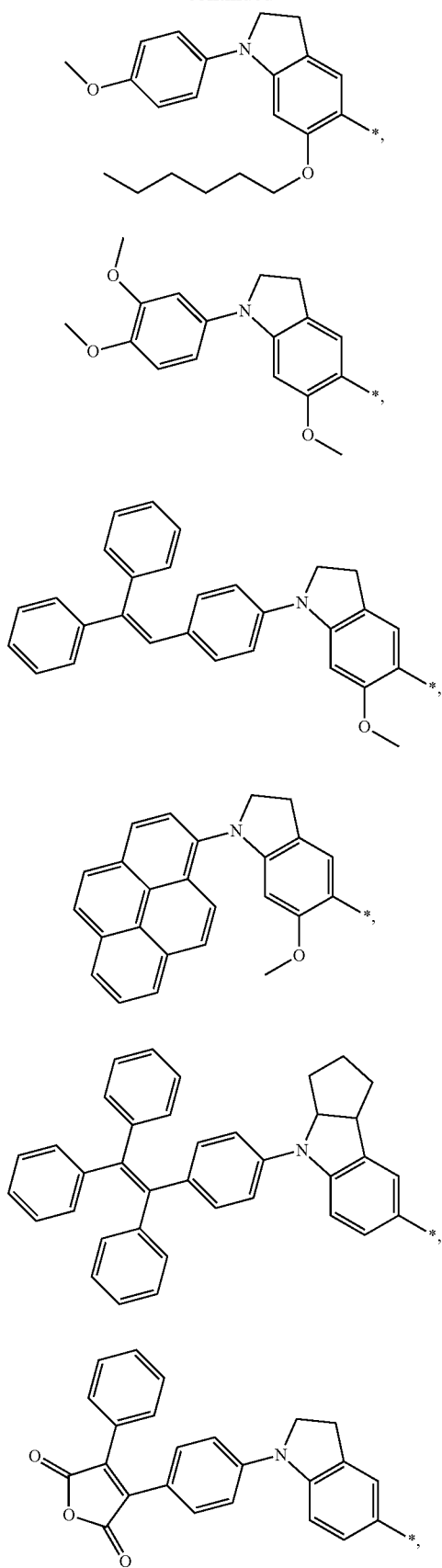
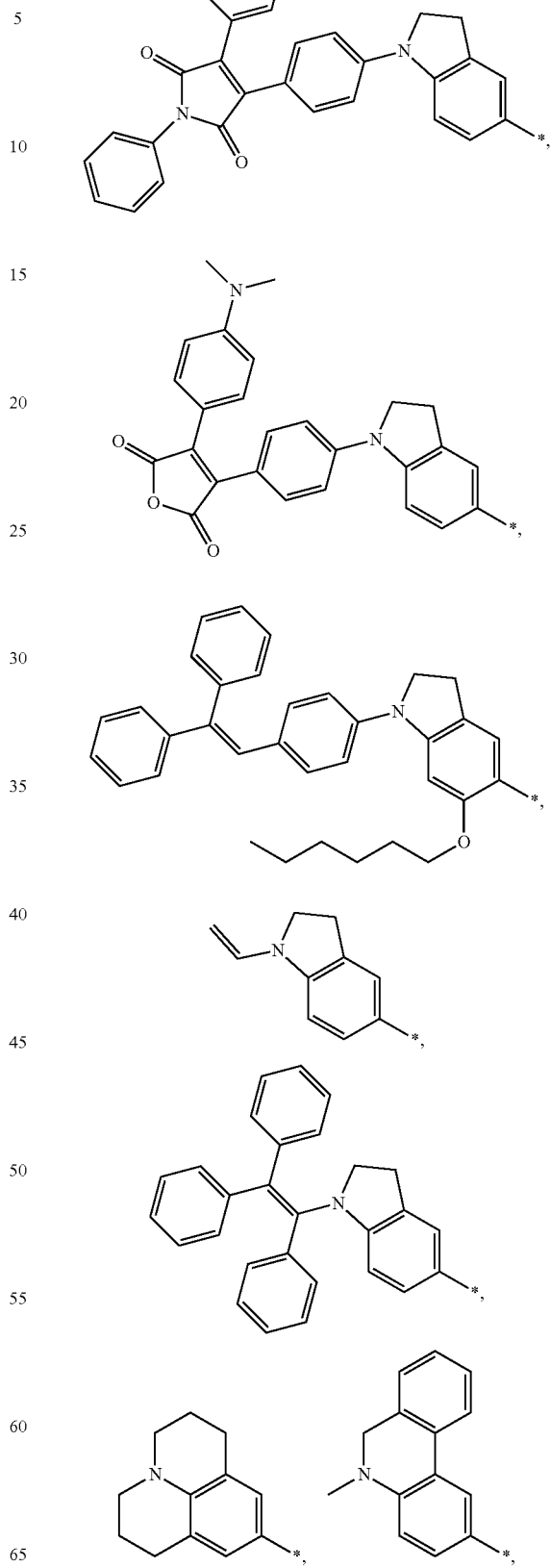

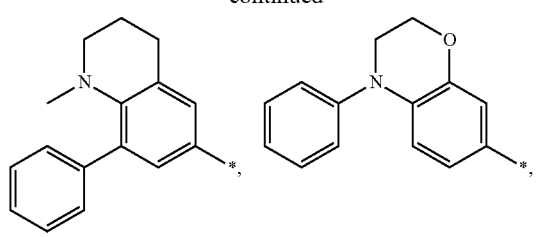
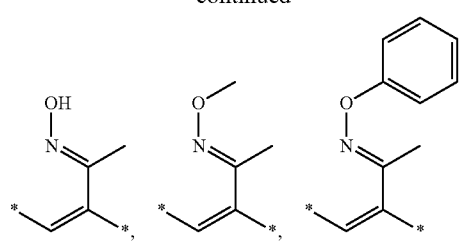
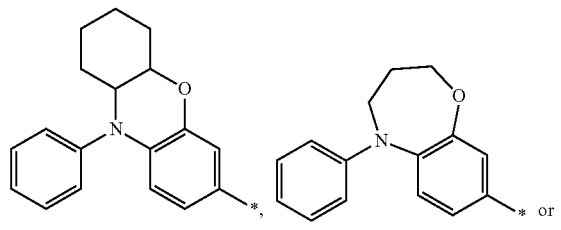
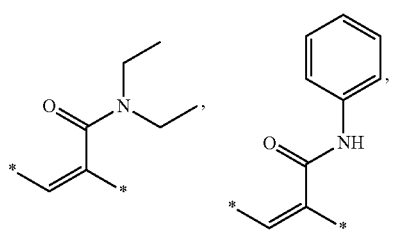
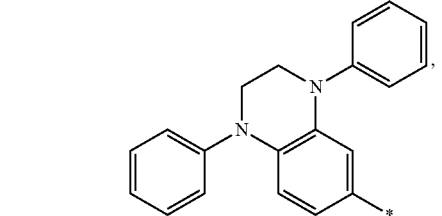
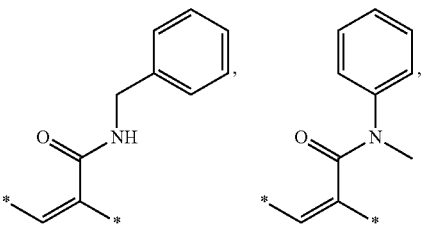
Some preferred dimeric donors D are
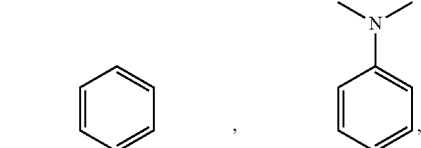
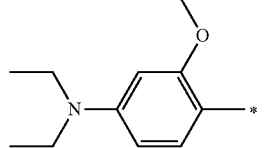
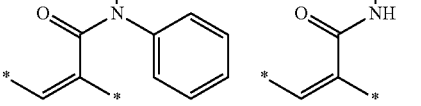
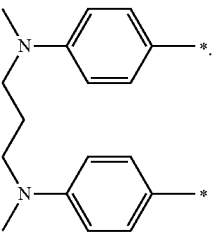 or
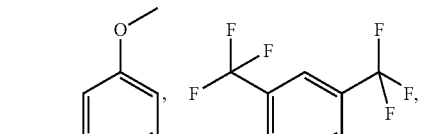
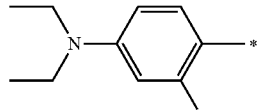.
Some preferred spacers are:
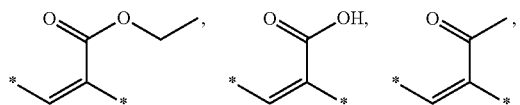
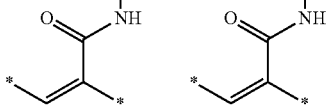

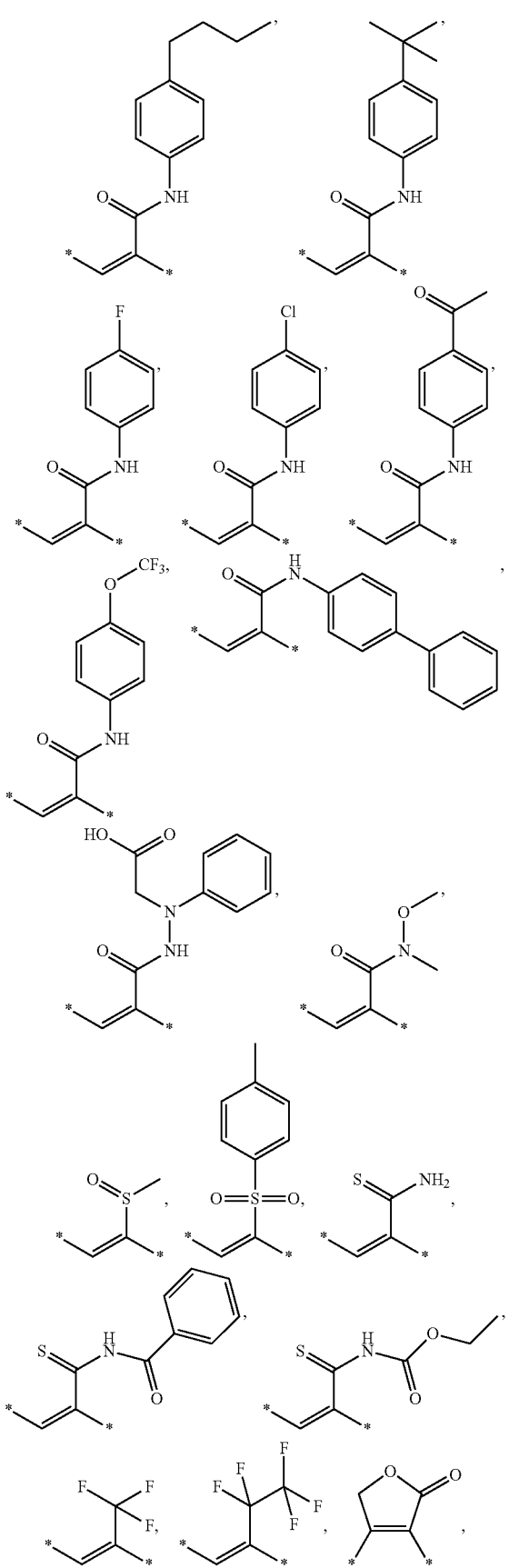
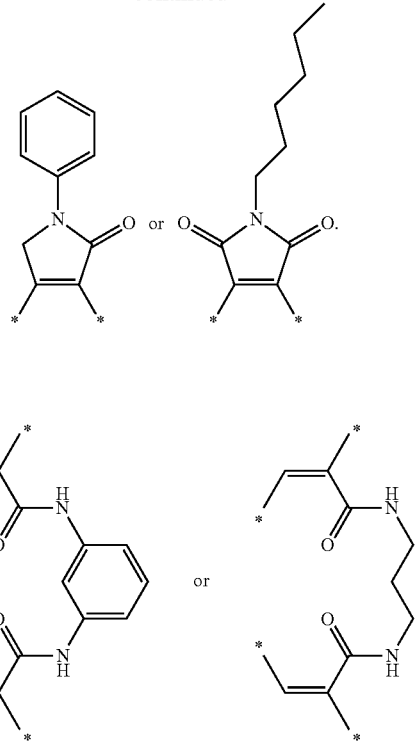
Some preferred dimeric spacers are:
In these spacers, the donor D is attached to the left side of the spacers and the acceptor A is attached to the right side of the spacer.
Some preferred acceptors A are:
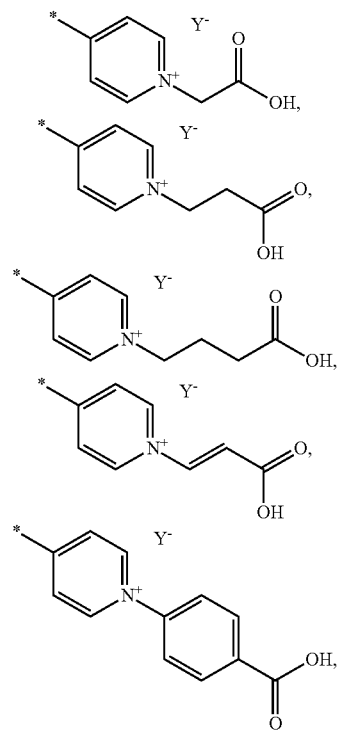

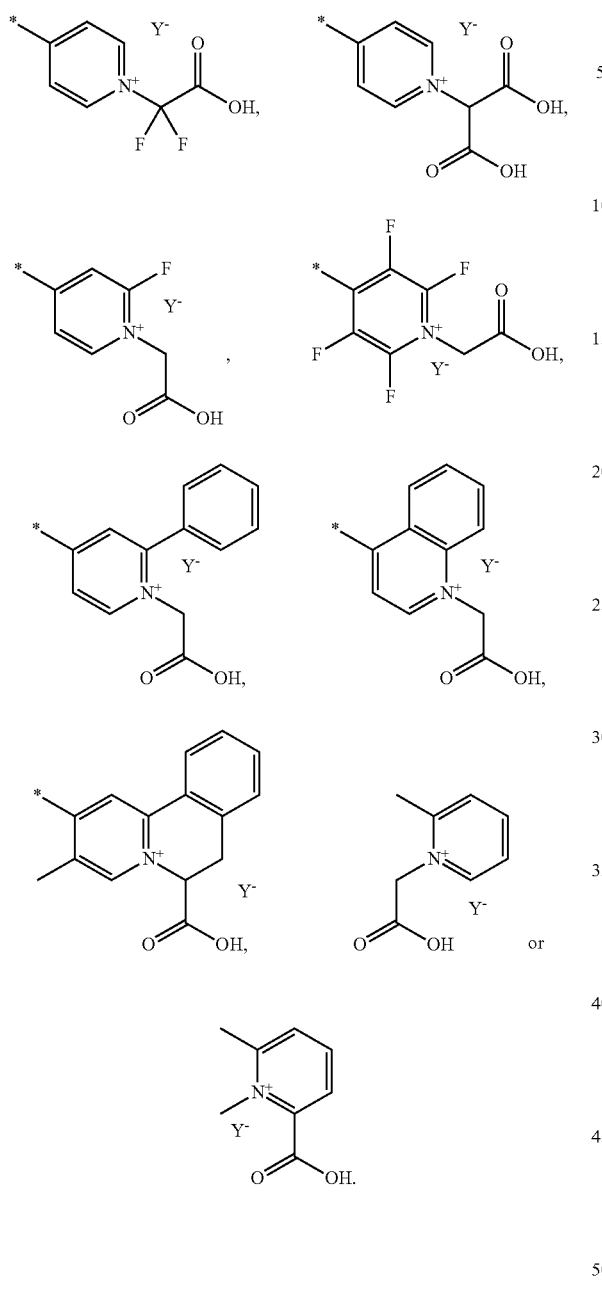
A preferred dimeric acceptor A is
A preferred spacer-acceptor is
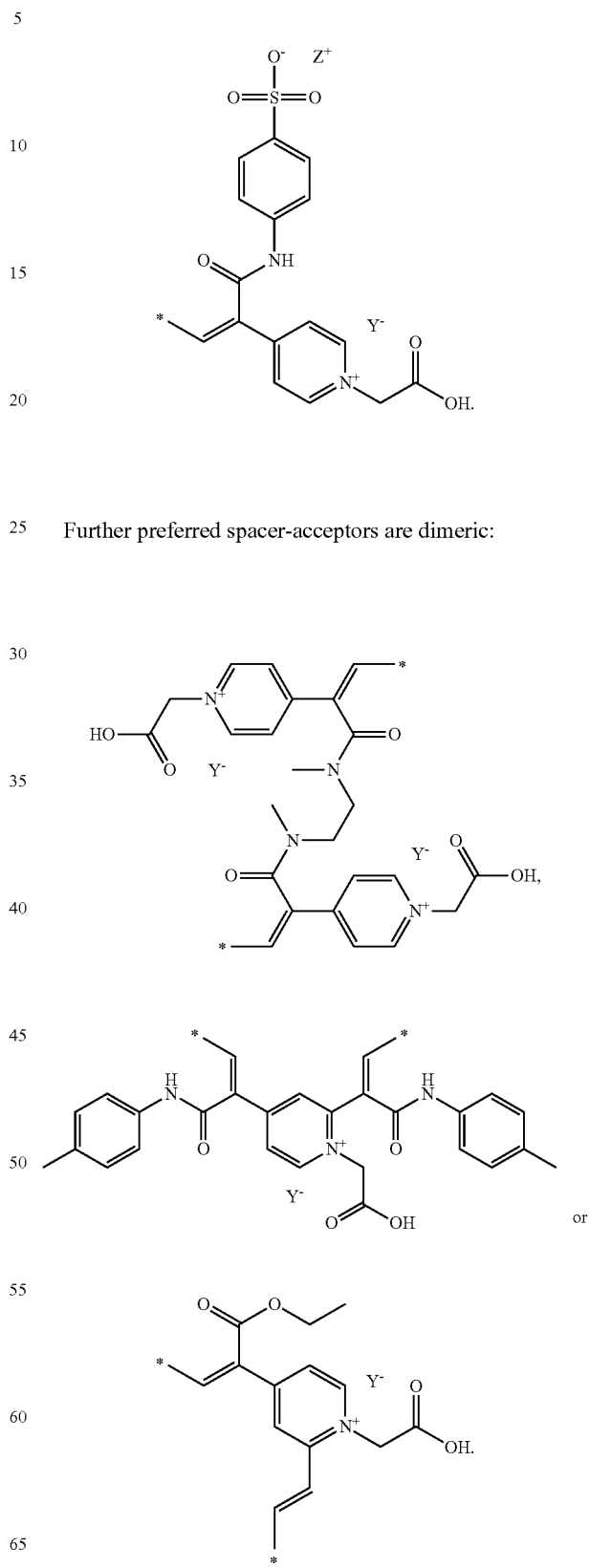
Further preferred spacer-acceptors are dimeric:

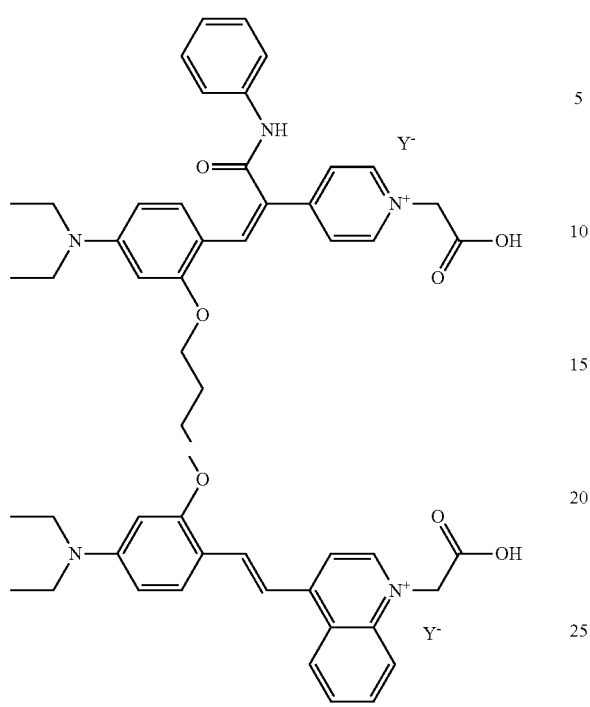
A preferred asymmetric dimer of a compound of formula (I) is:
A preferred donor-spacer is
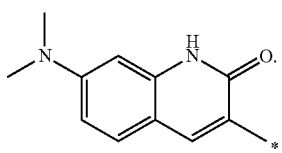
Particularly preferred donors D are:
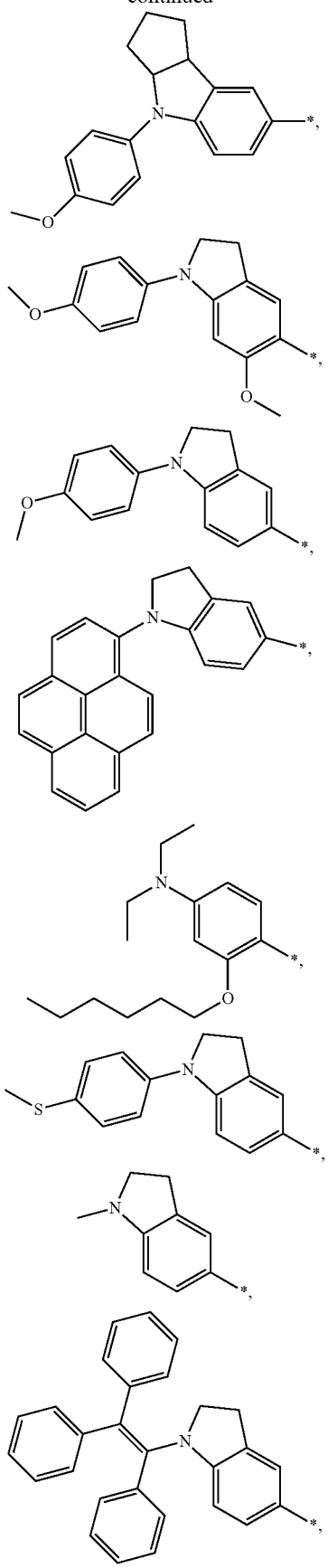

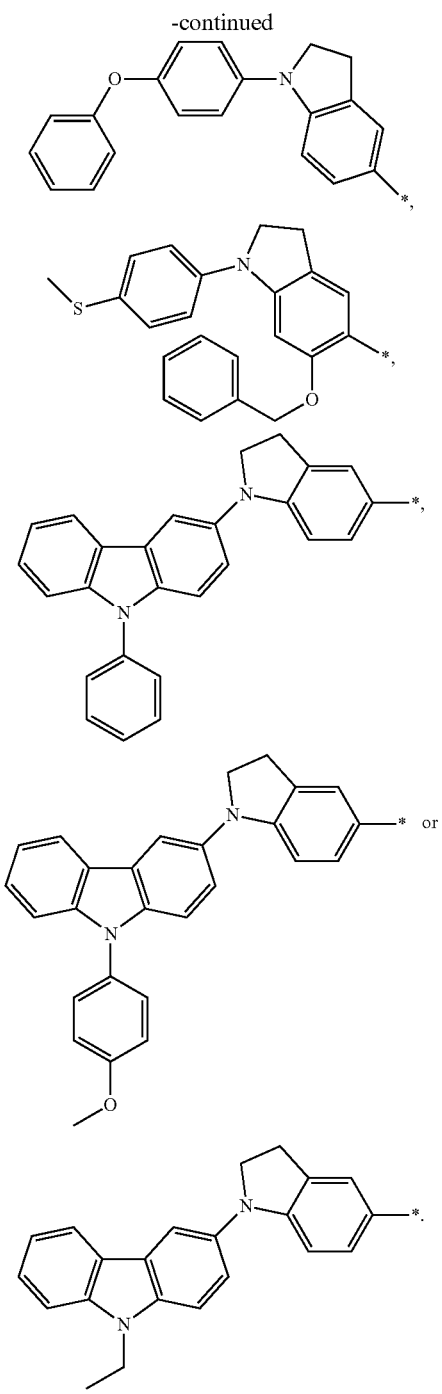
Particularly preferred spacers are
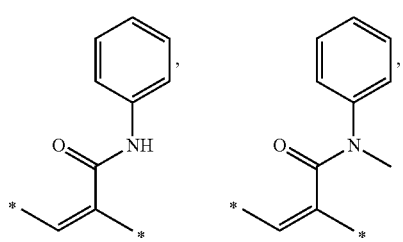
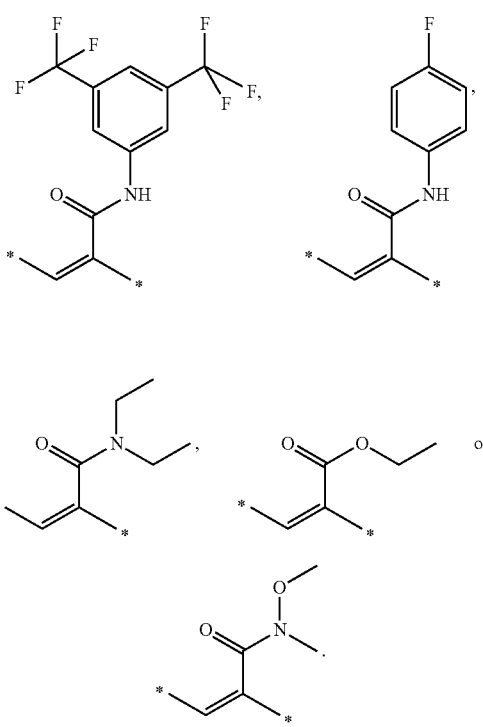
Particularly preferred acceptors A are:
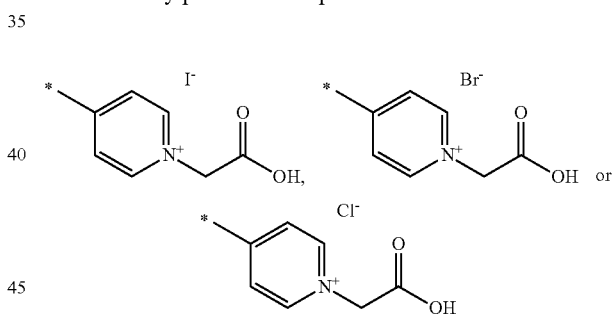
Some preferred compounds of formula (I) are:
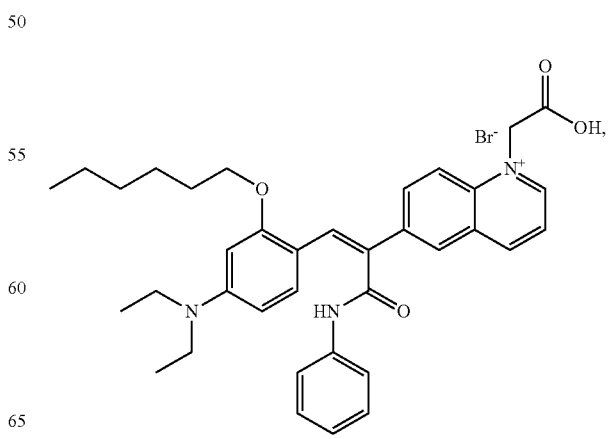

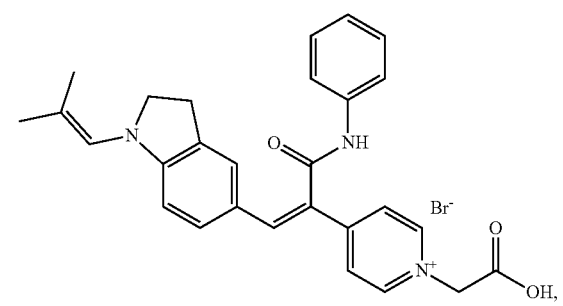
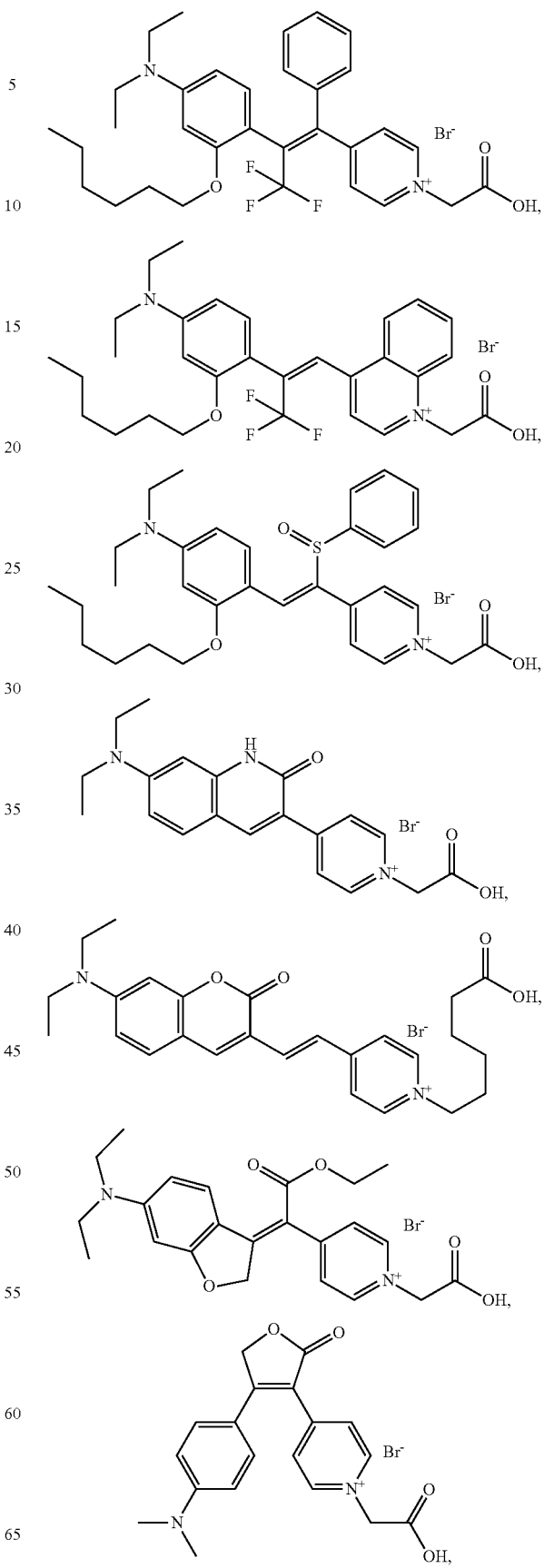

53
-continued
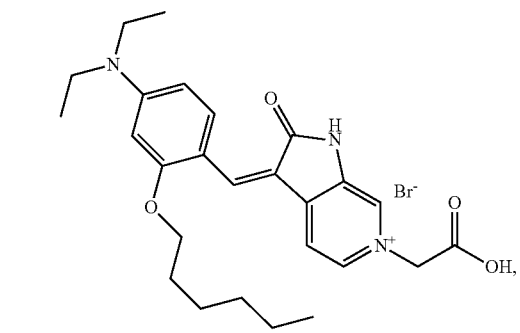
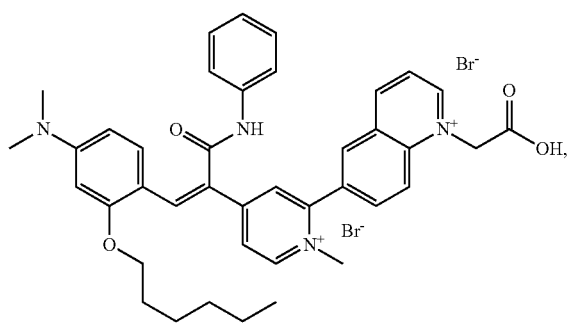
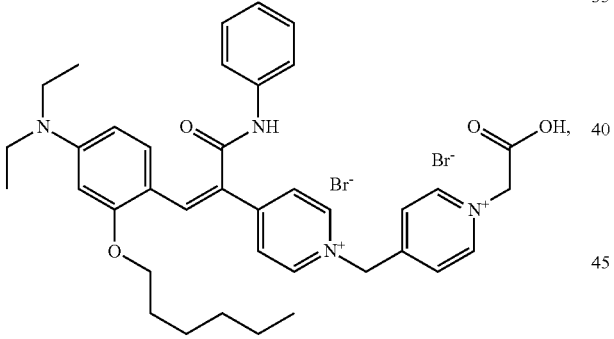
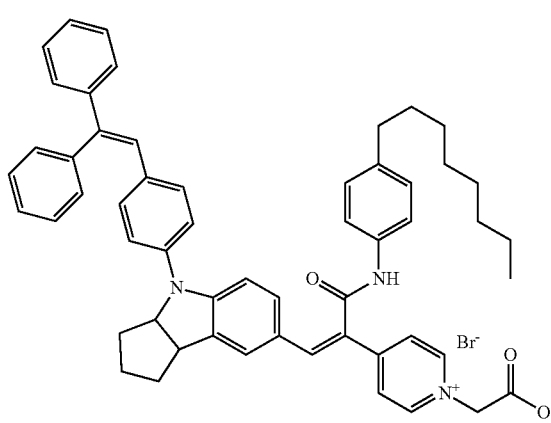
54
-continued
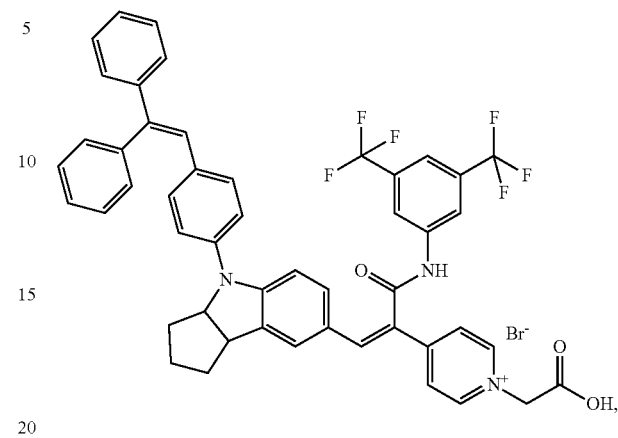
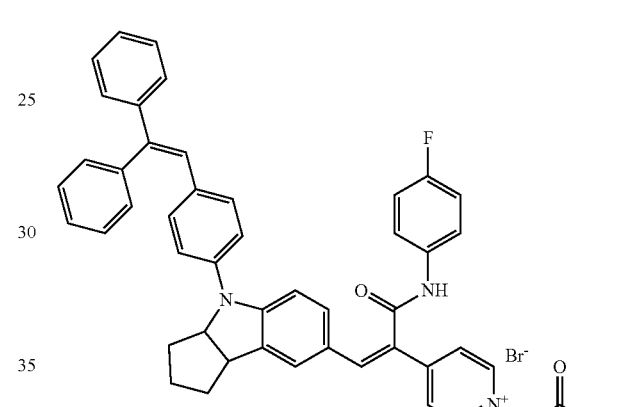
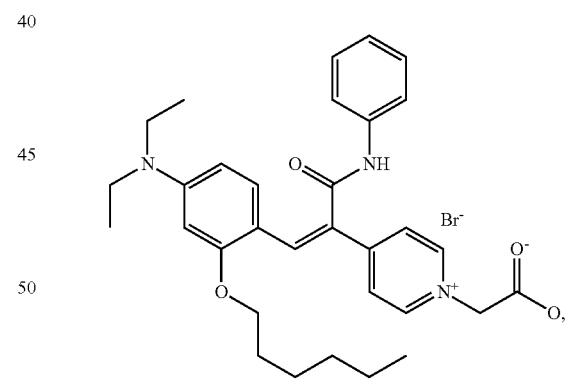
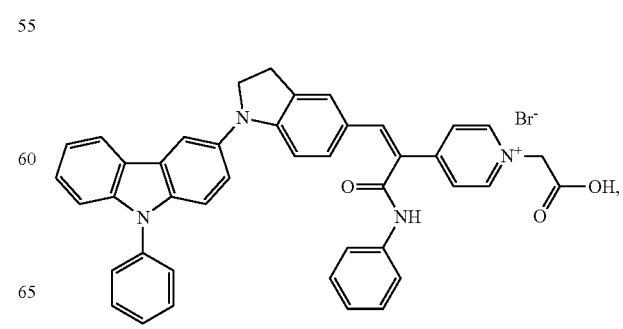

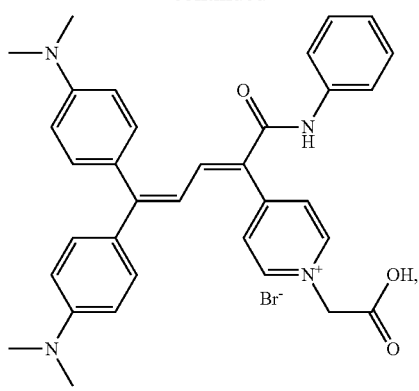
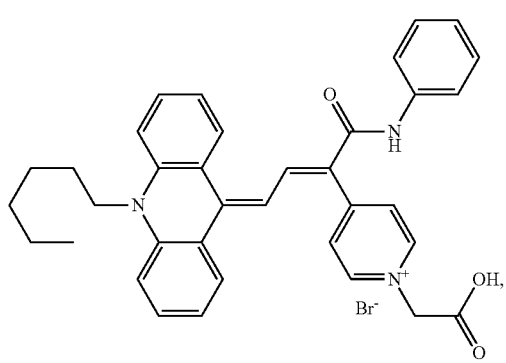
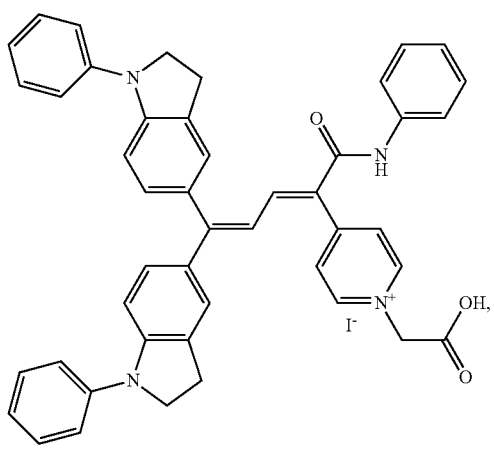
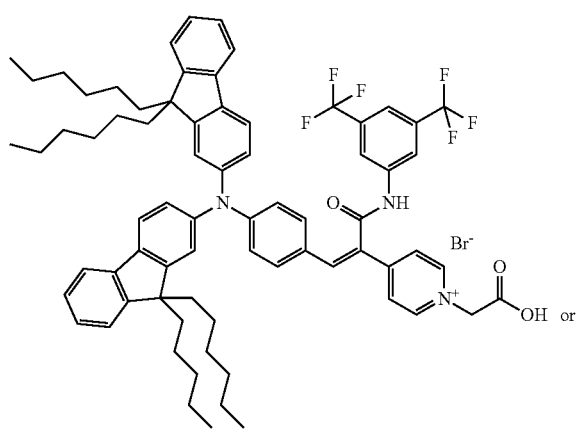

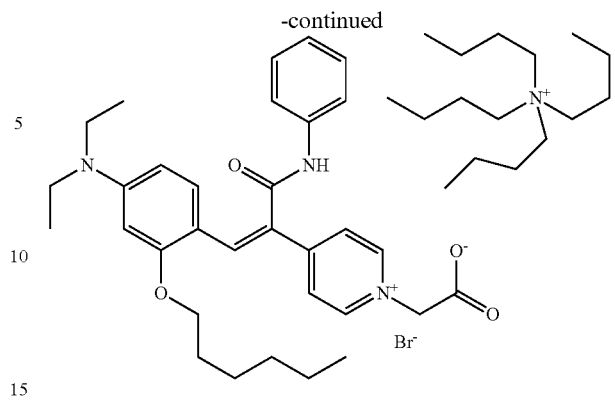

The oxide semiconductor fine particles are, for instance, made of $TiO_2$, $SnO_2$, $WO_3$, ZnO, $Nb_2O_5$, $Fe_2O_3$, $ZrO_2$, MgO, $WO_3$, ZnO, CdS, ZnS, PbS, $Bi_2S_3$, CdSe, CdTe or combinations thereof, preferably made of $TiO_2$.

For instance, the electrode layer comprises a dye of formula (I) or a mixture of dyes of formula (I) as the only dye(s).

Preferred is a porous film made of oxide semiconductor fine particles which is sensitized with a dye of formula (I) and one or more further dyes.

Examples of further dyes are metal complex dyes (preferably the metal is Ru, Pt, Ir, Rh, Re, Os, Fe, W, Cr, Mo, Ni, Co, Mn, Zn or Cu, more preferably Ru, Os or Fe, most preferably Ru) and/or organic dyes selected from the group consisting of indoline, courmarin, cyanine, merocyanine, hemicyanine, methin, azo, quinone, quinonimine, diketo-pyrrolo-pyrrole, quinacridone, squaraine, triphenylmethane, perylene, indigo, xanthene, eosin, rhodamine and combinations thereof. As further dyes organic dyes, in particular methin dye such as dye R-2, are preferred. For instance, the further dye is different from dyes of formula (I).

For instance, the molar ratio of a further dye to a dye of formula (I) is 1:19 to 19:1, preferably 1:9 to 9:1, more preferably 1:5 to 5:1, most preferably 1:3 to 3:1.

For example, the dye is adsorbed together with an additive, preferably a co-adsorbent.

Examples of such additives are co-adsorbents selected from the group consisting of a steroid (preferably deoxycholic acid, dehydrodeoxcholic acid, chenodeoxycholic acid, cholic acid methyl ester, cholic acid sodium salt or combinations thereof), a crown ether, a cyclodextrine, a calixarene, a polyethyleneoxide and combinations thereof, especially a steroid such as chenodeoxycholic acid.

For example, the molar ratio of such an additive to a dye of formula (I) is 1000:1 to 1:100, preferably 100:1 to 1:10, most preferably 10:1 to 1:2.

For example, such an additive is not a dye.

The present invention also pertains to a photoelectric conversion device comprising an electrode layer as defined herein.

Such photoelectric conversion devices usually comprise
(a) a transparent conductive electrode substrate layer,
(b) an electrode layer comprising a porous film made of oxide semiconductor fine particles sensitized with
(c) a dye of formula (I),
(d) a counter electrode layer, and
(e) an electrolyte layer (e.g. filled between the working electrode layer b and the counter electrode layer d).

The component (c) can also be a combination of a dye of formula (I) and one or more further dyes.

Preferably, the transparent conductive electrode substrate layer (a) contains (e.g. consists of)
(a-1) a transparent insulating layer and
(a-2) a transparent conductive layer.

The transparent conductive layer (a-2) is usually between the transparent insulating layer (a-1) and the electrode layer (b).

Examples of the transparent insulating layer (a-1) include glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina.

Examples of transparent conductive layer (a-2) are conductive metal oxides such as ITO (indium-tin compounded oxide), IZO (indium-zinc compounded oxide), FTO (fluorine-doped tin oxide), zinc oxide doped with boron, gallium or aluminum, and niobium-doped titanium oxide. The thickness of the transparent conductive layer (a-2) is usually 0.1 to 5 μm. The surface resistance is usually below 40 ohms/sq, preferably below 20 ohms/sq.

To improve the conductivity of the transparent conductive layer (a-2), it is possible to form a metal wiring layer on it, made of for instance silver, platinum, aluminum, nickel or titanium. The area ratio of the metal wiring layer is generally within the range that does not significantly reduce the light transmittance of the transparent conductive electrode substrate layer (a). When such a metal wiring layer is used, the metal wiring layer may be provided as a grid-like, stripe-like, or comb-like pattern.

The electrode layer (b) is usually between the transparent conductive electrode substrate layer (a) and the electrolyte layer (e).

The porous film of oxide semiconductor fine particles of the electrode layer (b) can be prepared by a hydrothermal process, a sol/gel process or high temperature hydrolysis in gas phase. The fine particles usually have an average particle diameter of from 1 nm to 1000 nm. Particles with different size can be blended and can be used as either single or multi-layered porous film. The porous film of the oxide semiconductor layer (b) has usually a thickness of from 0.5 to 50 μm.

If desired, it is possible to form a blocking layer on the electrode layer (b) (usually between the surface of the electrode layer (b) and the dye (c)) and/or between the electrode layer (b) and the transparent conductive electrode substrate layer (a) to improve the performance of the electrode layer (b). An example of forming a blocking layer is immersing the electrode layer (b) into a solution of metal alkoxides such as titanium ethoxide, titanium isopropoxide and titanium butoxide, chlorides such as titanium chloride, tin chloride and zinc chloride, nitrides and sulfides and then drying or sintering the substrate. For instance, the blocking layer is made of a metal oxide (e.g. $TiO_2$, $SiO_2$, $Al_2O_3$, $ZrO_2$, MgO, $SnO_2$, ZnO, $Eu_2O_3$, and $Nb_2O_5$ or combinations threeof) or a polymer (e.g. poly(phenylene oxide-co-2-allylphenylene oxide) or poly(m-ethylsiloxane)). Details of the preparation of such layers are described in, for example, Electrochimica Acta, 1995, 40, 643; J. Phys. Chem. B, 2003, 107, 14394; J. Am. Chem. Soc., 2003, 125, 475; Chem. Lett, 2006, 35, 252; J. Phys. Chem. B, 2006, 110, 19191; J. Phys. Chem. B, 2001, 105, 1422. The blocking layer may be applied to prevent undesired reaction. The blocking is usually dense and compact, and is usually thinner than the electrode layer (b).

Preferably, the counter electrode layer (d) contains (e.g. consists of)
(d-1) a conductive layer and
(d-2) an insulating layer.

The conductive layer (d-1) is usually between the insulating layer (d-2) and the electrolyte layer (e).

For instance, the conductive layer (d-1) contains a conductive carbon (e.g. graphite, single walled carbon nanotubes, multiwalled carbon nanotubes, carbon nanofibers, carbon fibers, grapheme or carbon black), a conductive metal (e.g. gold or platinum), a metal oxide (e.g. ITO (indium-tin compounded oxide), IZO (indium-zinc compounded oxide), FTO (fluorine-doped tinoxide), zinc oxide doped with boron, gallium or aluminum, and niobium-doped titanium oxide) or mixtures thereof.

Furthermore, the conductive layer (d-1) may be one obtained by forming a layer of platinum, carbon or the like (generally with a thickness of from 0.5 to 2,000 nm), on a thin film of a conductive oxide semiconductor, such as ITO, FTO, or the like (generally with a thickness of from 0.1 to 5 μm). The layer of platinum, carbon or the like is usually between the electrolyte layer (e) and the insulating layer (d-2).

Examples of the insulating layer (d-2) includes glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina.

The dye (c) is usually disposed on the electrode layer (b) on that surface of the electrode layer (b) facing the electrolyte layer (e).

For adsorption of the dye (c) to the electrode layer (b), the electrode layer (b) may be immersed into a solution or a dispersion liquid of the dye. A concentration of the dye solution or dye dispersion liquid is not limited to, but preferably from 1 μM to 1 M, and is preferably 10 μM to 0.1 M. The time period for the dye adsorption is preferably from 10 seconds to 1000 hours or less, more preferably from 1 minute to 200 hours or less, most preferably from 1 to 10 hours. The temperature for dye adsorption is preferably from room temperature to the boiling temperature of the solvent or the dispersion liquid. The adsorption may be carried out dipping, immersing or immersing with stirring. As the stirring method, a stirrer, supersonic dispersion, a ball mill, a paint conditioner, a sand mill or the like is employed, while the stirring method shall not be limited thereto.

The solvent for dissolving or dispersing the dye (c) includes water, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, ketone solvents such as acetone, amide solvents such as N,N-dimethylformamide, N,N-dimethylacetamide and N-methylpyrrolidone, nitrile solvents such as acetonitrile, methoxy acetonitrile, methoxy propionitrile, propionitrile and benzonitrile, carbonate solvents such as ethylene carbonate, propylene carbonate and diethyl carbonate, heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene. These may be used solely or in the form of a mixture containing two or more solvents. As a solvent, supercritical solvent such as supercritical carbon dioxide may be used.

As dye (c) a dye of formula (I) may be adsorbed on the electrode layer (b) solely or in combination with one or more further dyes. The dyes adsorbed together are not limited to dyes of formula (I). Two or more dyes may be adsorbed on the electrode layer (b) one by one or all together by dissolving the dyes in a solvent. It is preferable to use the dyes with different absorption peaks in different wavelengths to absorb wide range of light wavelengths and generate higher current. The ratio of two or more dyes adsorbed on the electrode layer (b) is not limited but preferably each dye has molar ratio of more than 10%.

For adsorption of the dye (c), an additive may be used in combination. The additive may be any one of an agent that has a function presumably for controlling dye adsorption. The additive includes a condensation agent such as thiol or a hydroxyl compound and a co-adsorbent. These may be used solely or a mixture of them. The molar ratio of the additive to the dye is preferably 0.01 to 1,000, more preferably 0.1 to 100.

For instance, the dye-adsorbed electrode layer may be treated with amines such as 4-tert-butyl pyridine. As a treatment method, immersing the dye-sensitized electrode layer into amine solution which may be diluted with a solvent such as acetonitrile or ethanol can be employed.

In the above manner, the electrode layer of the present invention can be obtained.

When the electrolyte layer (e) is in the form of solution or quasi-solid, the electrolyte layer (e) usually contains,
(e-1) electrolyte compound,
(e-2) solvent and/or ionic liquid, and
preferably (e-3) other additives Examples of the electrolyte compound (e-1) include a combination of a metal iodide such as lithium iodide, sodium iodide, potassium iodide, cesium iodide or calcium iodide with iodine, a combination of a quaternary ammonium iodide such as tetraalkylammonium iodide, pyridium iodide or imidazolium iodide with iodine, a combination of a metal bromide such as lithium bromide, sodium bromide, potassium bromide, cesium bromide or calcium bromide with bromine, a combination of a quaternary ammonium bromide such as tetraalkylammonium bromide or pyridinium bromide with bromine, metal complexes such as ferrocyanic acid salt-ferricyanic acid salt or ferrocene-ferricynium ion, sulfur compounds such as sodium polysulfide and alkylthiolalkyldisulfide, a viologen dye, hydroquinone-quinone and a combination of a nitroxide radical such as 2,2,6,6-tetramethyl-1-piperidinyloxy (TEMPO) and oxoammonium salt. It is possible to prepare electrolyte compounds (e-1) by partially converting nitroxide radical into the oxoammonium salt in situ by adding oxidizing agent (e.g. $NOBF_4$).

The above electrolyte compounds (e-1) may be used solely or in the form of a mixture. As an electrolyte compound (e-1), there may be used a molten salt that is in a molten state at room temperature. When such a molten salt is used, particularly, it is not necessary to use a solvent.

The electrolyte compound (e-1) concentration in the electrolyte solution is preferably 0.05 to 20 M, more preferably 0.1 to 15 M.

For instance, the solvent (e-2) is nitrile solvents such as acetonitrile, methoxy acetonitrile, methoxy propionitrile, propionitrile and benzonitrile, carbonate solvents such as ethylene carbonate, propylene carbonate and diethyl carbonate, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, water, ketone solvents such as acetone, amide solvents such as N,N-dimethylformamide, N,N-dimethylacetamide and N-methylpyrrolidone, heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene or combinations of the above mentioned solvents and the ionic liquid is a quaternary imidazolium salt, a quaternary pyridinium salt, a quarternary ammonium salt or combinations thereof, preferably the anion of the salt is $BF_4^-$, $PF_6^-$, $F(HF)_2^-$, $F(HF)_3^-$, bis(trifluoromethanesulfonyl)imide [$(CF_3SO_2)_2N^-$], $N(CN)_2^-$, $C(CN)_3^-$, $B(CN)_4^-$, $SCN^-$, $SeCN^-$, $I^-$, $IO_3^-$ or combinations thereof.

For example, a photoelectric conversion device comprises a solvent (e.g. without an ionic liquid). For instance, a photoelectric conversion device comprises an ionic liquid (e.g. without a solvent).

Examples of further additives (e-3) are lithium salts (especially 0.05 to 2.0 M, preferably 0.1 to 0.7 M) (e.g. $LiClO_4$, $LiSO_3CF_3$ or $Li(CF_3SO_2)N$); pyridines (especially 0.005 to 2.0M, preferably 0.02 to 0.7 M) (e.g. pyridine, tert-butylpyridine or polyvinylpyridine), gelling agents (especially 0.1 to 50 wt. %, preferably 1.0 to 10wt. % based on the weight of the component e) (e.g. polyvinylidene fluoride, polyvinylidene fluoride-hexafluoropropylene copolymer, polyethylene oxide derivatives, polyacrylonitrile derivatives or amino acid derivatives), nano particles (especially 0.1 to 50 wt. %, preferably 1.0 to 10 wt. % based on the weight of the component e) (e.g. conductive nano particles, in particular single-wall carbon nanotubes, multi-wall carboncarbon nanotubes or combinations thereof, carbon fibers, carbon black, polyaniline-carbon black composite $TiO_2$, $SiO_2$ or $SnO_2$); and combinations thereof.

In the present invention, an inorganic solid compound such as cooper iodide, cooper thiocyanide or the like, an organic hole-transporting material or an electron-transporting material can be used in place of the electrolyte layer (e).

The instant electrode layer, photoelectric conversion devices and DSC can be prepared as outlined in U.S. Pat. No. 4,927,721, U.S. Pat. No. 5,084,365, U.S. Pat. No. 5,350,644 and U.S. Pat. No. 5,525,440 or in analogy thereto.

The present invention also pertains to a dye sensitized solar cell comprising a photoelectric conversion device as described herein.

The present invention also pertains to the use of a compound of formula (I) as defined herein as a dye in a dye sensitized solar cell.

The present invention further pertains to a compound of formula (I) as defined herein,
with the proviso that $R_6$ is not $OR_7$, if $R_7$ is part of $R_2$ and forms together with $R_{15}$ an aliphatic 6-membered ring.

Preferred is a compound of formula (I),
with the proviso that $R_6$ is $NR_7R_{10}$, if $R_7$ is part of $R_2$ and forms together with $R_{15}$ an aliphatic 6-membered ring.

Particularly preferred is a compound of formula (I), with the proviso that if $R_7$ or $R_{10}$ is part of $R_2$, it does not form together with $R_{15}$ or $R_{16}$ an unsubstituted or substituted aliphatic 6- or 7-membered ring;

even more preferred with the proviso that if $R_7$ or $R_{10}$ is part of $R_2$, it does not form together with $R_{15}$ or $R_{16}$ a direct bond or methylene thus not forming an aliphatic 6- or 7-membered ring;

most preferred with the proviso that if $R_7$ is part of $R_2$, it does not form together with $R_{15}$ a direct bond thus not forming an aliphatic 6-membered ring.

The compounds of formula (I) can be prepared according to methods known in the art.

Compound of formula (I) can be prepared by condensation of the corresponding pyridinium, quinolinium or isoquinolinium salt and ketone as described below:

In case of n=0;

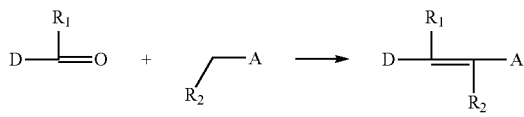

In case of n=1;

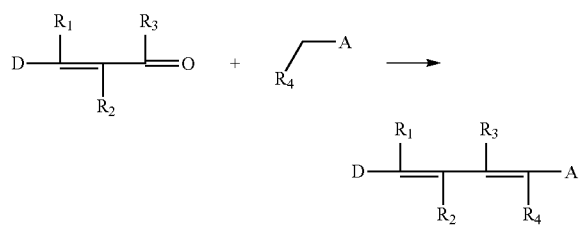

For instance, the reaction conditions of the condensation of the quaternary salts with carbonyl compounds are reflux in ethanol in the presence of piperidine or pyrrolidine (see for instance, *J. Chem. Soc.* 1961, 5074, *Dyes & Pigments* 2003, 58, 227), or heating in acetic anhydride (see for instance, *Indian J. Chem.* 1968, 6, 235.), or heating in acetic acid in a presence of ammonium acetate.

Before condensation, the group G may be protected. Then after the condensation reaction, the protection group can be removed. A group G comprising COOH or COO⁻Z⁺ can be protected by, for example, t-butyl group. Then after condensation reactions, the COO-t-butyl group can be converted into COOH or COO⁻Z⁺.

Or compounds of formula (I) can be prepared by condensation of the corresponding pyridine, quinoline or isoquinoline derivatives with carbonyl compounds, followed by quaternization to the corresponding pyridinium, quinolinium or isoquinolinium salt.

For instance, the starting material are partly items of commerce or can be obtained according to methods known in the art.

When a denotation (e.g. D, G, $R_5$-$R_{28}$) occurs more than once (e.g. twice) in a compound, this denotation may be different groups or the same group unless otherwise stated.

It is to be understood that alkyl and alkylene interrupted by O, S, $NR_{14}$ or combinations comprises at least 2 carbon atoms and in case of combinations comprises at least 3 carbon atoms.

In the definitions the term alkyl comprises within the given limits of carbon atoms, for example methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, 2-methylheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl or dodecyl.

Examples of alkenyl are within the given limits of carbon atoms vinyl, allyl, 1-methylethenyl, and the branched and unbranched isomers of butenyl, pentenyl, hexenyl, heptenyl, octenyl, nonenyl, decenyl, undecenyl and dodecenyl. The term alkenyl also comprises residues with more than one double bond that may be conjugated or non-conjugated, for example may comprise one double bond.

Examples of alkynyl are within the given limits of carbon atoms ethynyl, propargyl, 1-methylethynyl, and the branched and unbranched isomers of butynyl, pentynyl, hexynyl, heptynyl, octynyl, nonynyl, decynyl, undecynyl and dodecynyl. The term alkynyl also comprises residues with more than one triple bond and residues with a triple bond and a double bond, all of which may be conjugated or non-conjugated. For instance, alkynyl comprises one triple bond.

Aryl is for example phenyl, biphenyl, naphthalinyl, anthracenyl, phenanthrenyl or pyrenyl, in particular phenyl or pyrenyl, especially phenyl.

Aryl/arylene can be (further) substituted by . . . is to be understood to include the aryl of aralkyl, aralkenyl, aralkynyl, aralkylene, aralkenylene and aralkynylene.

Heteroaryl may comprise one or more (e.g. 1-4, in particular 1-3, especially 1-2, such as 1 heteroatom preferably selected from the group consisting of O, S and N, especially S and N, in particular N). Examples of heteroaryl are thiophenyl, phenyl thiophenyl, diphenyl thiophenyl, triphenyl thiophenyl, bithiophenyl, terthiophenyl, tetrathiophenyl, furanyl, bifuranyl, terfuranyl, pyrrolyl, carbazolyl, phenyl carbazolyl, diphenyl carbazolyl, triphenyl carbazolyl, tetraphenyl carbazolyl, indolyl, piperidinyl, 9H-purinyl, pteridinyl, chinolinyl, isochinyl, acridinyl, phenazinyl,

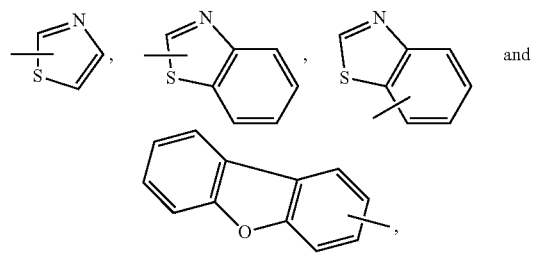

preferred examples are thiophenyl, phenyl thiophenyl, diphenyl thiophenyl, triphenyl thiophenyl, carbazolyl, phenyl carbazolyl, diphenyl carbazolyl, triphenyl carbazolyl, tetraphenyl carbazolyl,

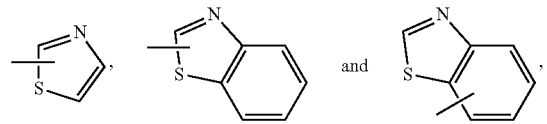

more preferred examples are thiophenyl, triphenyl thiophenyl, carbazolyl, phenyl carbazolyl,

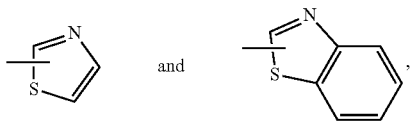

a particularly preferred example is carbazolyl. Heteroaryl as $R_{18}$ is for instance triphenyl thiophenyl, carbazolyl or phenyl carbazolyl. Heteroaryl as $R_7$ and/or $R_{10}$ is for instance thiophenyl, carbazolyl,

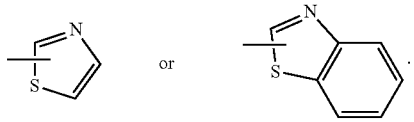 or 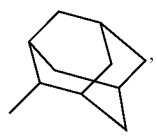.

Methyl(fluoren-9-ylidene) is for instance

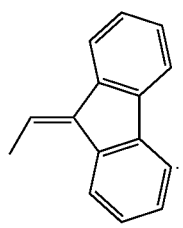

Aralkyl is for instance benzyl or α,α-dimethylbenzyl, especially benzyl.

Aralkenyl includes, for instance,

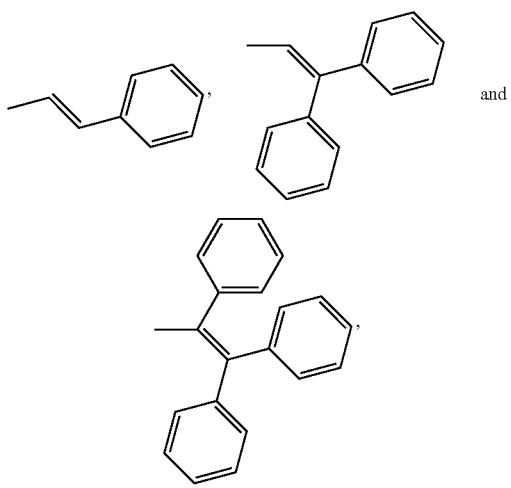

especially

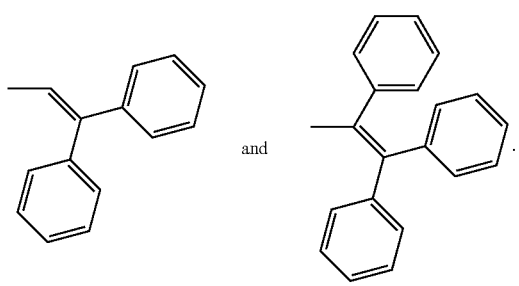

An example of aralkynyl is 2-phenylethynyl.

Some examples of cycloalkyl are

, cyclobutyl, cyclopentyl, cyclohexyl, cycloheptyl, cyclooctyl, methylcyclopentyl, dimethylcyclopentyl, methylcyclohexyl and dimethylcyclohexyl, for instance cyclohexyl.

Some examples of cycloalkenyl are cyclopentenyl, cyclohexenyl, methylcyclopentenyl, dimethylcyclopentenyl and methylcyclohexenyl. Cycloalkenyl may comprise more than one double bond that may be conjugated or non-conjugated, for example may comprise one double bond.

Some examples of cycloalkynyl are cyclohexynyl and methylcyclohexenyl.

The term halogen may comprise fluorine, chlorine, bromine and iodine; for example halogen is fluorine.

In the definitions the term alkylene comprises within the given limits of carbon atoms, for example methylene, ethylene, propylene, isopropylene, n-butylene, sec-butylene, isobutylene, tert-butylene, 2-ethylbutylene, n-pentylene, isopentylene, 1-methylpentylene, 1,3-dimethylbutylene, n-hexylene, 1-methylhexylene, n-heptylene, 2-methylheptylene, 1,1,3,3-tetramethylbutylene, 1-methylheptylene, 3-methylheptylene, n-octylene, 2-ethylhexylene, 1,1,3-trimethylhexylene, 1,1,3,3-tetramethylpentylene, nonylene, decylene, undecylene, 1-methylundecylene or dodecylene.

Examples of alkenylene are within the given limits of carbon atoms vinylene, allylene, 1-methylethenylene, and the branched and unbranched isomers of butenylene, pentenylene, hexenylene, heptenylene, octenylene, nonenylene, decenylene, undecenylene and dodecenylene. The term alkenylene also comprises residues with more than one double bond that may be conjugated or non-conjugated, for example may comprise one double bond.

Examples of alkynylene are within the given limits of carbon atoms ethynylene, propargylene, 1-methylethynylene, and the branched and unbranched isomers of butynylene, pentynylene, hexynylene, heptynylene, octynylene, nonynylene, decynylene, undecynylene and dodecynylene. The term alkynylene also comprises residues with more than one triple bond and residues with a triple bond and a double bond, all of which may be conjugated or non-conjugated. For instance, alkynylene comprises one triple bond.

Arylene is for example phenylene, biphenylene, naphthalinylene, anthracenylene, phenanthrenylene or pyrenylene, in particular phenylene.

Heteroarylene may comprise one or more (e.g. 1-4, in particular 1-3, especially 1-2, such as 1 heteroatom preferably selected from the group consisting of O, S and N, especially S and N, in particular N). Examples of heteroarylene are thiophenylene, bithiophenylene, terthiophenylene, tetrathiophenylene, furanylene, bifuranylene, terfuranylene, pyrrolylene, carbazolylene, indolylene, piperidinylene, 9H-purinylene, pteridinylene, chinolinylene, isochinylene, acridinylene, phenazinylene and

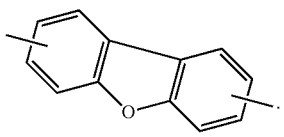

Aralkylene is for instance phenylmethylene, phenylethylene or phenyldimethylmethylene.

Aralkenyl includes, for instance, phenylethenylene.

An example of aralkynylene is phenylethynylene.

Some examples of cycloalkylene are cyclobutylene, cyclopentylene, cyclohexylene, cycloheptylene, cyclooctylene, methylcyclopentylene, dimethylcyclopentylene, methylcyclohexylene and dimethylcyclohexylene, for instance cyclohexylene.

Some examples of cycloalkenylene are cyclopentenylene, cyclohexenylene, methylcyclopentenylene, dimethylcyclopentenylene and methylcyclohexenylene. Cycloalkenylene may comprise more than one double bond that may be conjugated or non-conjugated, for example may comprise one double bond.

Some examples of cycloalkynylene are cyclohexynylene and methylcyclohexynylene.

Examples of heteroaralkylene are thiophenylmethylene, thiophenylethylene, bithiophenylmethylene, bithiophenylethylene, furanylmethylene, furanylethylene, bifuranylmethylene bifuranylethylene, pyrrolylmethylene, pyrrolylethylene, indolylmethylene, indolylethylene, chinolinylmethylene, chinolinylethylene, isochinolinylmethylene and isochinolinylethylene.

Examples of heteroaralkenylene are thiophenylethenylene, bithiophenylethenylene, furanylethenylene, bifuranylethenylene, pyrrolylethenylene, indolylethenylene, chinolinylethenylene and isochinolinylethenylene.

Examples of heteroaralkynylene are thiophenylethynylene, bithiophenylethynylene, furanylethynylene, bifuranylethynylene, pyrrolylethynylene, indolylethynylene, chinolinylethynylene and isochinolinylethynylene.

For instance, fluorinated alkyl is an alkyl substituted by one or more fluorine. Examples of fluorinated alkyl are —$CF_3$, —$CF_2CF_3$, —$CF_2CF_2CF_3$, —$CF(CF_3)_2$, —$(CF_2)_3CF_3$, —$(CF_2)CF_2H$ and —$C(CF_3)_3$, in particular —$CF_3$. Preferably, fluorinated alkyl is perfluorinated.

The preferences outlined herein apply to all aspects of the invention.

Ratio and % are weight ratio and weight-% unless otherwise stated.

ABBREVIATIONS

DSC dye sensitized solar cell

PREPARATION EXAMPLES

Example D-1

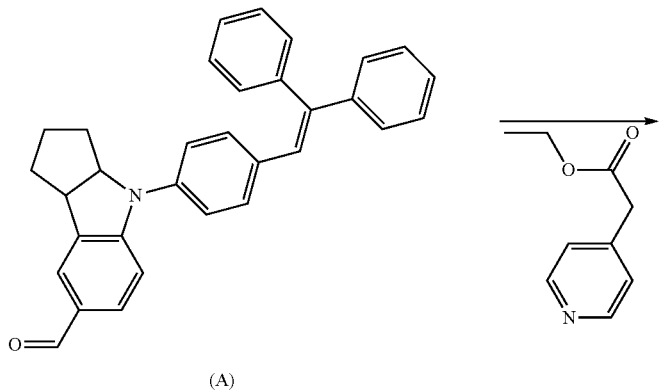

(A)

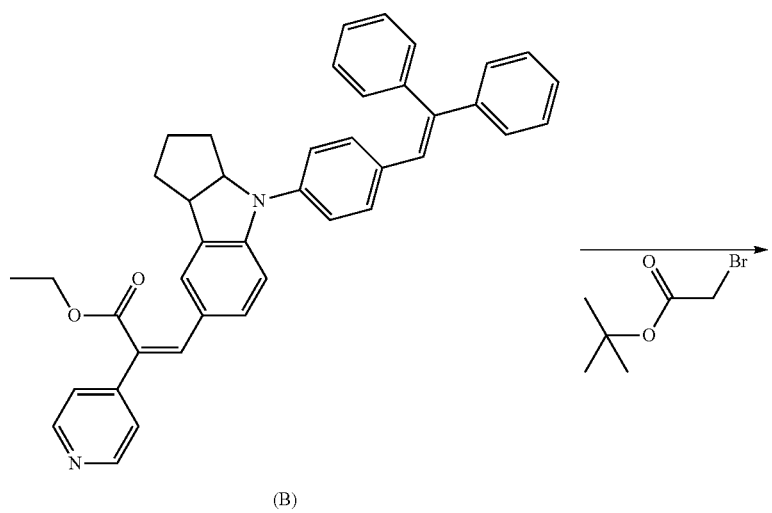

(B)

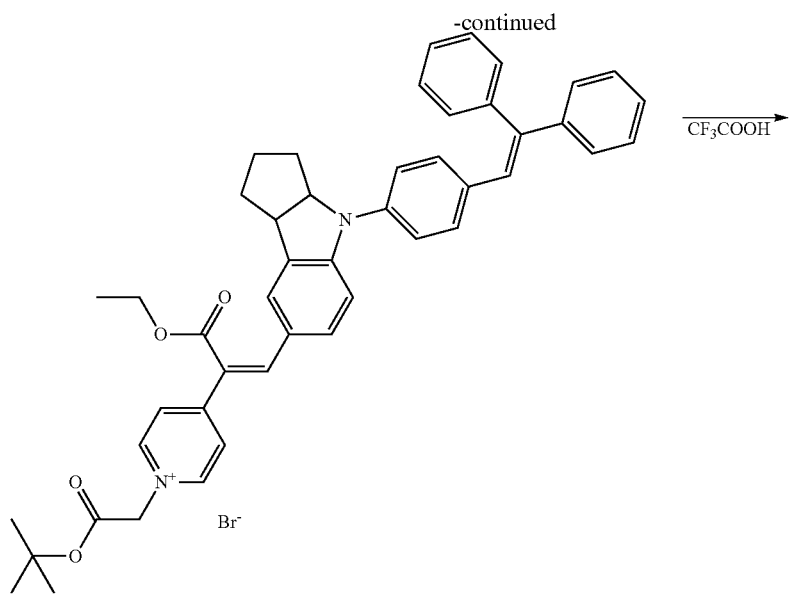

(C)

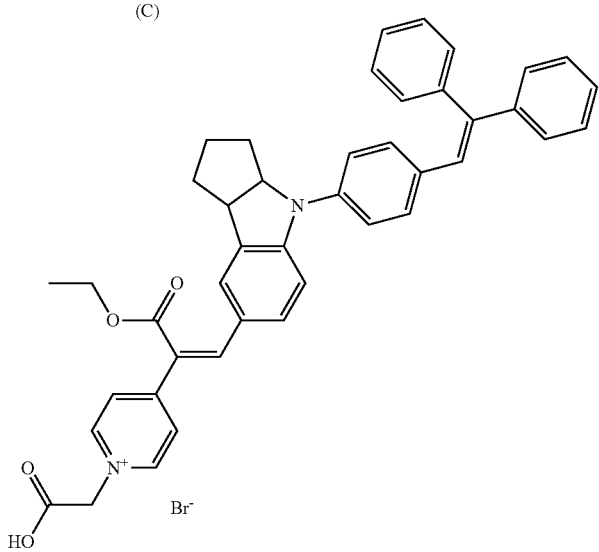

D-1

Preparation of Aldehyde (A):

Aldehyde (A) is prepared via the same method as described in WO20040011555 (C-4).

Preparation of (B);

1 g (2.26 mmol) of aldehyde (A), 0.29 g (1.76 mmol) of ethyl 4-pyridylacetate, 0.27 g (3.5 mmol) of ammonium acetate and 10 mml of acetic acid are stirred at 130 for 15 hours. After cooling down to the room temperature, the reaction mixture is poured into 30 ml of water, and precipitate is filtered. The crude product is purified by column chromatography and 630 mg of purple solid (B) is obtained (yield 60%).

Preparation of (C);

200 mg (0.43 mmol) of pyridine derivative (B) and 100 mg of tert-butyl bromoacetate and 20 ml of ethyl acetate are stirred at 80 for 5 hours. After the reaction mixture is allowed to the room temperature, the precipitate is filtered and dried. Then, 220 mg of purple solid (C) is obtained. The pyridinium salt (C) is used in the next step without further purification.

Preparation of D-1;

220 mg of pyridinium salt (C) and 10 ml of trifluoroacetic acid are agitated at room temperature for 2 hours. After trifluoroacetic acid is removed via evaporation, the crude product is purified by column chromatography and 200 mg of D-1 is obtained.

Example D-3

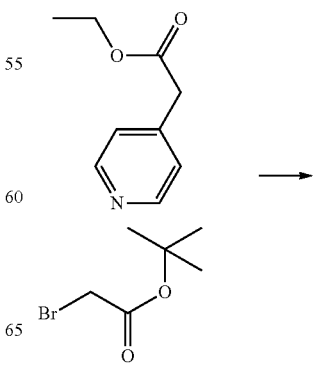

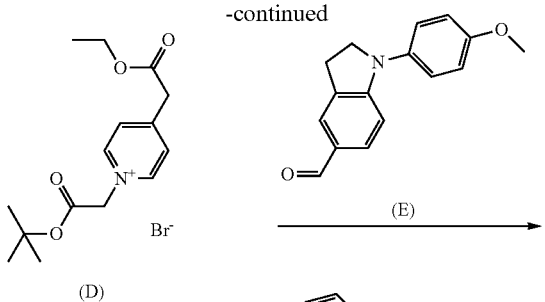

Preparation of Pyridinium Salt (D)

A mixture of 2.0 g (0.012 mol) of ethyl 4-pyridylacetate, 3.75 g (0.019 mol) of tert-butyl bromoacetate and 20 ml of toluene is heated under reflux for 2 hours. The reaction mixture is allowed to the room temperature, and then the precipitate is collected by filtration. After dried, 4.42 g of pyridinium salt (D) is obtained. This pyridinium salt (D) is used without further purification for the next reaction.

Preparation of (F);

780 mg (2.17 mmol) of pyridinium salt (D), 550 mg (2.19 mmol) of aldehyde (E) and 8 ml of acetic anhydride are stirred at 100 for 2 hours. After removal of acetic anhydride, the crude product is purified via column chromatography and 760 mg of purple solid (F) is obtained (59%).

Preparation of D-3;

300 mg of pyridinium salt (F), 2 ml of trifluoroacetic acid and 5 ml of dichloromethane are stirred at room temperature fro 2 hours. After removal of solvents by vacuum evaporation, the crude product is purified by column chromatography and 160 mg of red solid (D-3) is obtained (59%).

Examples D-2 and D-4 to D-61

Dyes D-2 and D-4-D-61 are prepared in analogy to the above-mentioned procedures.

| No. | Chemical Structure | | | Absorption spectrum | |
|---|---|---|---|---|---|
| | Donor | Spacer | Acceptor | $\lambda_{max}$ (nm) | $\epsilon$ |
| D-1 | [hexahydrocyclopenta[b]indole with phenyl-diphenylvinyl substituent] | ethyl acrylate spacer | 4-pyridinium-CH2-COOH, Br⁻ | 497.0 | 14500 |
| D-2 | [hexahydrocyclopenta[b]indole with phenyl-diphenylvinyl substituent] | phenyl-NH-C(O)-CH=CH- | 4-pyridinium-CH2-COOH, Br⁻ | 506.0 | 34300 |
| D-3 | [2,3-dihydro-1H-indole with 4-methoxyphenyl substituent] | ethyl acrylate spacer | 4-pyridinium-CH2-COOH, Br⁻ | 481.0 | 13300 |
| D-4 | [N,N-diethylamino phenyl with hexyloxy group] | ethyl acrylate spacer | 4-pyridinium-CH2-COOH, Br⁻ | 485.0 | 17900 |

-continued

| No. | Donor | Chemical Structure Spacer | Acceptor | Absorption spectrum $\lambda_{max}$ (nm) | $\epsilon$ |
|---|---|---|---|---|---|
| D-5 | | | | 468.5 | 31400 |
| D-6 | | | | 487.5 | 17300 |
| D-7 | | | | 476.5 | 27100 |
| D-8 | | | | 482.0 | 15500 |

-continued
| No. | Chemical Structure | | | Absorption spectrum | |
|---|---|---|---|---|---|
| | Donor | Spacer | Acceptor | $\lambda_{max}$ (nm) | $\epsilon$ |
| D-9 | 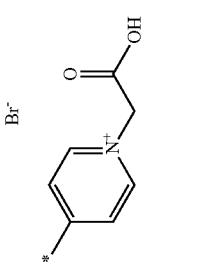 | 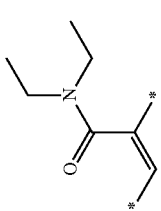 | 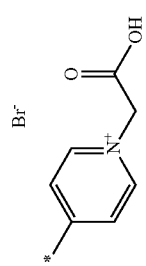 | 498.5 | 36200 |
| D-10 | 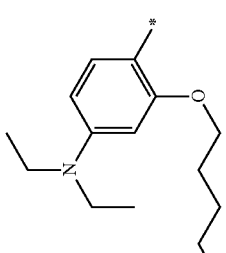 | 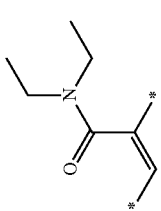 | 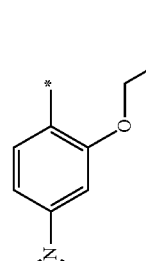 | 476.0 | 25700 |
| D-11 | 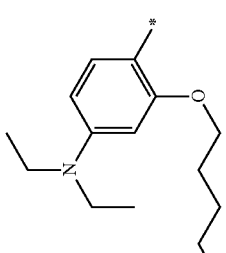 | 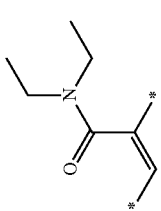 | 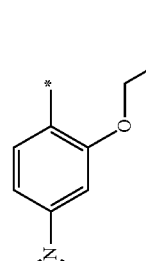 | 472.0 | 22800 |

-continued
| No. | Chemical Structure | | | Absorption spectrum | |
|---|---|---|---|---|---|
| | Donor | Spacer | Acceptor | $\lambda_{max}$ (nm) | $\epsilon$ |
| D-12 | 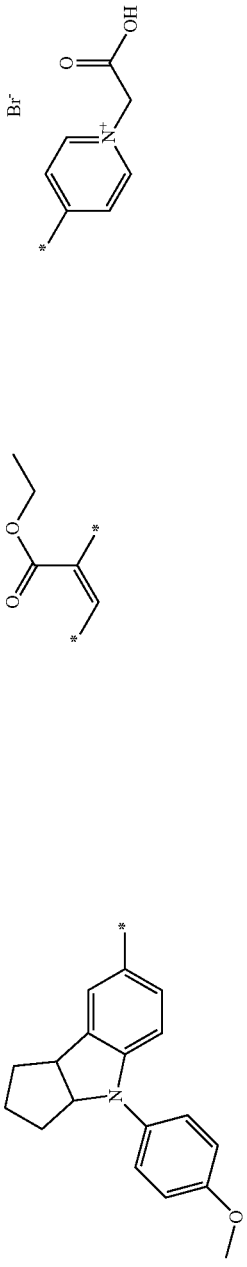 | 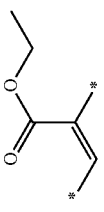 | 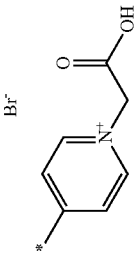 | 509.0 | 13000 |
| D-13 | 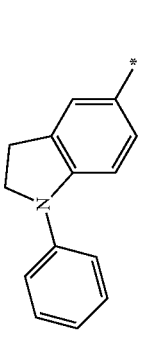 | 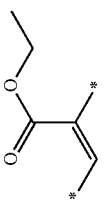 | 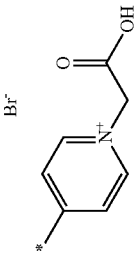 | 479.0 | 5090 |
| D-14 | 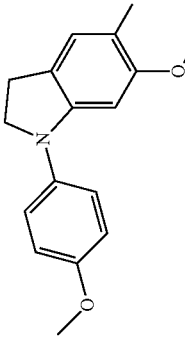 | 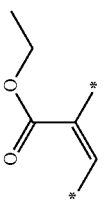 | 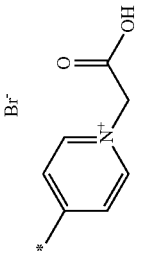 | 503.5 | 14700 |
| D-15 | 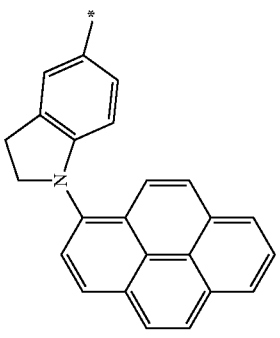 | 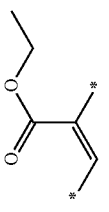 | 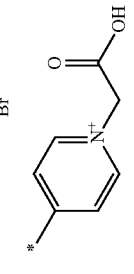 | 463.5 | 12300 |

-continued

| No. | Chemical Structure Donor | Spacer | Acceptor | Absorption spectrum $\lambda_{max}$ (nm) | $\epsilon$ |
|---|---|---|---|---|---|
| D-16 | 4-(diethylamino)-2-(pentyloxy)phenyl | N-methyl-N-phenyl vinyl amide | 4-methylpyridinium-CH2COOH, Br⁻ | 500.0 | 39200 |
| D-17 | 4-(diethylamino)-2-(hexyloxy)phenyl | N-phenyl vinyl amide (NH) | 4-methylpyridinium-CH2COOH, Br⁻ | 498.5 | 33700 |
| D-18 | 4-(diethylamino)-2-(hexyloxy)phenyl | N,N-dibutyl vinyl amide | 4-methylpyridinium-CH2COOH, Br⁻ | 497.5 | 47800 |
| D-19 | cyclopenta-fused indoline with 4-(2,2-diphenylvinyl)phenyl on N | N,N-diphenyl vinyl amide | 4-methylpyridinium-CH2COOH, Br⁻ | 504.0 | 36200 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-20 | 5,6-dimethoxy-1-(4-methoxyphenyl)indoline | anilide acrylamide | N-methylpyridinium acetic acid, Br⁻ | 525.5 | 34600 |
| D-21 | 6-methoxy-5-[4-(2,2-diphenylvinyl)phenyl]indoline | ethyl acrylate | N-methylpyridinium acetic acid, Br⁻ | 522.5 | 8990 |
| D-22 | 1-(pyren-1-yl)indoline | anilide acrylamide | N-methylpyridinium acetic acid, Br⁻ | 486.5 | 10100 |

-continued

| No. | Chemical Structure | | | Absorption spectrum | |
|---|---|---|---|---|---|
| | Donor | Spacer | Acceptor | λ_max (nm) | ε |
| D-23 | 1-(4-methylthiophenyl)-indoline | -C(=CH-*)-C(=O)-NH-Ph | 4-methylpyridinium-CH2-COOH, Br⁻ | 492.5 | 35100 |
| D-24 | 1-methylindoline | -C(=CH-*)-C(=O)-NH-Ph | 4-methylpyridinium-CH2-COOH, Br⁻ | 483.5 | 31700 |
| D-25 | tetraphenylethylene-indoline | -C(=CH-*)-C(=O)-NH-Ph | 4-methylpyridinium-CH2-COOH, Br⁻ | 502.0 | 15000 |
| D-26 | 1-(4-phenoxyphenyl)-indoline | -C(=CH-*)-C(=O)-O-Et | 4-methylpyridinium-CH2-COOH, Br⁻ | 477.5 | 9250 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-27 | methoxy-indoline with N-phenyl-diphenylvinyl substituent | phenyl-NH-C(=O)-C(CH3)=CH- | 4-methylpyridinium-CH2COOH, Br⁻ | 518.0 | 18700 |
| D-28 | indoline with N-(4-methylthiophenyl) and O-benzyl substituent | phenyl-NH-C(=O)-C(CH3)=CH- | 4-methylpyridinium-CH2COOH, Br⁻ | 513.0 | 18300 |
| D-29 | 4H-benzo[1,4]oxazine with N-(4-methoxyphenyl) substituent | phenyl-NH-C(=O)-C(CH3)=CH- | 4-methylpyridinium-CH2COOH, Br⁻ | 475.5 | 29500 |

-continued

| No. | Chemical Structure | | | Absorption spectrum | |
|---|---|---|---|---|---|
| | Donor | Spacer | Acceptor | λ_max (nm) | ε |
| D-30 | | | | 505.0 | 48300 |
| D-31 | | | | 459.0 | 13200 |
| D-32 | | | | 496.5 | 12600 |
| D-33 | | | | 511.0 | 46200 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-34 | 1-(4-(methylthio)phenyl)indoline | ethyl acrylate-type | 4-methylpyridinium-CH₂COOH Br⁻ | 473.0 | 12800 |
| D-35 | 4-(dimethylamino)phenyl | N-heptylmaleimide | 4-methylpyridinium-CH₂COOH Br⁻ | 563.0 | 9690 |
| D-36 | 4-morpholinophenyl | N-heptylmaleimide | 4-methylpyridinium-CH₂COOH Br⁻ | 517.5 | 3770 |
| D-37 | 4-(dimethylamino)phenyl | methyl vinyl ketone-type | 4-methylpyridinium-CH₂COOH Br⁻ | 417.5 | 13600 |
| D-38 | 9-ethylcarbazole | ethyl acrylate-type | 4-methylpyridinium-CH₂COOH Br⁻ | 408.5 | 9400 |

| No. | Donor | Spacer | Acceptor | Absorption spectrum $\lambda_{max}$ (nm) | $\epsilon$ |
|---|---|---|---|---|---|
| D-39 | (dibenzazepine with N-ethyl) | ethyl acrylate spacer | 4-methylpyridinium with CH2COOH, Br− | 423.0 | 9070 |
| D-40 | (diphenyl-maleimide donor with diethylamino-phenoxypropyl) | ethyl acrylate spacer | 4-methylpyridinium with CH2COOH, Br− | 486.0 | 17400 |
| D-41 | triphenylamine | ethyl acrylate spacer | 4-methylpyridinium with CH2COOH, Br− | 458.0 | 5810 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-42 | (triphenylamine with methoxy group) | ethyl acrylate spacer | pyridinium-CH$_2$-COOH, Br$^-$ | 450.0 | 2010 |
| D-43 | (cyclopenta-fused indoline with stilbene) | ethyl acrylate spacer | pyridinium-CH(COOH)$_2$, Br$^-$ | 495.0 | 14000 |
| D-44 | (diethylamino phenyl with O-CH$_2$-COOH) | ethyl acrylate spacer | pyridinium-CH$_2$-COOH, Br$^-$ | 472.0 | 15100 |
| D-45 | (N-methyl-N-phenyl aminophenyl) | ethyl acrylate spacer | pyridinium-CH$_2$-COOH, Br$^-$ | 447.5 | 12400 |

-continued

| No. | Chemical Structure | | | Absorption spectrum | |
|---|---|---|---|---|---|
| | Donor | Spacer | Acceptor | $\lambda_{max}$ (nm) | ε |
| D-46 | 9-(4-*-phenyl)carbazole | ethyl acrylate spacer | 4-*-pyridinium-N-CH₂COOH Br⁻ | 389.0 | 3450 |
| D-47 | 4-*-N,N-dimethylaniline | ethyl acrylate spacer | 4-*-quinolinium-N-CH₂COOH Br⁻ | 370.0 | 28500 |
| D-48 | 4-*-N,N-dimethylaniline | acrylic acid spacer | 4-*-quinolinium-N-CH₂COOH Br⁻ | 532.5 | 13000 |
| D-49 | 5-(N,N-diethylamino)-2-*-phenyl hexyl ether | N-phenyl acrylamide spacer | 4-*-quinolinium-N-CH₂COOH Br⁻ | 503.0 | 14600 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-50 | | | | 503.5 | 8220 |
| D-51 | | | | 473.0 | 6050 |
| D-52 | | | | 480.0 | 13500 |
| D-53 | | | | 469.0 | 8230 |

-continued

| No. | Chemical Structure | | | Absorption spectrum | |
|---|---|---|---|---|---|
| | Donor | Spacer | Acceptor | $\lambda_{max}$ (nm) | ε |
| D-54 | | | | 502.0 | 18200 |
| D-55 | | | | 473.0 | 6050 |
| D-56 | | | | 504.0 | 18200 |
| D-57 | | | | 458.0 | 5810 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-58 | [cyclopenta-fused indoline with N-phenyl-stilbene(diphenyl) donor] | N-methyl-N-phenyl amide with vinyl spacer | 4-methylpyridinium with N-CH₂COOH, Br⁻ | 505.5 | 36700 |
| D-59 | [indoline linked to N-ethylcarbazole] | N-phenyl amide (NH) with vinyl spacer | 4-methylpyridinium with N-CH₂COOH, Br⁻ | 513.0 | 25900 |

-continued
| No. | Chemical Structure | | | Absorption spectrum |  |
|---|---|---|---|---|---|
| | Donor | Spacer | Acceptor | $\lambda_{max}$ (nm) | $\epsilon$ |
| D-60 | | | | 522.5 | 59200 |
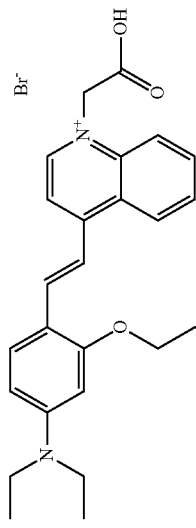

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-61 | | | | 501.0 | 22700 |

In compounds D-1 to D-59, the donor D is attached to the left side of the spacer and the acceptor A is attached to the right side of the spacer.

Dyes D-62-D-111 are prepared in analogy to the above-mentioned procedure of D-1 or D-3.

| No. | Chemical Structure | | | Absorption spectrum | |
|---|---|---|---|---|---|
| | Donor | Spacer | Acceptor | $\lambda_{max}$ (nm) | ε |
| D-62 |  | 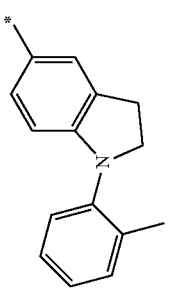 |  | 452.0 | 17800 |
| D-63 | 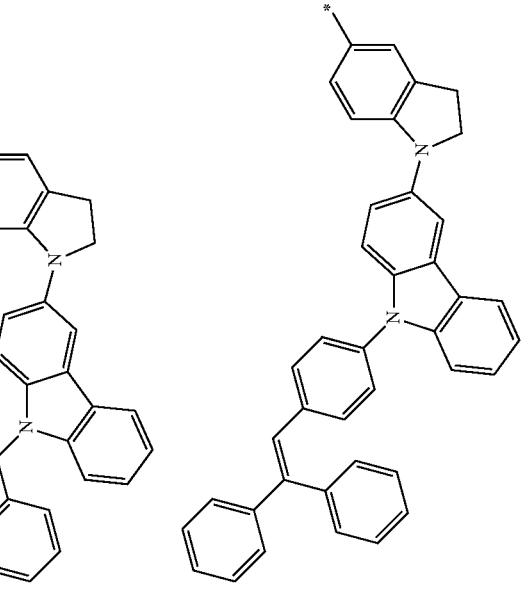 | 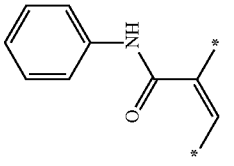 | 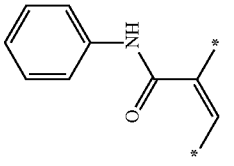 | 512.5 | 27700 |
| D-64 | 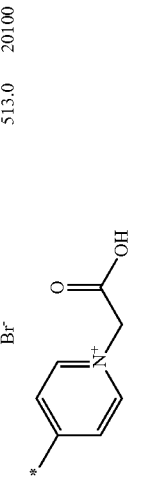 | 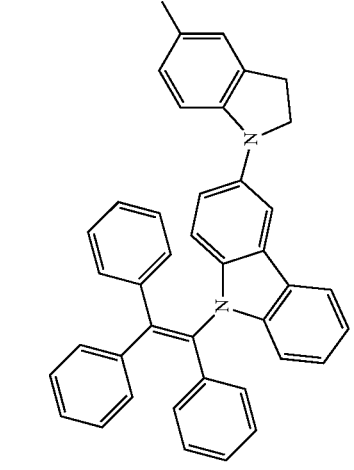 | 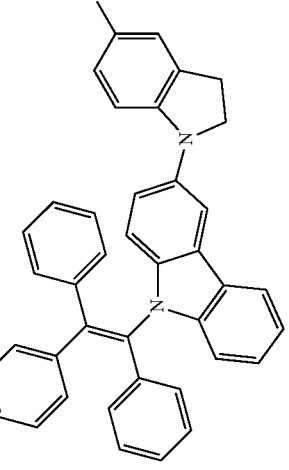 | 513.0 | 20100 |

| No. | Donor | Spacer | Acceptor | Absorption spectrum $\lambda_{max}$ (nm) | $\epsilon$ |
|---|---|---|---|---|---|
| D-65 | 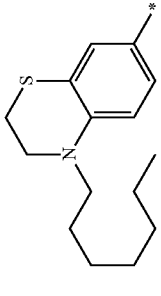 | 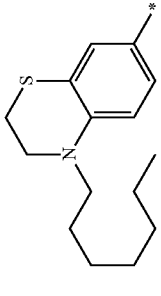 | 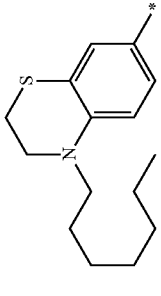 | 485.4 | 33900 |
| D-66 | 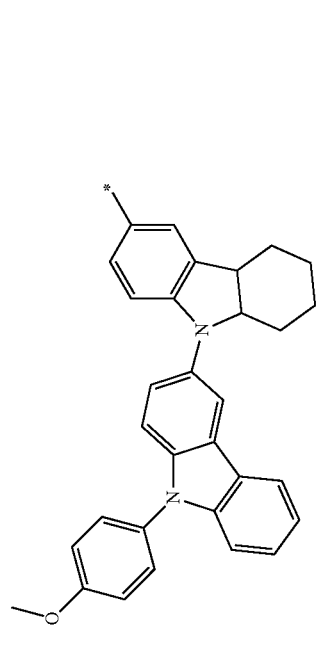 | 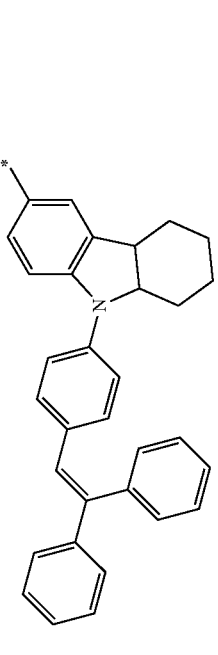 | 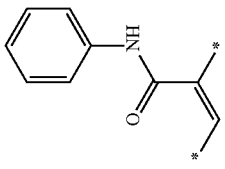 | 498.0 | 29900 |
| D-67 | 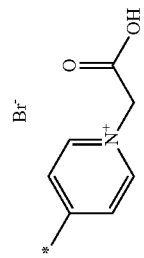 | 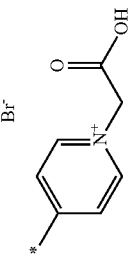 | 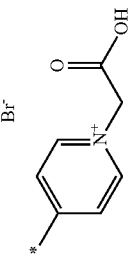 | 488.0 | 19600 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-68 | | | | 480.0 | 20900 |
| D-69 | | | | 506.0 | 7730 |
| D-70 | | | | 529.0 | 32400 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-71 | 5-indolinyl-substituted 9-phenylcarbazole | phenyl-NH-C(=O)-C(CH₃)=CH- | 4-(carboxymethyl)pyridinium Br⁻ | 508.0 | 35600 |
| D-72 | 5-indolinyl-substituted 9-(4-methoxyphenyl)carbazole | phenyl-NH-C(=O)-C(CH₃)=CH- | 4-(carboxymethyl)pyridinium Br⁻ | 508.5 | 24300 |
| D-73 | 5-indolinyl-substituted 4-(diphenylamino)phenyl | phenyl-NH-C(=O)-C(CH₃)=CH- | 4-(carboxymethyl)pyridinium Br⁻ | 506.0 | 34600 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-74 | phenyl-carbazole fused with cyclopenta-indoline | PhNH-C(=O)-C(*)=CH-* | 4-(*)-pyridinium-CH$_2$-COOH, Br$^-$ | 513.0 | 31000 |
| D-75 | 4-(*)-N,N-dimethylaniline | PhNH-C(=O)-C(*)=CH-CH=CH-* | 4-(*)-pyridinium-CH$_2$-COOH, Br$^-$ | 490.0 | 25700 |
| D-76 | 9,9-dimethyl-10-butyl-acridine (*) | PhNH-C(=O)-C(*)=CH-* | 4-(*)-pyridinium-CH$_2$-COOH, Br$^-$ | 473.0 | 11600 |

-continued

| No. | Chemical Structure | | | Absorption spectrum | |
|---|---|---|---|---|---|
| | Donor | Spacer | Acceptor | λ_max (nm) | ε |
| D-77 | (indoline-thiophene with three phenyl groups) | PhNH-C(=O)-C(*)=CH-* | 4-pyridinium-CH₂COOH, Br⁻, * | 469.0 | 15100 |
| D-78 | 4-(dimethylamino)phenyl, *, 2* | PhNH-C(=O)-C(*)=CH-CH=C(*)- | 4-pyridinium-CH₂COOH, Br⁻, * | 527.5 | 25700 |
| D-79 | (6-methoxy-3,3-dimethyl-1-phenylindoline, *) | PhNH-C(=O)-C(*)=CH-* | 4-pyridinium-CH₂COOH, Br⁻, * | 510.0 | 27900 |

-continued

| No. | Chemical Structure | | | Absorption spectrum |  |
|---|---|---|---|---|---|
| | Donor | Spacer | Acceptor | $\lambda_{max}$ (nm) | $\epsilon$ |
| D-80 | (hexahydrocyclopenta[b]indole with N-phenyl-diphenylvinyl substituent) | benzothiazol-2-yl amide vinyl spacer | 4-pyridinium acetic acid, Br⁻ | 510.5 | 29300 |
| D-81 | (hexahydrocyclopenta[b]indole with N-phenyl-diphenylvinyl substituent) | N-(4-butylphenyl) amide vinyl spacer | 4-pyridinium acetic acid, Br⁻ | 507.0 | 31300 |
| D-82 | (N-pentyl phenothiazine with fluorenylidene substituent) | N-phenyl amide vinyl spacer | 4-pyridinium acetic acid, Br⁻ | 446.5 | 3970 |

| No. | Chemical Structure | | | Absorption spectrum | |
|---|---|---|---|---|---|
| | Donor | Spacer | Acceptor | $\lambda_{max}$ (nm) | ε |
| D-83 | | | | 508.5 | 33000 |
| D-84 | | | | 509.0 | 17300 |
| D-85 | | | | 479.0 | 22500 |
| D-86 | | | | 494.5 | 19500 |

-continued

| | Chemical Structure | | | Absorption spectrum | |
|---|---|---|---|---|---|
| No. | Donor | Spacer | Acceptor | $\lambda_{max}$ (nm) | ε |
| D-87 | | | Br⁻ | 521.0 | 26600 |
| D-88 | | | I⁻ | 506.0 | 45600 |
| D-89 | | | Cl⁻ | 514.0 | 25500 |

-continued
| No. | Chemical Structure | | | Absorption spectrum |  |
|---|---|---|---|---|---|
| | Donor | Spacer | Acceptor | λ_max (nm) | ε |
| D-90 | 1* |  |  | 503.5 | 24400 |
| D-91 | 1* |  | 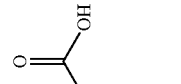 | 508.5 | 33000 |
| D-92 |  |  |  | 511.5 | 22700 |

| No. | Donor | Spacer | Acceptor | Absorption spectrum $\lambda_{max}$ (nm) | ε |
|---|---|---|---|---|---|
| D-93 | 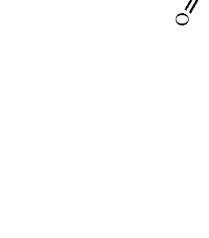 | 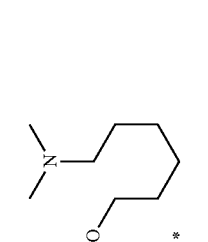 | 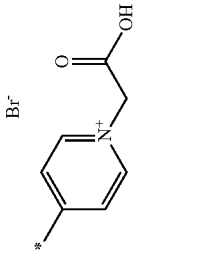 | 506.5 | 28800 |
| D-94 | 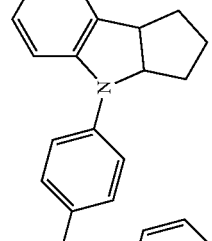 | 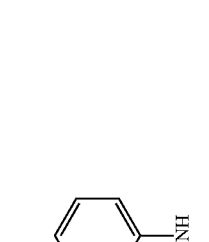 | 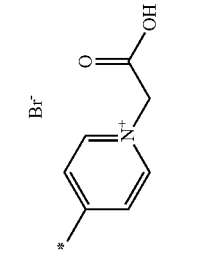 | 480.0 | 9730 |
| D-95 | 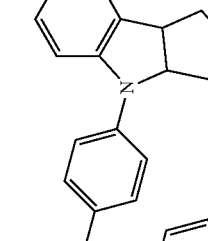 | 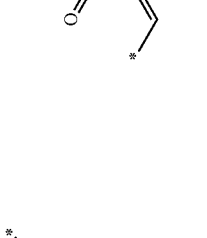 | 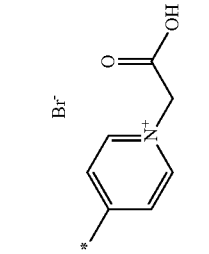 | 473.5 | 35300 |
| D-96 | 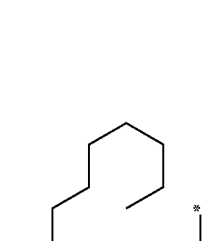 | 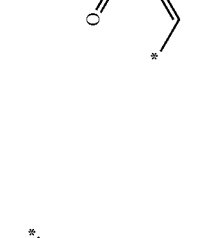 | 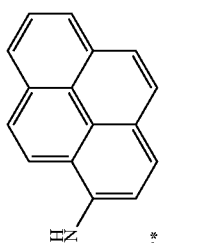 | 505.0 | 34100 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-97 | | | | 500.5 | 38800 |
| D-98 | | | | 509.0 | 11700 |
| D-99 | | | | 508.0 | 33100 |

-continued
| No. | Chemical Structure | | | Absorption spectrum |  |
|---|---|---|---|---|---|
| | Donor | Spacer | Acceptor | λ_max (nm) | ε |
| D-100 | 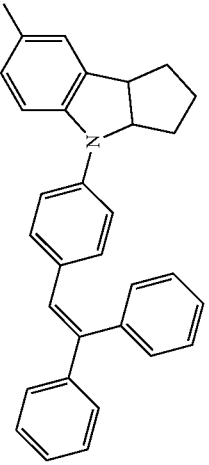 | 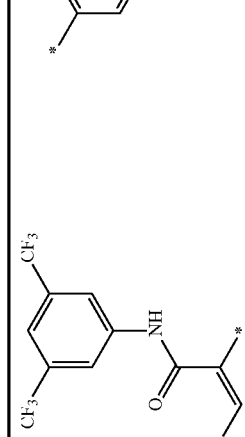 | 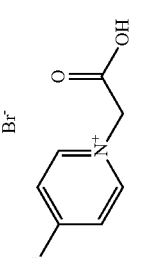 | 520.0 | 26600 |
| D-101 | 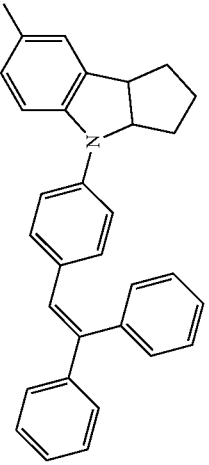 | 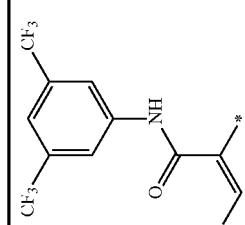 | 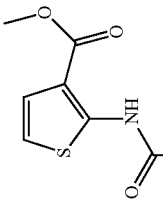 | 512.0 | 31000 |
| D-102 | 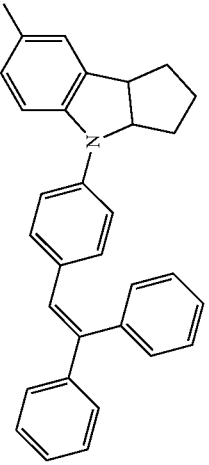 | 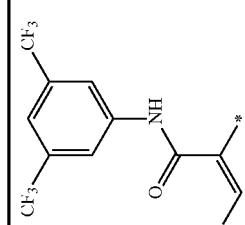 | 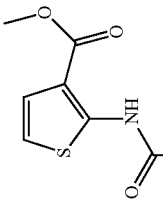 | 504.0 | 39100 |

-continued
| | Chemical Structure | | | Absorption spectrum | |
|---|---|---|---|---|---|
| No. | Donor | Spacer | Acceptor | $\lambda_{max}$ (nm) | ε |
| D-103 | 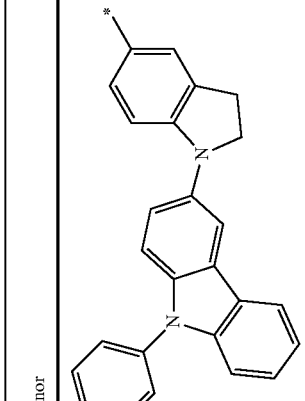 | 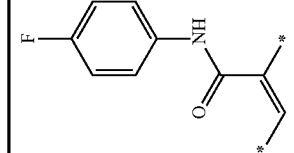 | 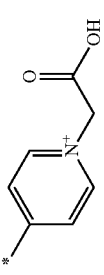 | 527.0 | 21100 |
| D-104 | 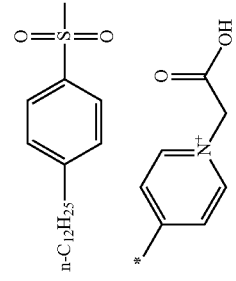 |  | 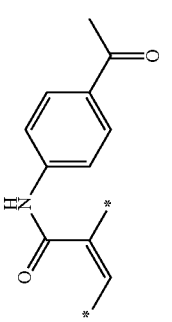 | 501.0 | 11200 |
| D-105 | | | | 509.0 | 25400 |

-continued

| No. | Chemical Structure | | | Absorption spectrum | |
|---|---|---|---|---|---|
| | Donor | Spacer | Acceptor | $\lambda_{max}$ (nm) | $\epsilon$ |
| D-106 | 5-(N-phenylcarbazol-3-yl)-2,3-dihydroindol-1-yl | N-(4-trifluoromethylphenyl) amide vinyl | 4-methylpyridinium acetic acid, Br⁻ | 511.0 | 24200 |
| D-107 | 5-(N-phenylcarbazol-3-yl)-2,3-dihydroindol-1-yl | N-(4-cyanophenyl) amide vinyl | 4-methylpyridinium acetic acid, Br⁻ | 512.0 | 20900 |
| D-108 | 4-(diethylamino)-2-(hexyloxy)phenyl | N-phenyl amide vinyl | 4-methylpyridinium acetic acid, tosylate | 499.0 | 16100 |
| D-109 | 4-(diethylamino)-2-(hexyloxy)phenyl | N-phenyl amide vinyl | 4-methylpyridinium acetic acid, Cl⁻ | 499.0 | 30500 |

-continued

| No. | Chemical Structure | | | Absorption spectrum | |
|---|---|---|---|---|---|
| | Donor | Spacer | Acceptor | $\lambda_{max}$ (nm) | ε |
| D-110 | (5-indolinyl-carbazole donor) | 4-Cl-phenyl amide spacer | N-methylpyridinium carboxymethyl, Br⁻ | 510 | 28800 |
| D-111 | (cyclopenta-fused indoline with 4-(2,2-diphenylvinyl)phenyl) | thiazol-2-yl amide spacer | N-methylpyridinium carboxymethyl, Br⁻ | 508.0 | 36610 |

In compounds D-62 to D-111, the donor D is attached to the left side of the spacer and the acceptor A is attached to the right side of the spacer.

APPLICATION EXAMPLES

Example A-1

Preparation of DSC Device

Titanium oxide paste (PST-18NR, supplied by Catalysts&Chemicals Ind. Co., Ltd.) is applied onto an FTO (tin oxide doped with fluorine) glass substrate (<12 ohms/sq, A11DU80, supplied by AGC Fabritech Co., Ltd.) by screen printing method to form a coating having an area size of 0.64 cm$^2$. After being dried for 5 minutes at 120° C., a working electrode layer having a thickness of 5 μm is obtained by applying heat treatment in air at 450° C. for 30 minutes and 500° C. for 30 minutes.

0.02 g of a dye (D-1) is dissolved in 25 ml of a mixture solution of acetonitrile+t-butyl alcohol (1:1). The above-prepared transparent working electrode is immersed in the solution at room temperature for 2 hours so as to adsorb the dye.

As a counter electrode, an ITO (indium-tin oxide) glass electrode substrate is prepared having a thickness of 8 nm electrode layer made of platinum formed thereon by sputtering.

A solution of 0.05 M of iodine, 0.1 M of lithium iodide and 0.6 M of 1-propyl-2,3-dimethylimidazolium iodide in methoxypropionitrile is used as an electrolytic solution.

A photoelectric conversion device is fabricated by making the above working electrode and counter electrode opposed to each other and holding the above electrolyte solution between them with a spacer having 50 μm thickness.

The above photoelectric conversion device is evaluated under the illumination of an artificial sunlight (AM 1.5, 100 mW/cm$^2$ intensity) generated by a solar simulator (Peccell Technologies, Inc) from the working electrode side.

Examples A-2 to A-21 and A-23 to A-39

DSC device is prepared and evaluated in the same manner as described in the example A-1 except that the compound (D-1) is replaced with a compound (D-2)-(D-34) or (D-58)-(D-61).

Comparative Example A-22

DSC device is prepared and evaluated in the same manner as described in the example A-1 except that the compound (D-1) is replaced with a compound (R-1) shown below. Table 1 shows the results.

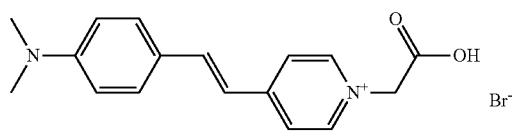

(R-1)

TABLE 1

| Example | Compound | Short-circuit current density (mA/cm$^2$) | Open-circuit voltage (V) | Fill factor (%) | Photo-electric power conversion efficiency (%) |
|---|---|---|---|---|---|
| A-1 | D-1 | 12.6 | 0.55 | 0.45 | 3.14 |
| A-2 | D-2 | 14.6 | 0.59 | 0.44 | 3.78 |
| A-3 | D-3 | 10.7 | 0.60 | 0.59 | 3.82 |
| A-4 | D-4 | 10.2 | 0.63 | 0.52 | 3.34 |
| A-5 | D-5 | 10.6 | 0.58 | 0.51 | 3.10 |
| A-6 | D-6 | 8.8 | 0.63 | 0.55 | 3.11 |
| A-7 | D-7 | 11.8 | 0.52 | 0.49 | 3.02 |
| A-8 | D-8 | 9.0 | 0.64 | 0.56 | 3.24 |
| A-9 | D-9 | 8.8 | 0.67 | 0.58 | 3.40 |
| A-10 | D-10 | 8.8 | 0.62 | 0.58 | 3.17 |
| A-11 | D-11 | 8.7 | 0.58 | 0.59 | 2.96 |
| A-12 | D-12 | 10.4 | 0.61 | 0.57 | 3.56 |
| A-13 | D-13 | 8.8 | 0.60 | 0.61 | 3.19 |
| A-14 | D-14 | 11.5 | 0.63 | 0.57 | 4.14 |
| A-15 | D-15 | 9.0 | 0.62 | 0.61 | 3.42 |
| A-16 | D-16 | 10.3 | 0.61 | 0.58 | 3.65 |
| A-17 | D-17 | 10.5 | 0.67 | 0.60 | 4.16 |
| A-18 | D-18 | 8.5 | 0.64 | 0.61 | 3.27 |
| A-19 | D-19 | 11.3 | 0.61 | 0.49 | 3.36 |
| A-20 | D-20 | 11.7 | 0.61 | 0.54 | 3.80 |
| A-21 | D-21 | 13.5 | 0.63 | 0.55 | 4.72 |
| A-22* | R-1 | 9.8 | 0.50 | 0.52 | 2.54 |
| A-23 | D-22 | 11.5 | 0.55 | 0.51 | 3.20 |
| A-24 | D-23 | 12.0 | 0.66 | 0.52 | 4.12 |
| A-25 | D-24 | 8.9 | 0.65 | 0.61 | 3.52 |
| A-26 | D-25 | 8.7 | 0.64 | 0.62 | 3.45 |
| A-27 | D-26 | 9.4 | 0.62 | 0.61 | 3.60 |
| A-28 | D-27 | 12.8 | 0.62 | 0.56 | 4.46 |
| A-29 | D-28 | 10.5 | 0.59 | 0.58 | 3.61 |
| A-30 | D-29 | 8.5 | 0.65 | 0.62 | 3.40 |
| A-31 | D-30 | 12.3 | 0.64 | 0.52 | 4.03 |
| A-32 | D-31 | 9.6 | 0.54 | 0.53 | 2.72 |
| A-33 | D-32 | 8.5 | 0.54 | 0.59 | 2.71 |
| A-34 | D-33 | 12.1 | 0.67 | 0.53 | 4.28 |
| A-35 | D-34 | 10.4 | 0.62 | 0.60 | 3.84 |
| A-36 | D-58 | 12.6 | 0.65 | 0.56 | 4.60 |
| A-37 | D-59 | 10.4 | 0.62 | 0.53 | 3.42 |
| A-38 | D-60 | 12.1 | 0.50 | 0.52 | 3.15 |
| A-39 | D-61 | 8.4 | 0.62 | 0.63 | 3.29 |

*comparison

As demonstrated in the examples, the dye of the present invention provide DSC device with excellent photovoltaic performance.

Example B-1-B-8

Example of Applying Co-Adsorbent

DSC device is prepared and evaluated in the same manner as described in the example A-1 except that the compound (D-1) is replaced with a compound (D-2, D-33 or D-27) and steroid compound (E-1) shown below is added to the dye solution.

(E-1)

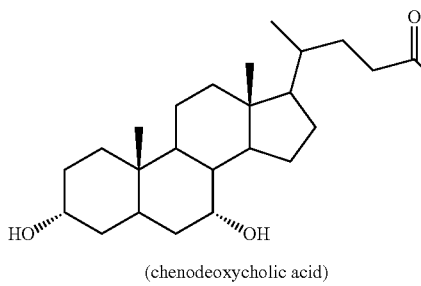

(chenodeoxycholic acid)

Table 2 shows the results.

TABLE 2

| Example | Compound | Steroid compound | Steroid compound (mM) | Short-circuit current density (mA/cm²) | Open-circuit voltage (V) | Fill factor (%) | Photo-electric power conversion efficiency (%) |
|---|---|---|---|---|---|---|---|
| B-1 | D-2 | E-1 | 0 | 14.6 | 0.59 | 0.44 | 3.78 |
| B-2 | D-2 | E-1 | 2 | 15.3 | 0.59 | 0.45 | 4.03 |
| B-3 | D-2 | E-1 | 8 | 14.8 | 0.60 | 0.49 | 4.32 |
| B-4 | D-33 | E-1 | 0 | 12.1 | 0.67 | 0.53 | 4.28 |
| B-5 | D-33 | E-1 | 8 | 12.6 | 0.68 | 0.54 | 4.61 |
| B-6 | D-27 | E-1 | 0 | 12.9 | 0.63 | 0.55 | 4.46 |
| B-7 | D-27 | E-1 | 2 | 12.9 | 0.66 | 0.57 | 4.86 |
| B-8 | D-27 | E-1 | 8 | 12.6 | 0.68 | 0.59 | 5.03 |

As demonstrated in the examples, combinations of the dye according to the present invention with the steroid compound provide DSC device with excellent photovoltaic performance.

Example B-9-B-10

Example of Changing Dye Adsorption Time

DSC device is prepared and evaluated in the same manner as described in the example B-3 and B-5 except that transparent working electrode is immersed in the solution at room temperature for 3 hours. Table 3 shows the results.

TABLE 3

| Example | Compound | Short-circuit current density (mA/cm²) | Open-circuit voltage (V) | Fill factor (%) | Photo-electric power conversion efficiency (%) |
|---|---|---|---|---|---|
| B-9 | D-2 | 13.7 | 0.66 | 0.55 | 5.01 |
| B-10 | D-33 | 12.8 | 0.68 | 0.57 | 4.95 |

Example C-1-C-3

Example of Co-Adsorbing Dyes

DSC device is prepared and evaluated in the same manner as described in the example A-1 except that the compound (D-1) is replaced with a mixture of compounds (R-2 and D-6) shown below.

Table 3 shows the results.

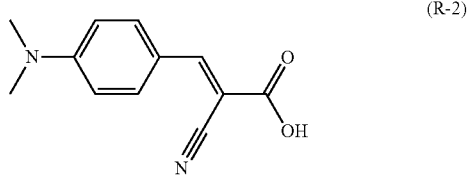 [SMILES: CN(C)c1ccc(/C=C(\C#N)C(=O)O)cc1]

(R-2)

TABLE 4

| Example | Compound R-2 (mM) | Compound D-6 (mM) | Short-circuit current density (mA/cm²) | Open-circuit voltage (V) | Fill factor (%) | Photo-electric power conversion efficiency (%) |
|---|---|---|---|---|---|---|
| C-1* | 1.8 | 0.0 | 7.1 | 0.527 | 0.54 | 2.04 |
| C-2 | 0.0 | 1.8 | 11.8 | 0.520 | 0.49 | 3.02 |
| C-3 | 0.9 | 0.9 | 12.5 | 0.534 | 0.50 | 3.35 |

*comparison

As demonstrated in the examples, combinations of a dye according to the present invention and a further dye provide DSC device with excellent photovoltaic performance.

Examples A-40 to A-89

DSC device is prepared and evaluated in the same manner as described in the example A-1 except that the compound (D-1) is replaced with a compound (D-62)-(D-111).

TABLE 6

| Example | Compound | Short-circuit current density (mA/cm$^2$) | Open-circuit voltage (V) | Fill factor (%) | Photo-electric power conversion efficiency(%) |
|---|---|---|---|---|---|
| A-40 | D-62 | 9.29 | 0.64 | 0.61 | 3.68 |
| A-41 | D-63 | 13.1 | 0.64 | 0.54 | 4.48 |
| A-42 | D-64 | 12.6 | 0.63 | 0.54 | 4.26 |
| A-43 | D-65 | 7.8 | 0.61 | 0.64 | 3.05 |
| A-44 | D-66 | 11.7 | 0.65 | 0.60 | 4.57 |
| A-45 | D-67 | 12.1 | 0.64 | 0.57 | 4.41 |
| A-46 | D-68 | 9.7 | 0.62 | 0.58 | 3.51 |
| A-47 | D-69 | 9.4 | 0.66 | 0.61 | 3.81 |
| A-48 | D-70 | 6.8 | 0.61 | 0.66 | 2.73 |
| A-49 | D-71 | 13.5 | 0.66 | 0.52 | 4.64 |
| A-50 | D-72 | 12.6 | 0.63 | 0.58 | 4.62 |
| A-51 | D-73 | 9.1 | 0.65 | 0.59 | 3.46 |
| A-52 | D-74 | 11.7 | 0.66 | 0.60 | 4.64 |
| A-53 | D-75 | 7.6 | 0.59 | 0.63 | 2.83 |
| A-54 | D-76 | 9.2 | 0.67 | 0.62 | 3.81 |
| A-55 | D-77 | 9.6 | 0.65 | 0.59 | 3.67 |
| A-56 | D-78 | 11.3 | 0.62 | 0.60 | 4.12 |
| A-57 | D-79 | 11.4 | 0.62 | 0.58 | 4.05 |
| A-58 | D-80 | 10.3 | 0.64 | 0.60 | 3.94 |
| A-59 | D-81 | 12.9 | 0.67 | 0.55 | 4.72 |
| A-60 | D-82 | 7.2 | 0.63 | 0.63 | 2.83 |
| A-61 | D-83 | 11.5 | 0.69 | 0.56 | 4.47 |
| A-62 | D-84 | 9.3 | 0.62 | 0.61 | 3.49 |
| A-63 | D-85 | 9.2 | 0.66 | 0.58 | 3.54 |
| A-64 | D-86 | 8.1 | 0.65 | 0.60 | 3.12 |
| A-65 | D-87 | 11.7 | 0.58 | 0.51 | 3.43 |
| A-66 | D-88 | 11.0 | 0.53 | 0.49 | 2.80 |
| A-67 | D-89 | 12.7 | 0.67 | 0.52 | 4.47 |
| A-68 | D-90 | 9.6 | 0.62 | 0.57 | 3.39 |
| A-69 | D-91 | 11.5 | 0.69 | 0.56 | 4.47 |
| A-70 | D-92 | 12.3 | 0.60 | 0.53 | 3.93 |
| A-71 | D-93 | 10.5 | 0.63 | 0.47 | 3.14 |
| A-72 | D-94 | 10.0 | 0.53 | 0.50 | 2.68 |
| A-73 | D-95 | 10.0 | 0.65 | 0.55 | 3.54 |
| A-74 | D-96 | 11.5 | 0.66 | 0.53 | 3.99 |
| A-75 | D-97 | 10.2 | 0.63 | 0.47 | 3.04 |
| A-76 | D-98 | 9.4 | 0.59 | 0.58 | 3.21 |
| A-77 | D-99 | 13.0 | 0.68 | 0.57 | 4.96 |
| A-78 | D-100 | 12.0 | 0.64 | 0.51 | 3.88 |
| A-79 | D-101 | 10.7 | 0.58 | 0.53 | 3.26 |
| A-80 | D-102 | 13.3 | 0.66 | 0.47 | 4.08 |
| A-81 | D-103 | 13.2 | 0.57 | 0.46 | 3.50 |
| A-82 | D-104 | 8.4 | 0.66 | 0.64 | 3.54 |
| A-83 | D-105 | 10.3 | 0.66 | 0.55 | 3.72 |
| A-84 | D-106 | 10.2 | 0.62 | 0.56 | 3.54 |
| A-85 | D-107 | 10.0 | 0.61 | 0.57 | 3.49 |
| A-86 | D-108 | 9.0 | 0.68 | 0.61 | 3.74 |
| A-87 | D-109 | 10.5 | 0.69 | 0.57 | 4.16 |
| A-88 | D-110 | 12.5 | 0.60 | 0.54 | 4.03 |
| A-89 | D-111 | 10.0 | 0.64 | 0.55 | 3.51 |

As demonstrated in the examples, the dye of the present invention provide DSC device with excellent photovoltaic performance.

What is claimed:

1. An electrode layer comprising a porous film made of oxide semiconductor fine particles sensitized with a dye of formula (I),

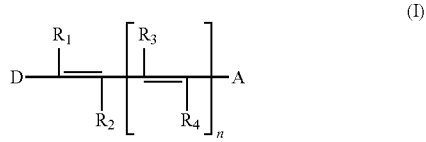

(I)

wherein

A is pyridinium*$Y^-$, quinolinium*$Y^-$ or isoquinolinium*$Y^-$, each of which is unsubstituted or substituted;

$Y^-$ is $Cl^-$, $Br^-$, $I^-$, $SCN^-$, $BF_4^-$, $PF_6^-$, $ClO_4^-$, $SbF_6^-$, $AsF_6^-$ or an organic anion selected from the group consisting of carboxylate, sulphonate, sulphate, phosphate, and phosphonate;

n is 0 or 1;

$R_1$, $R_2$, $R_3$ and $R_4$ are independently H, —S(=O)$_2$OR$_7$, —S(=O)$_2$R$_7$, —S(=O)R$_7$, —S(=O)OR$_7$, fluorinated $C_1$-$C_8$alkyl, a group of formula (II)

(II)

or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, NR$_{14}$ or combinations thereof; or $R_1$ and $R_2$, $R_1$ and $R_{15}$, $R_1$ and $R_{16}$, $R_2$ and $R_{15}$, $R_2$ and $R_{16}$ or $R_3$ and $R_4$ form together an unsubstituted or substituted aliphatic 5-, 6- or 7-membered ring; or $R_2$ and $R_{15}$ form together an unsubstituted or substituted heteroaromatic 5-, 6- or 7-membered ring; or $R_1$ is D; or if D is a group of formula (IV), $R_1$ and $R_{18}$ can form together an unsubstituted or substituted 5-, 6- or 7-membered ring;

with the proviso that at least one of $R_1$—$R_4$ is fluorinated $C_1$-$C_8$alkyl or that $R_2$ or $R_4$ or both are —S(=O)$_2$OR$_7$, —S(=O)$_2$R$_7$, —S(=O)R$_7$, —S(=O)OR$_7$ or a group of formula (II)

(II)

$R_5$ is NR$_8$, N—OR$_8$, N—NR$_8$R$_9$, O or S;

$R_6$ is CO—SR$_7$, CO$^-$NR$_7^-$NR$_{10}$R$_{11}$, CO—NR$_7$—OR$_{10}$, CO—O—CO—R$_7$, CO—NR$_7$—CO—R$_{10}$, CO—NR$_7$—CO—OR$_{10}$, CO—NR$_7$—CO—NR$_{10}$R$_{11}$, NR$_7$R$_{10}$, OR$_7$, SR$_7$, NR$_7$—NR$_{10}$R$_{11}$, NR$_7$—OR$_{10}$, O—CO—R$_7$, O—CO—OR$_7$, O—CO$^-$NR$_7$R$_{10}$, NR$_7$—CO—R$_{10}$, NR$_7$—CO—OR$_{10}$, NR$_7^-$CO$^-$NR$_{10}$R$_{11}$, CO$^-$R$_7$, CO$^-$OR$_7$, CO—NR$_7$R$_{10}$, NR$_{12}$—C(=NR$_{13}$)R$_7$ or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, NR$_{14}$ or combinations thereof;

$R_8$ and $R_9$ are independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, NR$_{14}$ or combinations thereof;

$R_7$, $R_{10}$ and $R_{11}$ are independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_3$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

or if $R_7$ or $R_{10}$ is part of $R_2$, it can form together with $R_{15}$ or $R_{16}$ an unsubstituted or substituted aliphatic 6- or 7-membered ring; or if $R_7$ or $R_{10}$ is part of $R_2$ with n being 0 or is part of $R_4$ with n being 1, it can form together with a substituent of A ortho to the

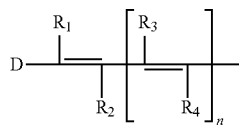

group an unsubstituted or substituted aliphatic 5-, 6- or 7-membered ring;

$R_{12}$ and $R_{13}$ form together an unsubstituted or substituted 5-, 6- or 7-membered ring;

$R_{14}$ is independently H or unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is independently a group of formula (III) or (IV)

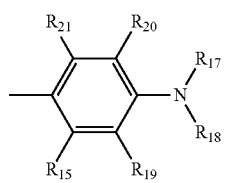 (III)

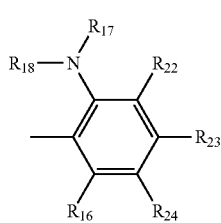 (IV)

$R_{17}$ and $R_{18}$ are independently unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_{17}$ and $R_{18}$, $R_{17}$ and $R_{22}$, $R_{17}$ and $R_{20}$ and/or $R_{18}$ and $R_{19}$ form together an unsubstituted or substituted 5-, 6- or 7-membered ring;

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}$-$NR_{26}R_{27}$, $NR_{25}$-$OR_{26}$, O—CO—$R_{25}$, O—CO—$OR_{25}$, O—CO—$NR_{25}R_{26}$, $NR_{25}$—CO—$R_{26}$, $NR_{25}$-CO—$OR_{26}$, $NR_{25}$—CO—$NR_{26}R_{27}$, CO—$R_{25}$, CO—$OR_{25}$, CO—$NR_{25}R_{26}$, S—CO—$R_{25}$, CO—$SR_{25}$, CO$^-NR_{25}$-$NR_{26}R_{27}$, CO—$NR_{25}$—$OR_{26}$, CO—O—CO—$R_{25}$, CO—O—CO—$OR_{25}$, CO—O—CO—$NR_{25}R_{26}$, CO$^-NR_{25}$—CO—$R_{26}$, CO—$NR_{25}$—CO—$OR_{26}$, or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_{25}$, $R_{26}$ and $R_{27}$ are independently H or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

with the proviso that A or at least one of $R_1$—$R_4$ comprises a group G, wherein G is —$R_{28}$—COOH, —$R_{28}$—COO$^-$Z$^+$, —$R_{28}$—S(=O)$_2$OH, —$R_{28}$—S(=O)$_2$—O$^-$Z$^+$, —$R_{28}$—O—S(=O)$_2$OH, —$R_{28}$—O—S(=O)$_2$—O$^-$Z$^+$, —$R_{28}$—P(=O)(OH)$_2$, —$R_{28}$—P(=O)(O$^-$Z$^+$)$_2$, —$R_{28}$—P(=O)(OH)(O$^-$Z$^+$), —$R_{28}$—O—P(=O)(OH)$_2$, —$R_{28}$—O—P(=O)(O$^-$Z$^+$)$_2$, —$R_{28}$—O—P(=O)(OH)(O$^-$Z$^+$);

$R_{28}$ is a direct bond or unsubstituted or substituted $C_1$-$C_{20}$alkylene, $C_2$-$C_{20}$alkenylene, $C_2$-$C_{20}$alkynylene, $C_6$-$C_{20}$arylene, $C_4$-$C_9$heteroarylene, $C_7$-$C_{11}$aralkylene, $C_8$-$C_{11}$aralkenylene, $C_8$-$C_{11}$aralkynylene, $C_6$-$C_{11}$heteroaralkylene, $C_7$-$C_{11}$heteroaralkenylene, $C_7$-$C_{11}$heteroaralkynylene or $C_5$-$C_6$cycloalkylene; and Z$^+$ is N($R_{14}$)$_4^+$, Li$^+$, Na$^+$ or K+ or is an ammonium cation which is part of a compound of formula (I) as part of group A.

2. An electrode layer according to claim 1, wherein A is a group of formula (V)-(IX),

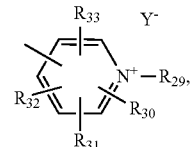 (V)

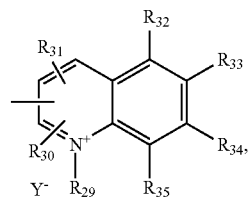 (VI)

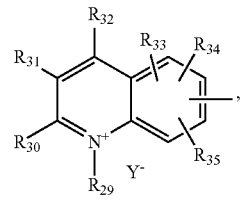 (VII)

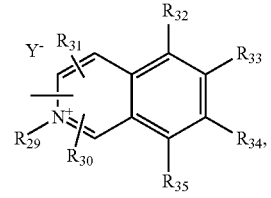 (VIII)

-continued

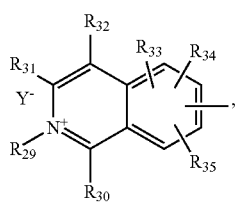
(IX)

Y⁻ is Cl⁻, Br⁻, I⁻, SCN⁻, BF⁻, PF6, ClO₄⁻, SbF6⁻, AsF₆⁻ or an organic anion selected from the group consisting of $C_1$-$C_{20}$alkyl-COO⁻, $C_6$-$C_{20}$aryl-COO⁻, $C_1$-$C_{20}$alkyl-S(=O)$_2$—O⁻, $C_6$-$C_{20}$aryl-S(=O)$_2$—O⁻, $C_1$-$C_{20}$alkyl-O—S(=O)$_2$—O⁻, $C_6$-$C_{20}$aryl-O—S(=O)$_2$—O⁻, ClC$_{20}$alkyl-P(=O)$_2$—O⁻, $C_6$-$C_{20}$aryl-P(=O)$_2$—O⁻, $C_1$-$C_{20}$alkyl-O—P(=O)$_2$—O⁻ and $C_6$-$C_{20}$aryl-O—P(=O)$_2$—O⁻, whereby the aryl is unsubstituted or substituted by 1 to 4 $C_1$-$C_{20}$alkyl, or Y⁻ is an anionic group which is part of a compound of formula (I) and is selected from the group consisting of COO⁻, S(=O)$_2$—O⁻, O—S(=O)$_2$—O⁻, P(=O)(O⁻)(O⁻Z⁺), P(=O)(OH)(O⁻), O—P(=O)(O⁻)(O⁻Z⁺), O—P(=O)(OH)(O⁻);

$R_{29}$ is G, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl, whereby the alkyl, alkenyl, alkynyl, aryl, heteroaryl, aralkyl, aralkenyl, aralkynyl, cycloalkyl, cycloalkenyl and cycloalkynyl are unsubstituted or substituted by fluorine, pyridinium*Y⁻, quinolinium*Y⁻or isoquinolinium*Y⁻, whereby the pyridinium, quinolinium and isoquinolinium are unsubstituted or substituted by G, $C_1$-$C_{20}$alkyl or combinations thereof;

$R_{30}$, $R_{31}$, $R_{32}$, $R_{33}$, $R_{34}$ and $R_{35}$ are independently G, H, halogen, pyridinium*Y⁻, quinolinium*Y⁻, isoquinolinium*Y⁻, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl, whereby the whereby the pyridinium, quinolinium, isoquinolinium, alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—$R_{14}$, O—$R_{14}$, CO—O$R_{14}$, O—CO—$R_{14}$, $NR_{14}R_{14}'$, CONR$_{14}R_{14}'$, $NR_{14}$—CO—$R_{14}'$, S(=O)$_2$O$R_{14}'$, S(=O)$_2$—O⁻Z⁺ or combinations thereof, and the aryl and heteroaryl can be further substituted by 1-4 $C_1$-$C_{20}$alkyl, and whereby the pyridinium, quinolinium and isoquinolinium can be further substituted by G, $C_1$-$C_{20}$alkyl or combinations thereof;

or two vicinal groups of $R_{29}$-$R_{35}$ form together trimethylene, tetramethylene or pentamethylene, each of which is unsubstituted or substituted by G, benzo, $R_{14}$ or combinations thereof n is 0 or 1;

$R_1$, $R_2$, $R_3$ and $R_4$ are independently H, —S(=O)$_2$O$R_7$, —S(=O)$_2R_7$, —S(=O)$R_7$, —S(=O)O$R_7$, fluorinated $C_1$-$C_8$alkyl, a group of formula (II), $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—OR$_{14}$, O—CO—$R_{14}$, $NR_{14}R_{14}'$, CONR$_{14}R_{14}'$, $NR_{14}$—CO—$R_{14}'$, S(=O)$_2$OR$_{14}$, S(=O)$_2$—O⁻Z⁺or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

or $R_1$ is D;

or $R_1$ and $R_{15}$ or $R_1$ and $R_{16}$ form together ethylene, trimethylene, tetramethylene, methylene-O, O-methylene, ethylene-O, O-ethylene, trimethylene-O, O-trimethylene, methylene-$NR_{14}$, $NR_{14}$-methylene, ethylene-$NR_{14}$, $NR_{14}$-ethylene, trimethylene-$NR_{14}$ or $NR_{14}$-trimethylene thus forming an aliphatic 5-, 6- or 7-membered ring;

or $R_2$ and $R_{15}$ form together —O—, —S— or —$NR_{14}$—;

or if D is a group of formula (IV), $R_1$ and $R_{18}$ can form together with the N-atom $R_{17}$ and $R_{18}$ are attached to

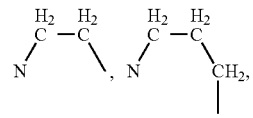

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_1$-$C_{20}$alkylidene, and/or in each of said groups two vicinal H-atoms can be replaced by benzo, trimethylene or tetramethylene;

with the proviso that at least one of $R_1$—$R_4$ is fluorinated $C_1$-$C_8$alkyl or that $R_2$ or $R_4$ or both are —S(=O)$_2$O$R_7$, —S(=O)$_2R_7$, —S(=O)$R_7$, —S(=O)O$R_7$ or a group of formula (II);

$R_5$ is $NR_8$, N—O$R_8$, N—$NR_8R_9$, O or S;

$R_6$ is $NR_7R_{10}$, $OR_7$, $SR_7$, $NR_7$—$NR_{10}R_{11}$, $NR_7$—$OR_{10}$, O—CO—$R_7$, O—CO—O$R_7$, O⁻CO⁻$NR_7R_{10}$, $NR_7$—CO—$R_{10}$, $NR_7$—CO—O$R_{10}$, $NR_7$⁻CO⁻$NR_{10}R_{11}$, CO⁻$R_7$, CO—O$R_7$, CO—$NR_7R_{10}$, Cl⁻$C_{20}$alkyl, HC$_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—OR$_{14}$, O—CO—$R_{14}$, $NR_{14}R_{14}'$, CONR$_{14}R_{14}'$, $NR_{14}$—CO—$R_{14}'$, S(=O)$_2$OR$_{14}$, S(=O)$_2$O⁻Z⁺or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_8$ and $R_9$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_7$, $R_{10}$ and $R_{11}$ are independently H, $C_1$-$C_{20}$alkyl, $C_2$-$C_{20}$alkenyl, $C_2$-$C_{20}$alkynyl, $C_6$-$C_{20}$aryl, $C_3$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by G, halogen, S—$R_{14}$, O—$R_{14}$, CO—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, fluorinated $C_1$-$C_{20}$alkyl, fluorinated O—$C_1$-$C_{20}$alkyl, —CN, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

or $R_7$ or $R_{10}$ being part of $R_2$ forms together with $R_1$ a direct bond, methylene or ethylene thus forming an aliphatic 5-, 6- or 7-membered ring;

or $R_7$ or $R_{10}$ being part of $R_4$ forms together with $R_3$ a direct bond, methylene or ethylene thus forming an aliphatic 5-, 6- or 7-membered ring;

or if $R_7$ or $R_{10}$ is part of $R_2$, it can form together with $R_{15}$ or $R_{16}$ a direct bond or methylene thus forming an aliphatic 6- or 7-membered ring;

or if $R_7$ or $R_{10}$ is part of $R_2$ with n being 0 or is part of $R_4$ with n being 1, it can form together with a substituent of A ortho to the

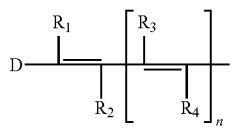

group a direct bond, methylene or ethylene thus forming an aliphatic 5-, 6- or 7-membered ring;

$R_{14}$, $R_{14}'$ are independently H, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_5$-$C_{20}$cycloalkyl, $C_5$-$C_{20}$cycloalkenyl or $C_6$-$C_{20}$cycloalkynyl;

D is independently a group of formula (III) or (IV)

$R_{17}$ and $R_{18}$ are independently fluorenyl, $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the fluorenyl, alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2$—$O^-Z^+$ or combinations thereof, and the fluorenyl, aryl and heteroaryl can be further substituted by maleic anhydridyl, maleimidyl, indenyl, $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof, whereby the maleic anhydridyl and maleimidyl are unsubstituted or substituted by $C_1$-$C_{20}$alkyl, $C_6$-$C_{20}$aryl, phenyl-$NR_{14}R_{14}'$ or combinations thereof;

or $R_{17}$ and $R_{18}$ form together with the N they are attached to piperidinyl, piperazinyl, morpholinyl, imidazolidinyl or pyrrollidinyl, each of which is unsubstituted or substituted by $C_1$-$C_{20}$alkyl, $C_1$-$C_{20}$alkylidene, benzo, trimethylene, tetramethylene or combinations thereof, which are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2$—$O^-Z^+$ or combinations thereof;

or $R_{17}$ and $R_{22}$, $R_{17}$ and $R_{20}$ and/or $R_{18}$ and $R_{19}$ form together with the N-atom $R_{17}$ and $R_{18}$ are attached to

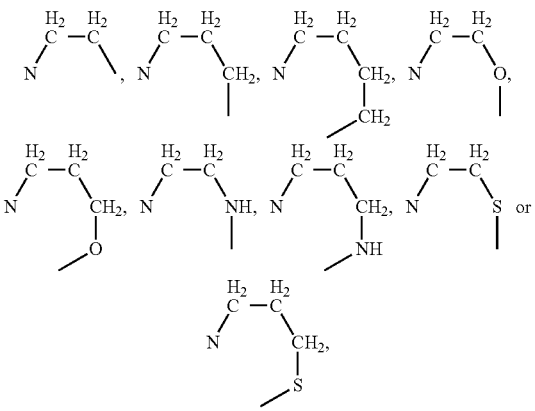

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, CO—$SR_{25}$, $CO^-NR_{25}^-NR_{26}R_{27}$, $CO^-NR_{25}$—$OR_{26}$, CO—$O^-CO$—$R_{25}$, CO—O—CO—$OR_{25}$, CO—O—CO—$NR_{25}R_{26}$, CO—$NR_{25}$—CO—$R_{26}$, CO—$NR_{25}$—CO—$OR_{26}$, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2$—$O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_{25}$, $R_{26}$ and $R_{27}$ are independently H, $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by pyridinium*$Y^-$, maleic anhydridyl, maleimidyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2$—$O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof, whereby the pyridinium, maleic anhydridyl, maleimidyl are unsusbstituted or substituted by $C_1$-$C_{20}$alkyl, $C_2$-$C_{20}$alkenyl, $C_2$-$C_{20}$alkynyl, $C_6$-$C_{20}$aryl, $C_6$-$C_{20}$aryl-O—$R_{14}$, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof;

with the proviso that at least one of $R_{29}$—$R_{35}$ or at least one of $R_1$–$R_4$ comprises a group G;

wherein G is —$R_{28}$-COOH, —$R_{28}$—$COO^-Z^+$, —$R_{28}$—S$(=O)_2OH$, —$R_{28}$—$S(=O)_2$—$O^-Z^+$, —$R_{28}$—O—S$(=O)_2OH$, —$R_{28}$—O—$S(=O)_2$—$O^-Z^+$, —$R_{28}$—P$(=O)(OH)_2$, —$R_{28}$—$P(=O)(O^-Z^+)_2$, —$R_{28}$—$P(=O)(OH)(O^-Z^+)$, —$R_{28}$—O—$P(=O)(OH)_2$, —$R_{28}$—O—$P(=O)(O^-Z^+)_2$, —$R_{28}$—O—$P(=O)(OH)(O^-Z^+)$, $R_{28}$ is a direct bond or $C_1$-$C_{20}$alkylene, $C_2$-$C_{20}$alkenylene, $C_2$-$C_{20}$alkynylene, $C_6$-$C_{20}$arylene, $C_4$-$C_9$heteroarylene, $C_7$-$C_{11}$aralkylene, $C_8$-$C_{11}$aralkenylene, $C_8$-$C_{11}$aralkynylene, $C_6$-$C_{11}$heteroaralkylene, $C_7$-$C_{11}$heteroaralkenylene, $C_7$-$C_{11}$heteroaralkynylene or $C_5$-$C_6$cycloalkylene, whereby each of said groups is unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2$—$O^-Z^+$ or combinations thereof, and the arylene and heteroarylene can be further substituted by 1-4 $C_1$-$C_{20}$alkyl;

$Z^+$ is $N(R_{14})_4^+$, $Li^+$, $Na^+$ or $L^+$ or is the cationic group

which is part of a compound of formula (I) as part of group A.

3. An electrode layer according to claim 2, wherein A is a group of formula (V')-(VII');

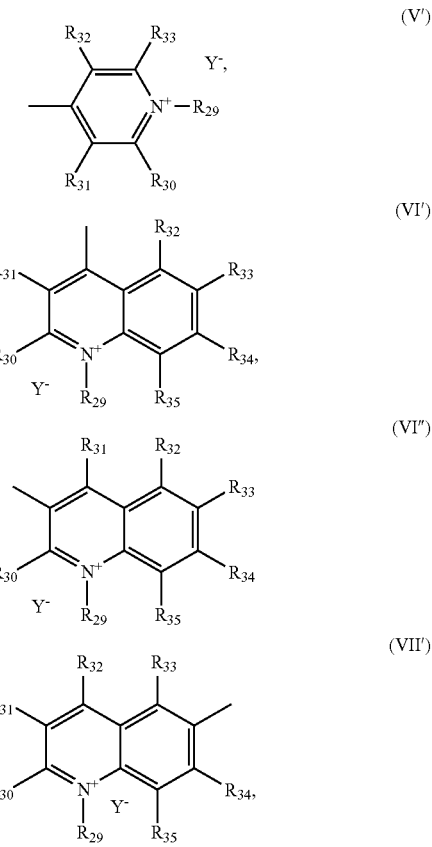

$Y^-$ is $Cl^-$, $Br^-$, $I^-$, $SCN^-$, $BF_4^-$, $PF6$, $ClO_4$, $SbF_6^-$, $AsF_6^-$ or an organic anion selected from the group consisting of, $C_1$-$C_{20}$alkyl-$S(=O)_2$—$O^-$, $C_6$-$C_{20}$aryl-$S(=O)_2$—$O^-$, $C_1$-$C_{20}$alkyl-O—$S(=O)_2$—$O^-$, $C_6$-$C_{20}$aryl-O—$S(=O)_2$—$O^-$, $C_1$-$C_{20}$alkyl-$P(=O)_2$—$O^-$, $C_6$-$C_{20}$aryl-$P(=O)_2$—$O^-$, $C_1$-$C_{20}$alkyl-O—$P(=O)_2$—$O^-$ and $C_6$-$C_{20}$aryl-O—$P(=O)_2$—$O^-$, whereby the aryl is unsubstituted or substituted by 1 to 4 $C_1$-$C_{20}$alkyl, or $Y^-$ is an anionic group which is part of a compound of formula (I) and is selected from the group consisting of $COO^-$, $S(=O)_2$—$O^-$, O—$S(=O)_2$—$O^-$, $P(=O)(O)(O^-Z^+)$, $P(=O)(OH)(O)$, O—$P(=O)(O)(O^-Z^+)$ and O—$P(=O)(OH)(O)$;

$R_{29}$ is G or $C_1$-$C_8$alkyl, whereby the alkyl is unsubstituted or substituted by pyridinium*$Y^-$ or quinolinium*$Y^-$, whereby the pyridinium and quinolinium are substituted by G;

$R_{30}$, $R_{31}$, $R_{32}$, $R_{33}$, $R_{34}$ and $R_{35}$ are independently H, pyridinium*$Y^-$ or quinolinium*$Y^-$, whereby the pyridinium and quinolinium are substituted by G;

n is 0 or 1;

$R_1$, $R_2$, $R_3$ and $R_4$ are independently H, —$S(=O)_2OR_7$, —$S(=O)_2R_7$, —$S(=O)R_7$, —$S(=O)OR_7$, fluorinated $C_1$-$C_4$alkyl, a group of formula (II), $C_1$-$C_8$alkyl or $C_6$aryl;

or $R_1$ is D;

or $R_1$ and $R_{15}$ form together ethylene, trimethylene, methylene-O, O-methylene, ethylene-O, O-ethylene, methylene-$NR_{14}$, $NR_{14}$-methylene, ethylene-$NR_{14}$ or $NR_{14}$-ethylene, thus forming an aliphatic 5- or 6-membered ring;

or $R_2$ and $R_{15}$ form together —O—, —S— or —$NR_{14}$—;
or if D is a group of formula (IV), $R_1$ and $R_{18}$ can form together with the N-atom $R_{17}$ and $R_{18}$ are attached to

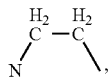

in each of said groups two vicinal H-atoms can be replaced by benzo;
with the proviso that at least one of $R_1$—$R_4$ is fluorinated $C_1$-$C_4$alkyl or that $R_2$ or $R_4$ or both are —S(=O)$_2$OR$_7$, —S(=O)$_2$R$_7$, —S(=O)R$_7$, —S(=O)OR$_7$ or a group of formula (II);
$R_5$ is O;
$R_6$ is $NR_7R_{10}$, $OR_7$, $SR_7$, $NR_7$—$NR_{10}R_{11}$, $NR_7$-$OR_{10}$;
$R_7$, $R_{10}$ and $R_{11}$ are independently H, $C_1$-$C_8$alkyl, $C_6$-$C_{20}$aryl, $C_3$-$C_{16}$heteroaryl or $C_7$-$C_{10}$aralkyl, and whereby the alkyl, aryl, heteroaryl and aralkyl are unsubstituted or substituted by halogen, S—$R_{14}$, O—$R_{14}$, CO—$R_{14}$, CO—$OR_{14}$, O—CO—$R_{14}$, $NR_{14}R_{14}'$, $CONR_{14}R_{14}'$ or $NR_{14}$—CO—$R_{14}'$, and the aryl and heteroaryl can be further substituted by $C_1$-$C_{10}$alkyl or fluorinated $C_1$-$C_8$alkyl, fluorinated O—$C_1$-$C_8$alkyl, —CN or combinations thereof;
or $R_7$ being part of $R_2$ forms together with $R_{15}$ a direct bond or methylene thus forming an aliphatic 5- or 6-membered ring;
or if $R_7$ is part of $R_2$, it can form together with $R_{15}$ a direct bond thus forming an aliphatic 6-membered ring;
or if $R_7$ or $R_{10}$ is part of $R_2$ with n being 0, it can form together with a substituent of A ortho to the

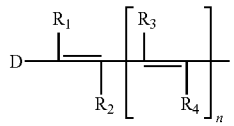

group a direct bond or methylene thus forming an aliphatic 5- or 6-membered ring;
$R_{14}$, $R_{14}'$ are independently H, $C_1$-$C_{14}$alkyl, $C_6$aryl or $C_7$-$C_{10}$aralkyl;
D is independently a group of formula (III) or (IV);
$R_{17}$ and $R_{18}$ are independently $C_1$-$C_8$alkyl, $C_2$-$C_8$alkenyl, $C_6$-$C_{20}$aryl, $C_4$-$C_{24}$heteroaryl, $C_7$-$C_{20}$aralkyl, $C_8$-$C_{20}$aralkenyl, $C_8$-$C_{10}$aralkynyl or $C_5$-$C_{12}$cycloalkyl, whereby the alkyl, alkenyl, aryl, heteroaryl, aralkyl, aralkenyl, aralkynyl and cycloalkyl, are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the aryl and heteroaryl can be further substituted by $C_1$-$C_8$alkyl, $C_2$-$C_8$alkenyl or $C_8$-$C_{20}$aralkenyl;
or $R_{17}$ and $R_{20}$ form together with the N-atom $R_{17}$ is attached to

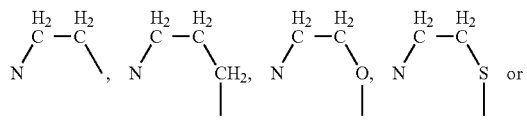

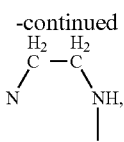

whereby in each of said groups one or more H-atom can be replaced by $C_1$-$C_{20}$alkyl, $C_6$-$C_{20}$aryl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);
$R_{15}$ is H, $NR_{25}R_{26}$, $OR_{25}$, $SR_{25}$, O—CO—$R_{25}$ or $NR_{25}$—CO—$R_{26}$;
$R_{19}$, $R_{20}$ and $R_{21}$ are H;
$R_{25}$ and $R_{26}$ are independently H, $C_1$-$C_{14}$alkyl, $C_6$aryl or $C_7$-$C_{10}$aralkyl, whereby the alkyl, aryl and aralkyl are unsubstituted or substituted by pyridinium*Y$^-$, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the pyridinium and aryl can be further substituted by $C_1$-$C_8$alkyl;
with the proviso that at least one of $R_{29}$—$R_{35}$ comprises a group G;
wherein G is —$R_{28}$—COOH, —$R_{28}$—COO$^-$Z$^+$, —$R_{28}$—S(=O)$_2$OH, —$R_{28}$—S(=O)$_2$—O$^-$Z$^+$, —$R_{28}$—O—S(=O)$_2$OH, —$R_{28}$—O—S(=O)$_2$—O$^-$Z$^+$, —$R_{28}$—P(=O)(OH)$_2$, —$R_{28}$—P(=O)(O$^-$Z$^+$)$_2$, —$R_{28}$—P(=O)(OH)(O$^-$Z$^+$), —$R_{28}$—O—P(=O)(OH)$_2$, —$R_{28}$—O—P(=O)(O$^-$Z$^+$)$_2$ or —$R_{28}$—O—P(=O)(OH)(O$^-$Z$^+$),
$R_{28}$ is $C_1$-$C_8$alkylene, which is unsubstituted or substituted by CO—OH;
$Z^+$ is $N(R_{14})_4^+$, Li$^+$, Na$^+$ or K$^+$ or is the cationic group

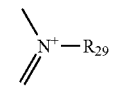

which is part of a compound of formula (I) as part of group A.
4. An electrode layer according to claim 3, wherein
A is a group of formula (V');
$Y^-$ is Cl$^-$, Br$^-$, I$^-$ or $C_6$aryl-S(=O)$_2$—O$^-$, whereby the aryl is substituted by 1 $C_1$-$C_{14}$alkyl, $R_{29}$ is G;
$R_{30}$, $R_{31}$, $R_{32}$ and $R_{33}$ are H;
n is 0 or 1;
$R_1$ is H;
if n is 1, when $R_1$ can additionally be D;
if n is 0, when $R_2$ a group of formula (II);
if n is 1, $R_2$ is H or $R_2$ and $R_{15}$ form together —O—;
$R_3$ is H;
$R_4$ is a group of formula (II),
with the proviso that either $R_2$ or $R_4$ is a group of formula (II);
$R_5$ is O;
$R_6$ is $NR_7R_{10}$, $NHR_7$, $OR_7$ or N($C_1$-$C_8$alkyl)-O($C_1$-$C_8$alkyl);
$R_7$ and $R_{10}$ are independently $C_1$-$C_{14}$alkyl, fluorinated $C_1$-$C_4$alkyl, benzyl, $C_3$-$C_{14}$heteroaryl or $C_6$-$C_{20}$aryl, whereby the alkyl can be substituted by N—($C_1$-$C_8$ alkyl)$_2$, the heteroaryl can be substituted by CO—O—$C_1$-$C_8$alkyl or $C_1$-$C_8$alkyl, the benzyl and aryl can be substituted by fluorine, $C_1$-$C_8$alkyl, fluorinated $C_1$-$C_4$alkyl, O—$C_1$-$C_8$alkyl or N—($C_1$-$C_8$alkyl)$_2$ or the aryl can be substituted by chlorine, CO—$C_1$-$C_8$alkyl, —CN, fluorinated $C_1$-$C_4$alkyl or fluorinated O—$C_1$-$C_4$alkyl;

D is a group of formula (III);
$R_{17}$ is $C_1$-$C_8$alkyl;
RD, $R_{20}$ and $R_{21}$ are H;
or $R_{17}$ and $R_{20}$ form together with the N-atom $R_{17}$ is attached to

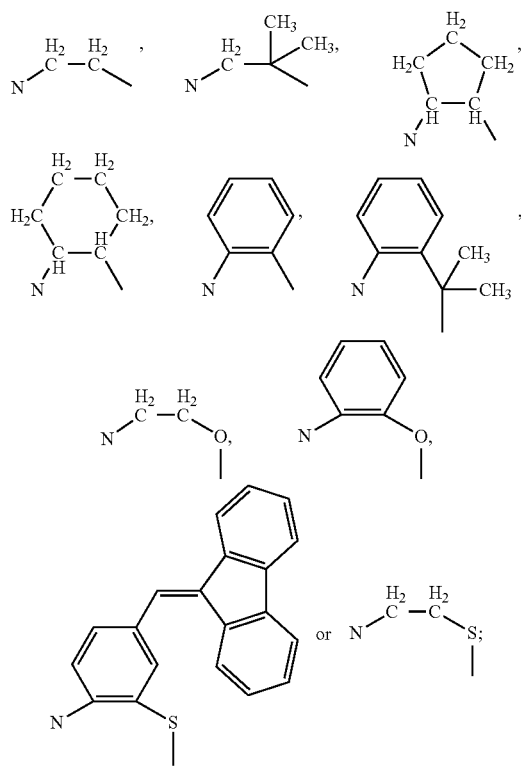

$R_{18}$ is $C_1$-$C_8$alkyl, $C_8$-$C_{20}$aralkenyl, $C_6$-$C_{24}$ heteroaryl or $C_6$-$C_{20}$aryl, whereby the alkyl can be substituted by O—$C_1$-$C_{14}$alkyl, the aryl can be substituted by fluorine, $C_1$-$C_8$alkyl, S—$C_1$-$C_8$alkyl, O—$C_1$-$C_{14}$alkyl, CO—O—$C_1$-$C_8$alkyl, O-phenyl, N-(phenyl)$_2$ or $C_8$-$C_{20}$aralkenyl, and the heteroaryl can be substituted by $C_1$-$C_8$alkyl, O—$C_1$-$C_8$alkyl or $C_8$-$C_{20}$aralkenyl;
$R_{15}$ is H, OR$_{25}$ or O—CO—$R_{25}$;
$R_{25}$ is $C_1$-$C_{14}$alkyl or $C_7$—C$_{loar}$alkyl, whereby the alkyl can be substituted by pyridinium*Y$^-$, and the pyridinium is substituted by $C_1$-$C_8$alkyl;
with the proviso that $R_{29}$ comprises a group G;
G is —$R_{28}$—COOH;
$R_{28}$ is $C_1$-$C_3$alkylene which is unsubstituted or substituted by CO—OH.

5. An electrode layer according to claim 1, wherein the oxide semiconductor fine particles are made of $TiO_2$, $SnO_2$, $WO_3$, ZnO, $Nb_2O_5$, $Fe_2O_3$, $ZrO_2$, MgO, $WO_3$, ZnO, CdS, ZnS, PbS, $Bi_2S_3$, CdSe, CdTe or combinations thereof.

6. An electrode layer according to claim 1, wherein the porous film made of oxide semiconductor fine particles is sensitized with a dye of formula (I) and one or more further dyes.

7. An electrode layer according to claim 6, wherein the further dye is a metal complex dye and/or an organic dye selected from the group consisting of indoline, courmarin, cyanine, merocyanine, hemicyanine, methin, azo, quinone, quinonimine, diketo-pyrrolo-pyrrole, quinacridone, squaraine, triphenylmethane, perylene, indigo, xanthene, eosin, rhodamine and combinations thereof.

8. An electrode layer according to claim 1, wherein the dye is adsorbed together with an additive.

9. An electrode layer according to claim 8, wherein the additive is a co-adsorbent, a crown ether, a cyclodextrine, a calixarene, a polyethyleneoxide or combinations thereof.

10. A photoelectric conversion device comprising an electrode layer as defined in claim 1.

11. A dye sensitized solar cell comprising a photoelectric conversion device as defined in claim 10.

12. A method of sensitizing a solar cell by incorporation of the dye of formula (I) according to claim 1.

13. A compound of formula (I) as defined in claim 1, with the proviso that $R_6$ is not OR$_7$, if $R_7$ is part of $R_2$ and forms together with $R_{15}$ an aliphatic 6-membered ring.

14. A compound of formula (I) according to claim 13, with the proviso that $R_6$ is NR$_7$R$_{10}$, if $R_7$ is part of $R_2$ and forms together with $R_{15}$ an aliphatic 6-membered ring.

15. An electrode layer according to claim 2, wherein the compound of formula (I) is dimeric and one of $R_6$, $R_7$, $R_{10}$, $R_{29}$-$R_{35}$ is $R_{36}$,
or $R_1$ is

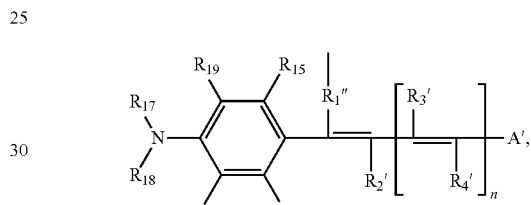

or $R_2$ is

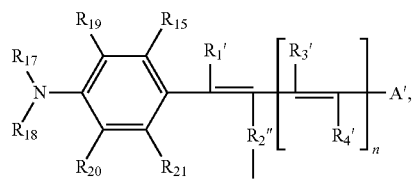

or $R_3$ is

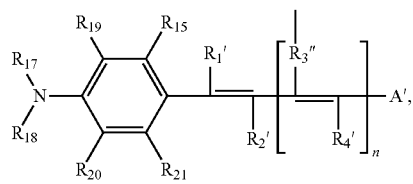

or $R_4$ is

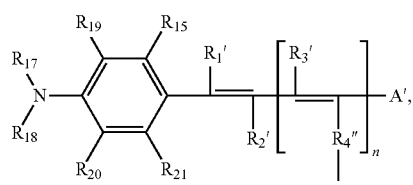

or $R_{18}$ is

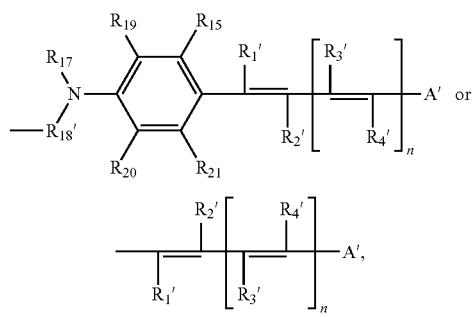

or $R_{20}$ is

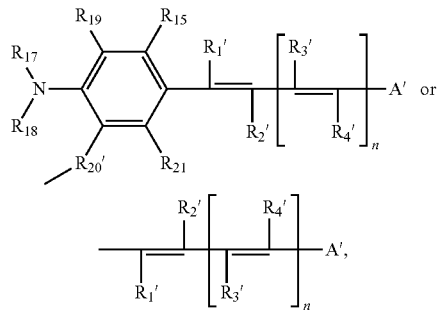

or $R_{21}$ is

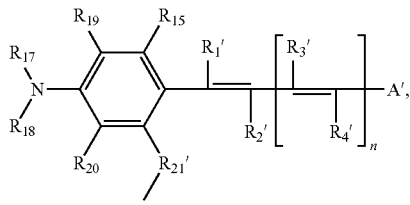

or one of $R_{30}$—$R_{35}$ is

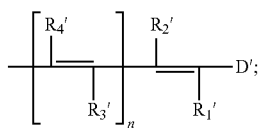

A' is as defined for A; D' is as defined for D; $R_1$' is as defined for $R_1$; $R_2$' is as defined for $R_2$; $R_3$' is as defined for $R_3$; $R_4$' is as defined for $R_4$;

$R_1$", $R_2$", $R_3$", $R_4$" are $R_{36}$;

$R_{18}$' is $R_{37}$;

$R_{20}$' and $R_{21}$' are $R_{37}$, O—$R_{37}$—O, S—$R_{37}$—S, $NR_{14}$—$R_{37}$—$NR_{14}$', CO—$R_{37}$—CO, CO—O—$R_{37}$—O—CO, CO—$NR_{14}$—$R_{37}$—$NR_{14}$'—CO, CO—S—$R_{37}$—S—CO, O—CO—$R_{37}$—CO—O, $NR_{14}$—CO—$R_{37}$—CO—$NR_{14}$' or S—CO—$R_{37}$—CO—S;

$R_{36}$ is as defined for $R_{37}$, whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene can be further substituted by G;

$R_{37}$ is $C_1$-$C_{20}$alkylene, $C_2$-$C_{20}$alkenylene, $C_2$-$C_{20}$alkynylene, $C_6$-$C_{20}$arylene, $C_4$-$C_{20}$heteroarylene, $C_7$-$C_{20}$aralkylene, $C_8$-$C_{20}$aralkenylene, $C_8$-$C_{20}$aralkynylene, $C_4$-$C_{20}$cycloalkylene, $C_1$-$C_8$alkylene-$C_6$-$C_{20}$arylene-$C_1$-$C_8$alkylene (e.g.

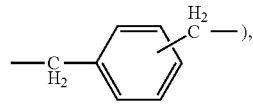

$C_5$-$C_{20}$cycloalkenylene or $C_6$-$C_{20}$cycloalkynylene, whereby the alkylene and cycloalkylene is uninterrupted or interrupted by O, S, $NR_{14}$ or combinations thereof, and whereby the alkylene, alkenylene, alkynylene, arylene, heteroarylene, aralkylene, aralkenylene, aralkynylene, cycloalkylene, alkylene-arylene-alkylene, cycloalkenylene and cycloalkynylene are unsubstituted or substituted by fluorine, and whereby the arylene, heteroarylene and aryl can be further substituted by $C_1$-$C_{20}$alkyl, fluorinated $C_1$-$C_{20}$alkyl or combinations thereof, and the remainder of the substituents are as defined in claim 2.

16. An electrode layer according to claim 3, wherein the compound of formula (I) is dimeric and one of $R_6$, $R_7$, $R_{10}$, $R_{29}$ is $R_{36}$, or $R_{18}$ is

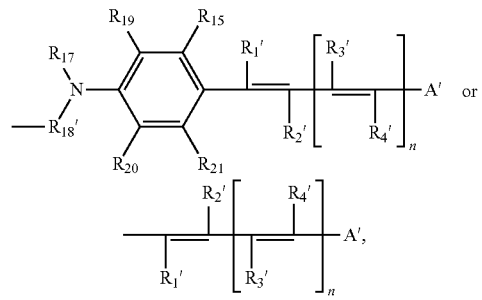

or $R_{20}$ is

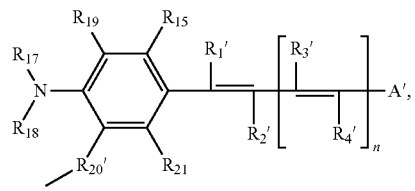

or $R_{21}$ is

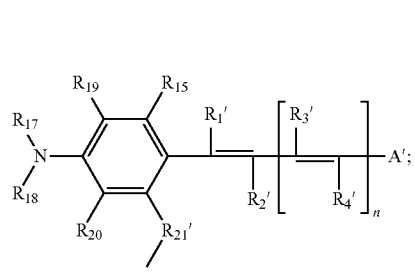

A' is as defined for A; D' is as defined for D; $R_1$' is as defined for $R_1$; $R_2$' is as defined for $R_2$; $R_3$' is as defined for $R_3$; $R_4$' is as defined for $R_4$;

$R_{18}$' is $R_{37}$;

$R_{20}$' and $R_{21}$' are $R_{37}$, O—$R_{37}$—O, S—$R_{37}$—S, $NR_{14}$—$R_{37}$—$NR_{14}$', O—CO—$R_{37}$—CO—O, $NR_{14}$—CO—$R_{37}$—CO—$NR_{14}$' or S—CO—$R_{37}$—CO—S;

$R_{36}$ is as defined for $R_{37}$, whereby the alkylene, arylene and alkylene-arylene-alkylene can be further substituted by G;

$R_{37}$ is $C_1$-$C_{20}$alkylene, $C_6$-$C_{10}$arylene or $C_1$alkylene-$C_6$arylene-$C_1$-alkylene, whereby the alkylene is uninterrupted or interrupted by O, S, $NR_{14}$ or combinations thereof (e.g. the alkylene is uninterrupted), and whereby the alkylene, arylene and alkylene-arylene-alkylene are unsubstituted or substituted by fluorine, and whereby the arylene can be further substituted by $C_1$-$C_8$alkyl, fluorinated $C_1$-$C_8$alkyl or combinations thereof; and the remainder of the substituents are as defined in claim 3.

17. An electrode layer according to claim 4, wherein the compound of formula (I) is dimeric, n is 0, and either $R_7$ is $C_6$arylene or $R_{21}$ is

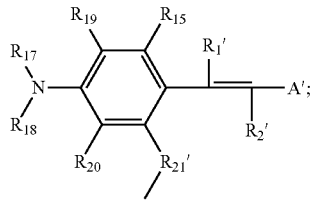

A' is

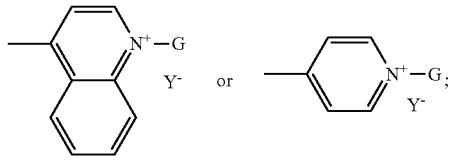

$R_1'$ is H;
$R_2'$ is H or a group of formula (II);
$R_{21}'$ is O—$C_1$-$C_8$alkylene-O;
and the remainder of the substituents are as defined in claim 4.

* * * * *